(12) United States Patent
Toda

(10) Patent No.: US 7,468,914 B2
(45) Date of Patent: Dec. 23, 2008

(54) SEMICONDUCTOR MEMORY DEVICE AND DATA WRITE METHOD THEREOF

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 102 days.

(21) Appl. No.: 11/561,194

(22) Filed: Nov. 17, 2006

(65) Prior Publication Data

US 2007/0121376 A1     May 31, 2007

(30) Foreign Application Priority Data

Nov. 21, 2005    (JP)   ............................. 2005-335407

(51) Int. Cl.
    *G11C 11/34*      (2006.01)
(52) U.S. Cl. ............................... 365/185.2; 365/185.03
(58) Field of Classification Search ............... 365/185.2, 365/185.02
See application file for complete search history.

(56) References Cited

U.S. PATENT DOCUMENTS

| | | | |
|---|---|---|---|
| 6,807,096 B2 | 10/2004 | Toda | |
| 6,847,555 B2 * | 1/2005 | Toda | ..................... 365/185.21 |
| 7,006,380 B2 | 2/2006 | Toda | |
| 7,283,397 B2 * | 10/2007 | Harari et al. | ........... 365/185.22 |
| 2002/0021581 A1 * | 2/2002 | Lin | ......................... 365/185.2 |
| 2006/0209593 A1 | 9/2006 | Toda | |
| 2006/0239073 A1 | 10/2006 | Toda | |
| 2007/0121376 A1 | 5/2007 | Toda | |

OTHER PUBLICATIONS

U.S. Appl. No. 11/476,023, filed Jun. 28, 2006, Haruki Toda.
U.S. Appl. No. 11/832,987, filed Aug. 2, 2007, Toda.

* cited by examiner

*Primary Examiner*—Hoai V. Ho
*Assistant Examiner*—Anthan T Tran
(74) *Attorney, Agent, or Firm*—Oblon, Spivak, McClelland, Maier & Neustadt, P.C.

(57) ABSTRACT

A semiconductor memory device including a memory cell array and a sense amplifier, wherein the memory cell array includes: a plurality of information cells, in each of which either one of multi-level data is written; a first reference cell with the same structure and the same connection state as the information cell, in which a reference data level is written for generating a first reference current; and a second reference cell, which serves for generating a second reference current used for setting the lowest data level of the multi-level data and for setting the reference data level of the first reference cell.

14 Claims, 45 Drawing Sheets

Erase-verify step "Vp00"

Write-verify step "Vpr"

| Data level | (HB, LB) | T2 | T1 | T3 |
|---|---|---|---|---|
| L3 | (0, 0) | 0 | 0 | 0 |
| L2 | (0, 1) | 0 | 0 | 1 |
| L1 | (1, 1) | 1 | 0 | 1 |
| L0 | (1, 0) | 1 | 1 | 1 |

FIG. 32

|  | CLK /CLK Generation step |
|---|---|
| HB Sense | T2 |
| LB Sense | T1/T3 |

FIG. 34

|  |  | vp1 | vp2<br>=vpa(T)<br>=vpb(C) | vp3<br>=vpb(T)<br>=vpa(C) |
|---|---|---|---|---|
| HB | (T) | 0  1 | 0  1 | 0  1 |
|  | (C) | 1  0 | 1  0 | 1  0 |
| LB |  | 01  01 | 01  01 | 01  01 |

FIG. 44
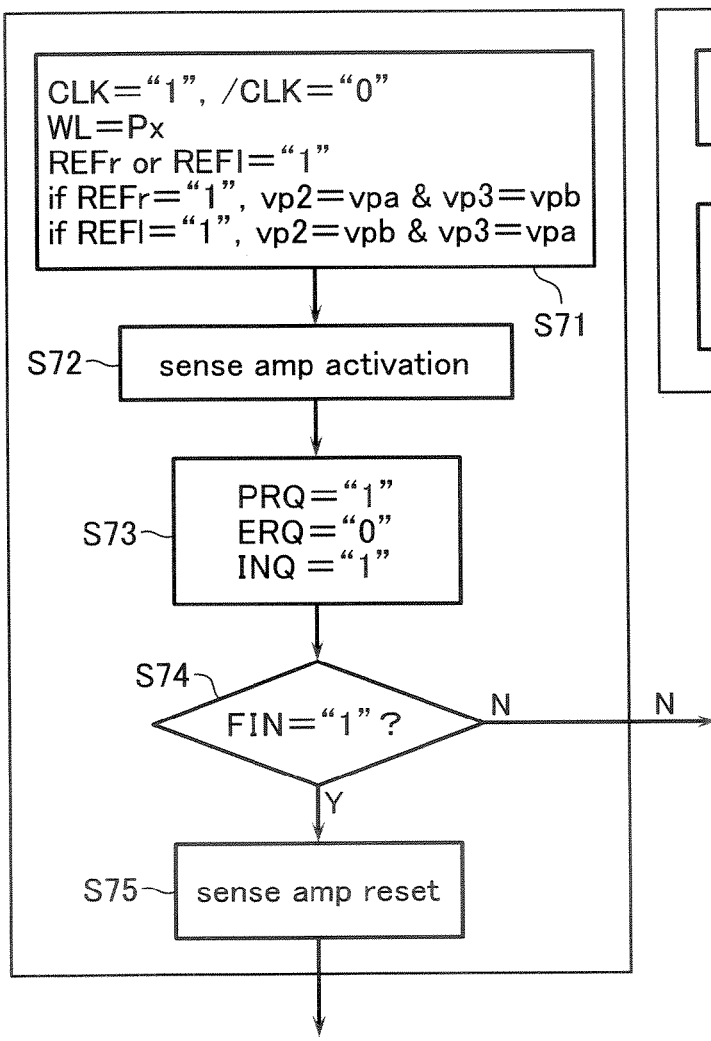
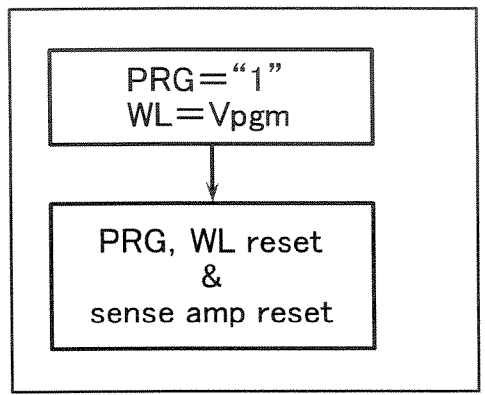

SEMICONDUCTOR MEMORY DEVICE AND DATA WRITE METHOD THEREOF

CROSS-REFERENCE TO RELATED APPLICATION

This application is based on and claims the benefit of priority from the prior Japanese Patent Application No. 2005-335407, filed on Nov. 21, 2005, the entire contents of which are incorporated herein by reference.

BACKGROUND OF THE INVENTION

1. Field of the Invention

This invention relates to a semiconductor memory device (EEPROM), in which electrically rewritable and non-volatile memory cells are arranged therein, and data write method thereof.

2. Description of the Related Art

EEPROM flash memories are classified in general into NAND-type and NOR-type ones. A NAND-type flash memory is formed of NAND strings (i.e., NAND cell units) each having plural memory cells connected in series in such a way that adjacent cells share source/drain diffusion layers. Therefore, the cell density is made higher than that of a NOR-type one. Besides the NAND-type flash memory has a feature with low power consumption because plural memory cells may be written in a lump by use of FN tunnel current. Considering these features, the NAND-type flash memory is mainly applied to a file memory with a large capacity.

By contrast, since a NOR-type flash memory has, in spite of the large power consumption, a possibility of high speed access, it is mainly applied to mobile apparatuses.

Recently, however, a mobile apparatus tends to deal with an image data and the like with a large quantity of data. Therefore it is required of the mobile apparatus to contain a flash memory which has a high-speed performance and a large capacity with the same level as a file memory. Accordingly, to adapt a NAND-type flash memory to a high-speed system with a buffer memory such as DRAMs, there has been provided a method of improving the data transmission rate, in which, for example, cell data is read out to a page buffer and then serially transferred and output.

Even the above-described method is used, there is a limit for improving the speed of the NAND-type flash memory because cell current thereof is one several tenth of that of a NOR-type flash memory, so that it is difficult to sense data at a high rate as in the NOR-type flash memory with a reference level. The sense amplifier used in a NAND-type flash memory sensing cell data with detecting whether the bit line voltage is discharged or not in accordance with cell data, it takes a time by the micro second for data-sensing.

To increase the cell current of the NAND-type flash memory, it is useful to increase the cell size (i.e., channel width), but this will dilute such a feature of the NAND-type flash memory that the cell area is small.

For the purpose of making possible to store a large quantity of data, there has been provided a flash memory with a multi-value data storage scheme. Further, there has been provided a method of reducing the read time by reducing the read number in the multi-value data storage scheme (for example, refer to Unexamined Japanese Patent Application Publication No. 2001-93288).

Further, there has been provided a memory device with a multi-level data storage scheme, in which two memory cells connected to a pair of bit lines constitute a pair cell, and multi-level data is stored as been defined by a combination of different threshold voltages in the pair cell (for example, refer to Unexamined Japanese Patent Application Publication No. 2004-319007).

SUMMARY OF THE INVENTION

According to an aspect of the present invention, there is provided a semiconductor memory device including a memory cell array with electrically rewritable and non-volatile memory cells arranged therein, and a sense amplifier configured to sense data in the memory cell array, wherein the memory cell array includes:
  a plurality of information cells, in each of which either one of multi-level data is written;
  at least one first reference cell with the same structure and the same connection state as the information cell, in which a reference data level is written for generating a first reference current used for reading data of the information cells; and
  at least one second reference cell, which serves for generating a second reference current used for setting the lowest data level of the multi-level data and for setting the reference data level of the first reference cell.

According to another aspect of the invention, there is provided a data write method of a semiconductor memory device, which has a memory cell array with a plurality of information cells and at least one first reference cell arranged therein, either one of four data levels L0, L1, L2 and L3 (L0<L1<L2<L3) being written into the information cells, a reference data level Lr (L0<Lr<L1) being written into the first reference cell, which serves for reading data of the information cells, including:
  performing a first erase procedure for erasing the information cells and the first reference cell in the memory cell array;
  preliminarily writing the reference data level Lr into the information cells and the first reference cell, which have been erased;
  performing a second erase procedure for erasing again the information cells within the information cells and the first reference cell, in which the data level Lr has been written, to set them in the lowest level L0 in the four data levels; and
  performing verify-write for the information cells, in which the lowest data level L0 has been written, to selectively write data levels L1, L2 and L3 in a certain order by use of the reference current of the first reference cell.

BRIEF DESCRIPTION OF THE DRAWINGS

FIG. 32 shows the clock (CLK, /CLK) generation state at the data read time.

FIG. 34 shows data decision state at each write step.

FIG. 44 shows the detailed flow of the write-verify step and write step in FIG. 43.

DETAILED DESCRIPTION OF THE EMBODIMENTS

Illustrative embodiments of this invention will be explained with reference to the accompanying drawings below.

In a semiconductor memory device in accordance with this embodiment, the main portion of the memory cell array is set as an area of "information cells", into each of which one of plural physical quantity levels (i.e., data levels) is written while the remaining portion is set as an area of "reference cell(s)", into which a fixed physical quantity level (i.e., reference data level) is written for serving for detecting the data levels. In other words, there is prepared a common reference cell in correspondence with plural information cells, and the reference cell constitutes a pair with each of the plural information cells.

While in the embodiment described below, a four-level data storage scheme is used, the present invention is not limited to it. In case of a four-value data storage scheme, an information cell is set to have a data level selected in L0, L1, L2 and L3 (where L0<L1<L2<L3) while reference level Lr of a reference cell is set preferably as follows: L0<Lr<L1.

In the embodiment described below, cell's threshold voltage levels are used as the physical quantity levels (data levels).

[Memory Chip Configuration]

Figure 1:
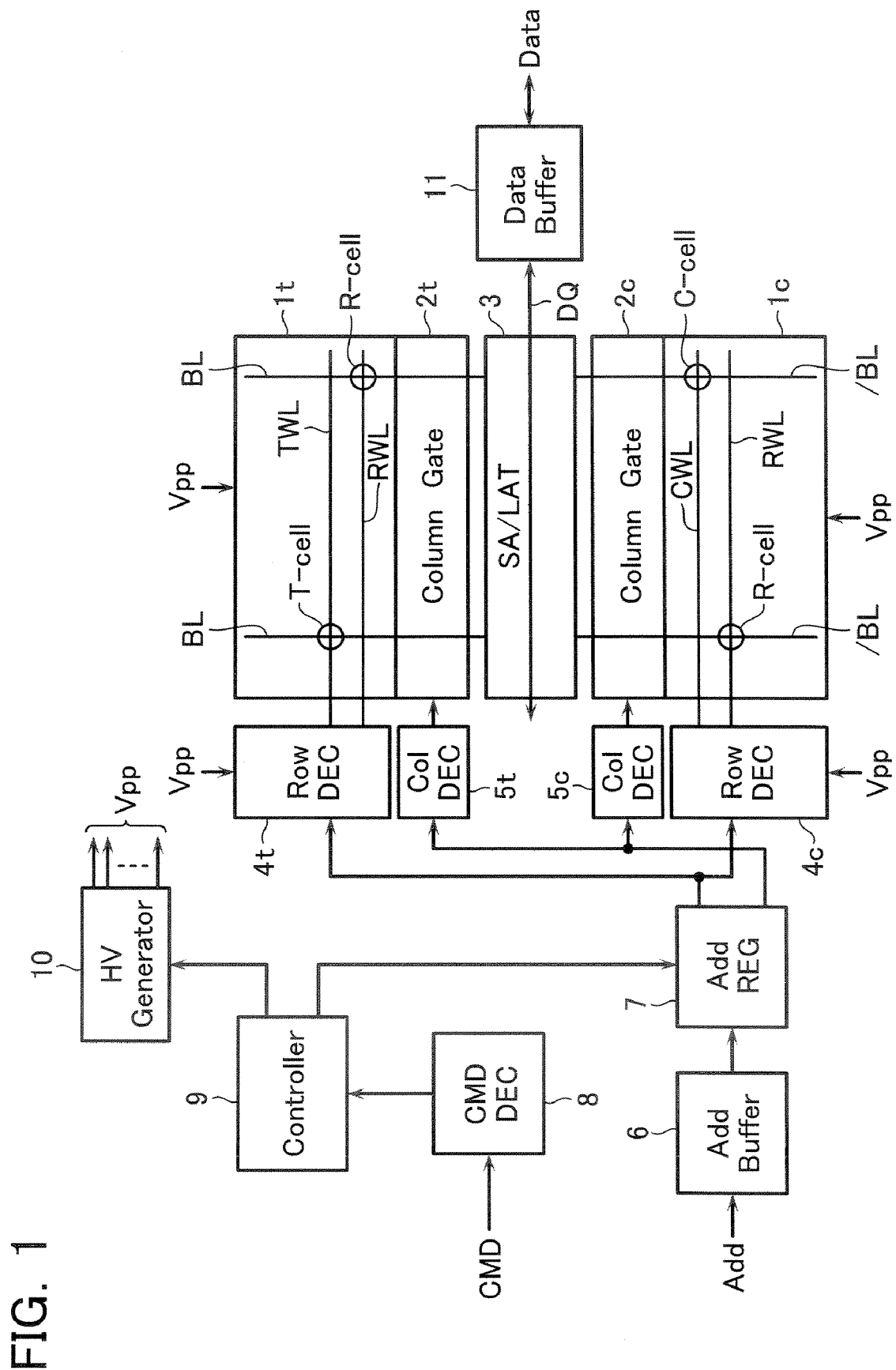
FIG. 1 shows a configuration of a flash memory in accordance with an embodiment of the present invention.

FIG. 1 shows a NAND-type flash memory configuration in accordance with an embodiment. A memory cell array 1 is divided into two cell arrays 1t and 1c, which share a sense amplifier circuit 3. In this cell array configuration, it is used such an open bit line scheme that bit lines BL and /BL are simultaneously selected in the cell arrays 1t and 1c, and constitute a pair.

Main memory cells arranged in each cell array 1t, 1c are used as "information cells" for storing data; and the remaining cell(s) as "reference cell(s)" for storing reference levels for data-reading. Data in the cell arrays 1t and 1c are reversed in logic. In the below-description, an information cell in the cell array it is referred to as "T-cell" while one in the cell array 1c is referred to as "C-cell". There is prepared at least one reference cell, "R-cell", in each cell array 1t, 1c.

At a data read time, when an information cell T-cell is selected in one cell array it with a word line TWL and the bit line BL in a pair of bit lines BL and /BL, a reference cell R-cell is selected in the other cell array 1c with a reference word line RWL, which is selected simultaneously with the word line TWL, and the bit line /BL, and these T-cell and R-cell constitute a pair.

Similarly, when an information cell C-cell is selected in one cell array 1c with a word line CWL and the bit line /BL in a pair of bit lines BL and /BL, a reference cell R-cell is selected in the other cell array 1t with a reference word line RWL, which is selected simultaneously with the word line CWL, and the bit line BL, and these C-cell and R-cell constitute a pair.

There is no difference in structure between the information cells T-cell, C-cell and the reference cell R-cell. One reference cell R-cell is fixedly selected in the cell array 1c in correspondence with plural information cells T-cell in the cell array 1t; and one reference cell R-cell is fixedly selected in the cell array 1t in correspondence with plural information cells C-cell in the cell array 1c.

The reason why the open bit line scheme is used in this embodiment is that it is in need of applying different voltages to a word line (TWL or CWL) and a reference word line RWL, which are simultaneously selected (as explained later).

A pair of bit lines BL and /BL in the cell arrays 1*t* and 1*c* are selected with column gates 2*t* and 2*c* to be coupled to the sense amplifier circuit 3. Data transferring between the sense amplifier circuit 3 and external input/output terminals is performed via a data bus DQ disposed on the area of the sense amplifier circuit 3 and a data buffer 11.

The column gates 2*t* and 2*c* are controlled with column decoders 5*t* and 5*c*, respectively. There are prepared word line select/drive circuits (row decoders) 4*t* and 4*c* for selectively driving word lines in the cell arrays 1*t* and 1*c*, respectively.

Address, Add, is supplied to the row decoders 4*t*, 4*c* and column decoders 2*t*, 2*c* via address buffer 6 and address register 7.

Command, CMD, supplied from the outside of the chip for defining an operation mode, is decoded in a command decoder 8 and supplied to a controller 9, which controls write and erase sequences and a data read operation.

It is required of the cell arrays 1*t*, 1*c* and row decoders 4*t*, 4*c* and so on to be applied with various high voltages Vpp serving as write voltage Vpgm, verify voltage Vr, pass voltages Vpass, Vread and the like used in accordance with operation modes. To generate such the high voltages Vpp, there is prepared a high voltage generation circuit 10, which is also controlled with the controller 9.

Figure 2:
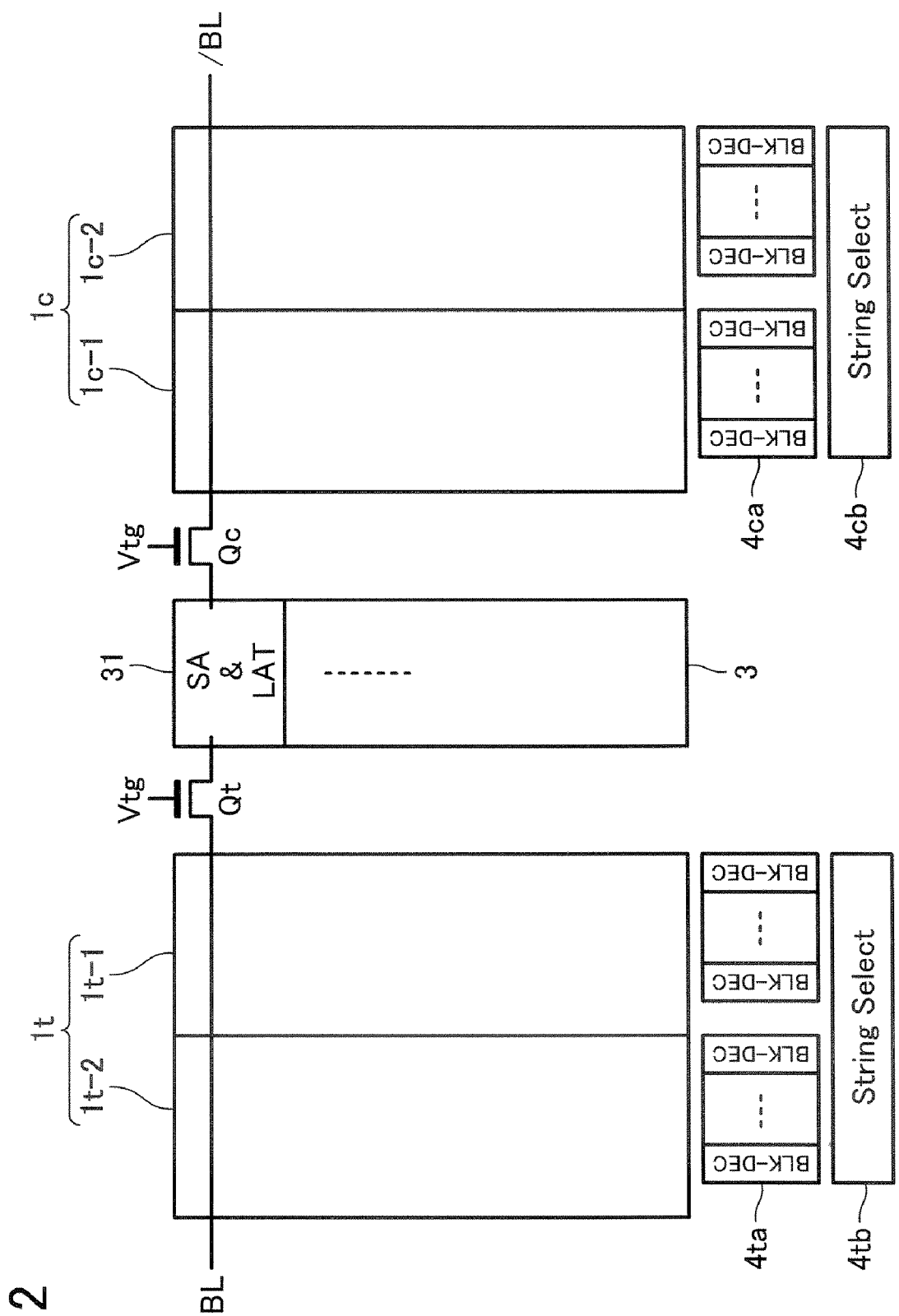
FIG. 2 shows the memory cell array in the flash memory.

FIGS. 2 to 7 show the internal configuration of the cell arrays 1*t*, 1*c*. FIG. 2 shows that each of the two cell arrays 1*t* and 1*c* disposed to sandwich the sense amplifier circuit 3 are divided into two areas (1*t*-1, 1*t*-2) and (1*c*-1, 1*c*-2) in the bit line direction.

While a plurality of bit line pairs BL, /BL are disposed in the cell arrays 1*t* and 1*c*, only one pair is shown in the drawing. The sense unit 31 in the sense amplifier circuit 3 is, as described in detail later, includes sense amplifier SA and latch LAT. Multiple bit line pairs are selectively coupled to a sense unit 31. This will be explained later.

Figure 3:
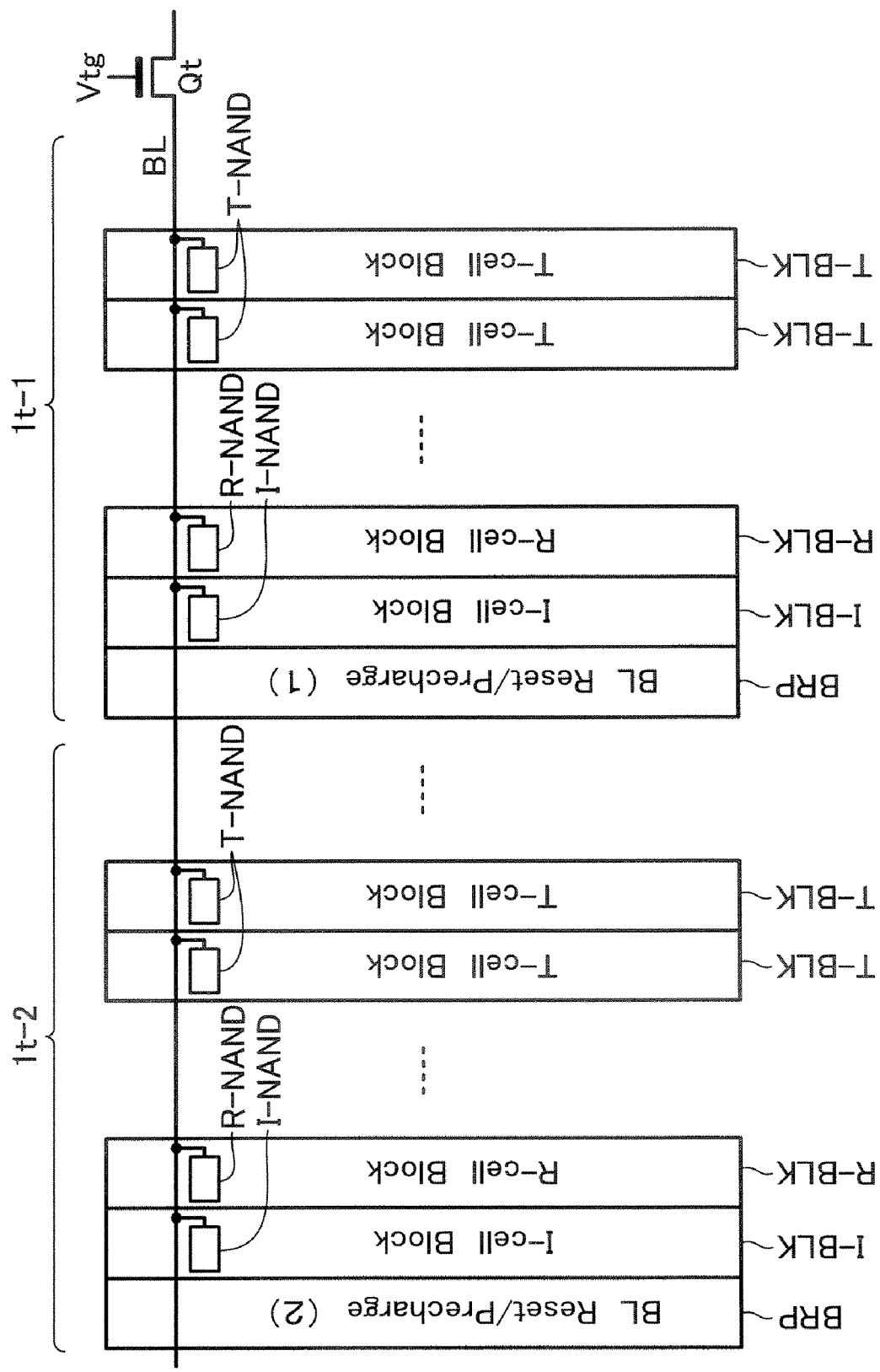
FIG. 3 shows one cell array, T-cell array, in the memory cell array.
Figure 4:
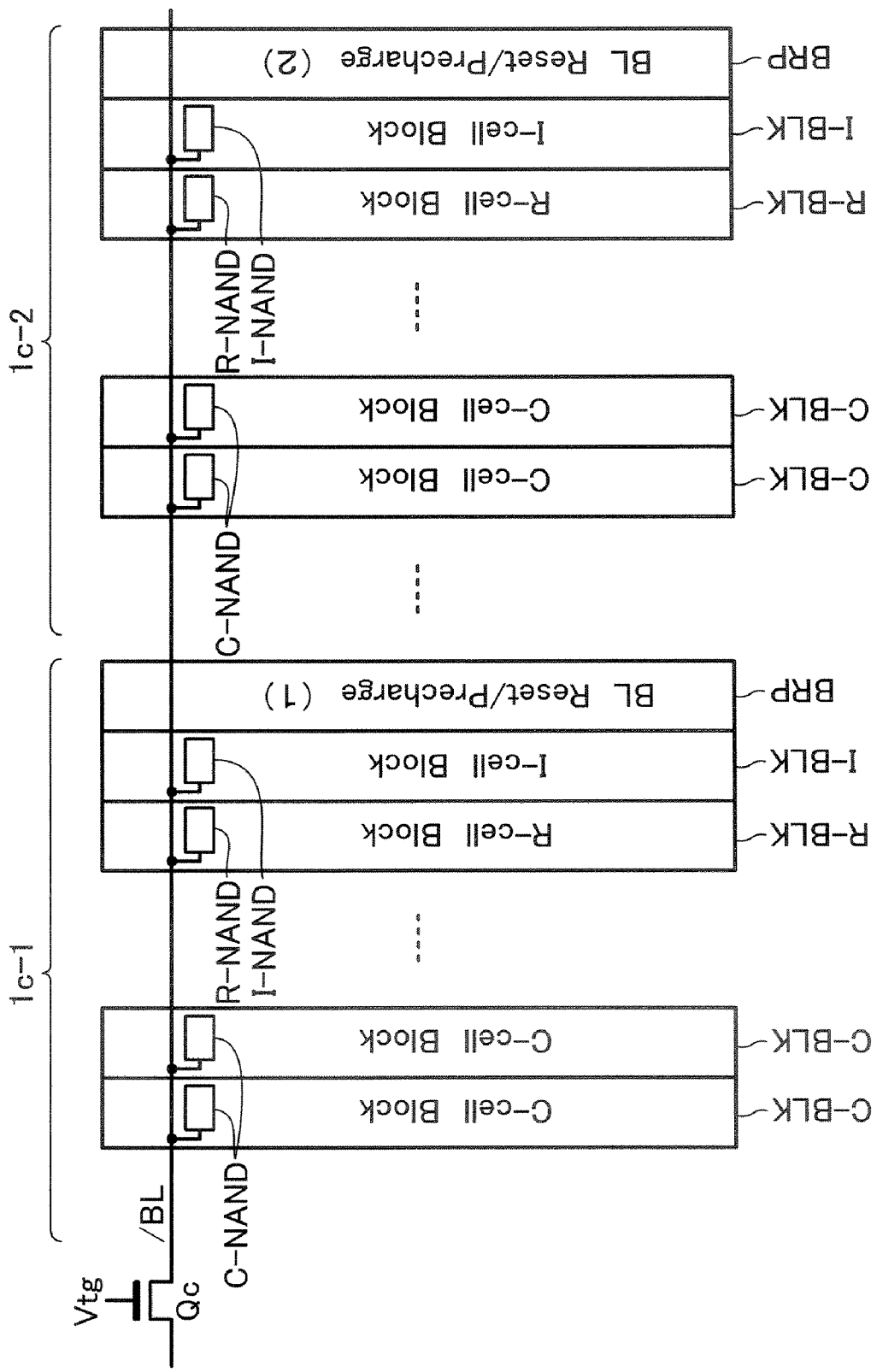
FIG. 4 shows the other cell array, C-cell array, in the memory cell array.

As shown in FIGS. 3 and 4, in each of areas 1*t*-1, 1*t*-2, 1*c*-1 and 1*c*-2, many information cell blocks T-BLK, C-BLK and a reference cell block R-BLK are disposed. In the information cell blocks T-BLK and C-BLK, NAND strings including information cells T-cell and c-cell (refer to as information cell NAND strings T-NAND and C-NAND, hereinafter) are arranged while in the reference cell block R-BLK, NAND strings including reference cells R-cell (refer to as reference cell NAND strings R-NAND, hereinafter) are arranged. In detail in this example, each reference cell block R-BLK is disposed at the end far from the sense amplifier SA in each of the areas 1*t*-1, 1*t*-2, 1*c*-1 and 1*c*-2.

Row decoders 4*t* and 4*c*, which are used for selectively driving word lines in the cell arrays 1*t* and 1*c*, include NAND string decoders (i.e., block decoders) 4*ta* and 4*ca* disposed in the respective blocks for block-selecting, and string select circuits (i.e., word line drivers) 4*tb* and 4*cb* disposed to be shared by blocks in the cell arrays 1*t* and 1*c* and drive word lines and select gate lines in a block.

At a normal data read time and write-verify time of verifying data levels L0-L3, while one of the plural information cell blocks T-BLK is selected in the cell array 1*t*-1 (or 1*t*-2), reference cell block R-BLK is simultaneously selected in the cell array 1*c*-1 (or 1*c*-2). Similarly, while one of the plural information cell blocks C-BLK is selected in the cell array 1*c*-1 (or 1*c*-2), reference cell block R-BLK is simultaneously selected in the cell array 1*t*-1 (or 1*t*-2).

In each of cell arrays 1*t*-1, 1*t*-2, 1*c*-1 and 1*c*-2, another reference cell block I-BLK, in which NAND strings (second reference cell NAND strings) I-NAND formed of second reference cells I-cell are arranged, is disposed in addition to the reference cell block R-BLK. This second reference cell block I-BLK is disposed at the end far from the sense amplifier SA in each of areas 1*t*-1, 1*t*-2, 1*c*-1 and 1*c*-2. This reference cell block I-BLK is used for generating a reference current when the first reference cell R-cell is written into the reference level Lr or the lowest level L0 of the multi-levels is written into the information cell.

When the reference data is written into the first reference cell R-BLK in the cell array 1*t*-1 (or 1*c*-1), the second reference cell block I-BLK in the cell array 1*c*-1 (or 1*t*-1) is used. When the reference data is written into the first reference cell R-BLK in the cell array 1*t*-2 (or 1*c*-2), the second reference cell block I-BLK in the cell array 1*c*-2 (or 1*t*-2) is used.

Further disposed in the cell arrays 1*t*-1, 1*t*-2, 1*c*-1 and 1*c*-2 are bit line reset/precharge circuits BRP with the same configuration as memory cells. These are prepared for resetting the bit line history or setting non-selected bit lines at the power supply voltage Vdd or at more higher voltage of Vdd+$\alpha$ at a write time and disposed at the end farthest from the sense amplifier SA in each area 1*t*-1, 1*t*-2, 1*c*-1, 1*c*-2. The detail will be explained later. All bit line reset/precharge circuits BRP operate at a time on the both sides of the sense amplifier SA.

Figure 5:
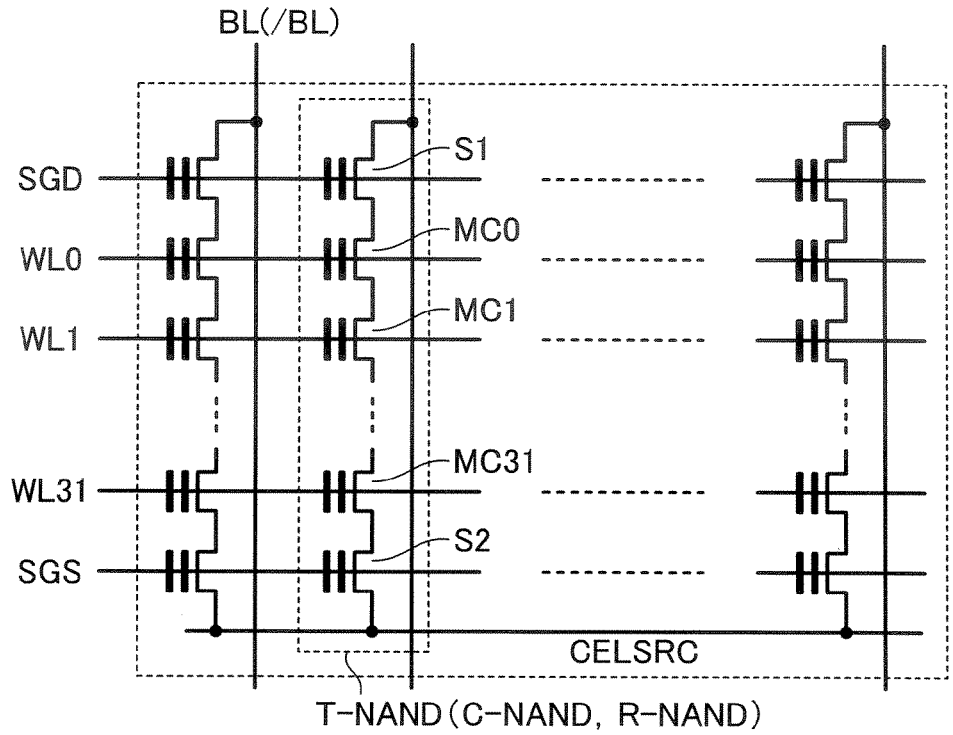
FIG. 5 shows the cell blocks, T-cell block, C-cell block, R-cell block, in the cell array.

FIG. 5 shows a configuration of one NAND string block in detail. The same configuration is used for the information cell T-cell, C-cell and the first reference cell R-cell. That is, a plurality of NAND cell units (i.e., NAND strings, T-NAND, C-NAND or R-NAND) are arranged in a matrix manner.

Each NAND string has a plurality of, thirty two in the example shown in the drawing, electrically rewritable and non-volatile semiconductor memory cells, MC0-MC31, connected in series. Each memory cell is a MOS transistor with a stacked gate structure of a floating gate and a control gate, which stores data in accordance with the carrier storage state of the floating gate in a non-volatile manner.

One end of the NAND string is coupled to a bit line BL(/BL) via a select gate transistor S1; and the other end to a common source line CELSRC via another select transistor S2.

Control gates of the memory cells MC0-MC31 are coupled to different word lines WL0-WL31, respectively. Gates of the select gate transistors S1 and S2 are coupled to select gate lines SGD and SGS, respectively, which are disposed in parallel with the word lines. A set of NAND strings sharing the word lines WL0-WL31 constitutes a "block" serving as a unit of data erase. Usually, there are prepared plural NAND string blocks in the direction of the bit line.

As shown in FIGS. 3 and 4, each two selected in blocks arranged in each of cell arrays 1*t* and 1*c* are set as first reference cell (R-cell) NAND string blocks R-BLK. While it is optional which NAND blocks are used as the first reference cell blocks R-BLK, once the first reference cell clocks R-BLK are selected, it should be used fixedly as the first reference cell blocks hereinafter, and others are used as information NAND strings blocks T-BLK and C-BLK.

Further, in each cell array 1*t*, 1*c*, two blocks are selected as second reference cell (I-cell) NAND string blocks I-BLK. The second reference cell block I-BLK is basically the same as the information cell block T-BLK, C-BLK and the first reference cell block R-BLK, but the gate connection is modified and different from that in others. The detail will be explained below.

Figure 6:
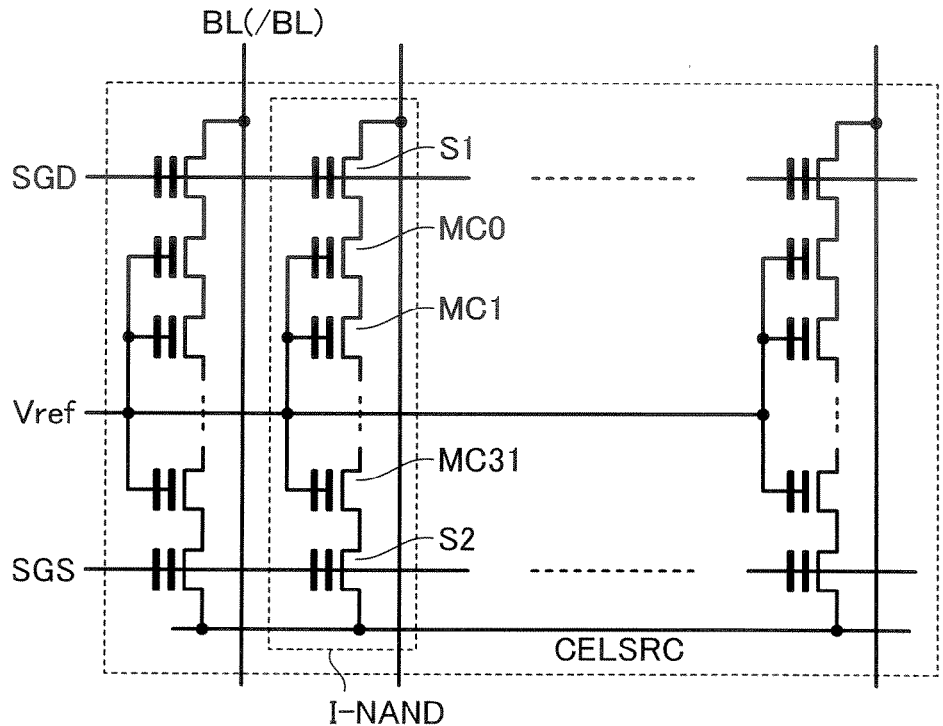
FIG. 6 shows I-cell block in the cell array.

FIG. 6 shows the configuration of the second reference cell (I-cell) block I-BLK. This is formed of NAND string I-NAND, which is basically the same as T-cell, C-cell and R-cell blocks. However, in this NAND string I-NAND, the control gates and floating gates of all memory cells MC0-MC31 are coupled to a common gate line, to which reference voltage Vref is applied. That is, the entire memory cells connected in series are operable as a reference current transistor in such a manner that the floating gates are applied with the reference voltage Vref.

The reference current source circuit used for detecting a cell current may be formed and deposited at the input node of the sense amplifier as being separated from the cell array. By contrast, according to this embodiment, in which all reference current sources are formed in the cell array with the same configuration as the cell array, it is unnecessary for using extra transistor areas and possible to obtain a current source with a small variation.

Figure 7:
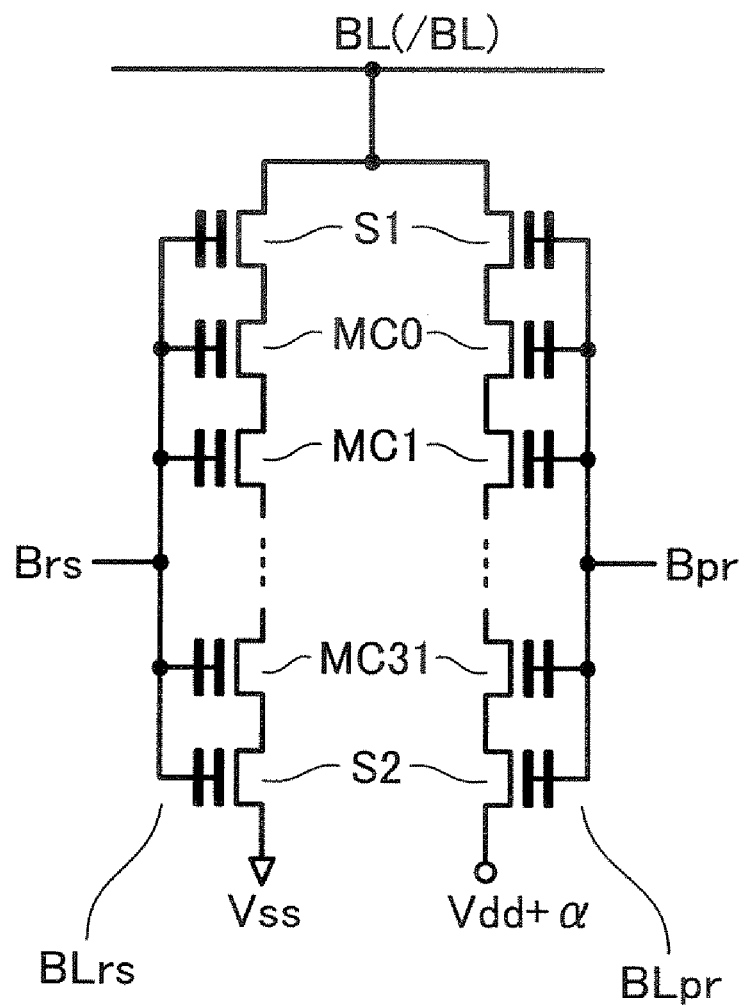
FIG. 7 shows the bit line reset/precharge circuit (BRP) in the cell array.

FIG. 7 shows the detailed configuration of the bit line reset/precharge circuit BRP. This is formed of bit line reset circuit BLrs and bit line precharge circuit BLpr disposed in parallel with the same configuration as memory cells in the cell array.

The bit line reset circuit BLrs is formed as follows: the control gates of memory cells MC0-MC31 and select gate transistors S1 and S2 are coupled to floating gates thereof like the select gate transistors S1 and S2, and these are coupled to a common control node Brs. The drain of select gate transistor S1 is coupled to bit line; and the source of select gate transistor S2 to a reset-use voltage node, for example, Vss node.

The bit line precharge circuit BLpr is formed as follows: the control gates of memory cells MC0-MC31 and select gate transistors S1 and S2 are coupled to floating gates thereof like the select gate transistors S1 and S2, and these are coupled to a common control node Bpr. The drain of select gate transistor S1 is coupled to bit line; and the source of select gate transistor S2 to a precharge-use voltage node, for example, a boost voltage node of Vdd+α. Applying a control voltage corresponding to the read pass voltage Vread to the precharge node Bpr, the bit line will be precharged to Vdd+α.

[Principle of Four-Level Data Storage]

Figure 8:
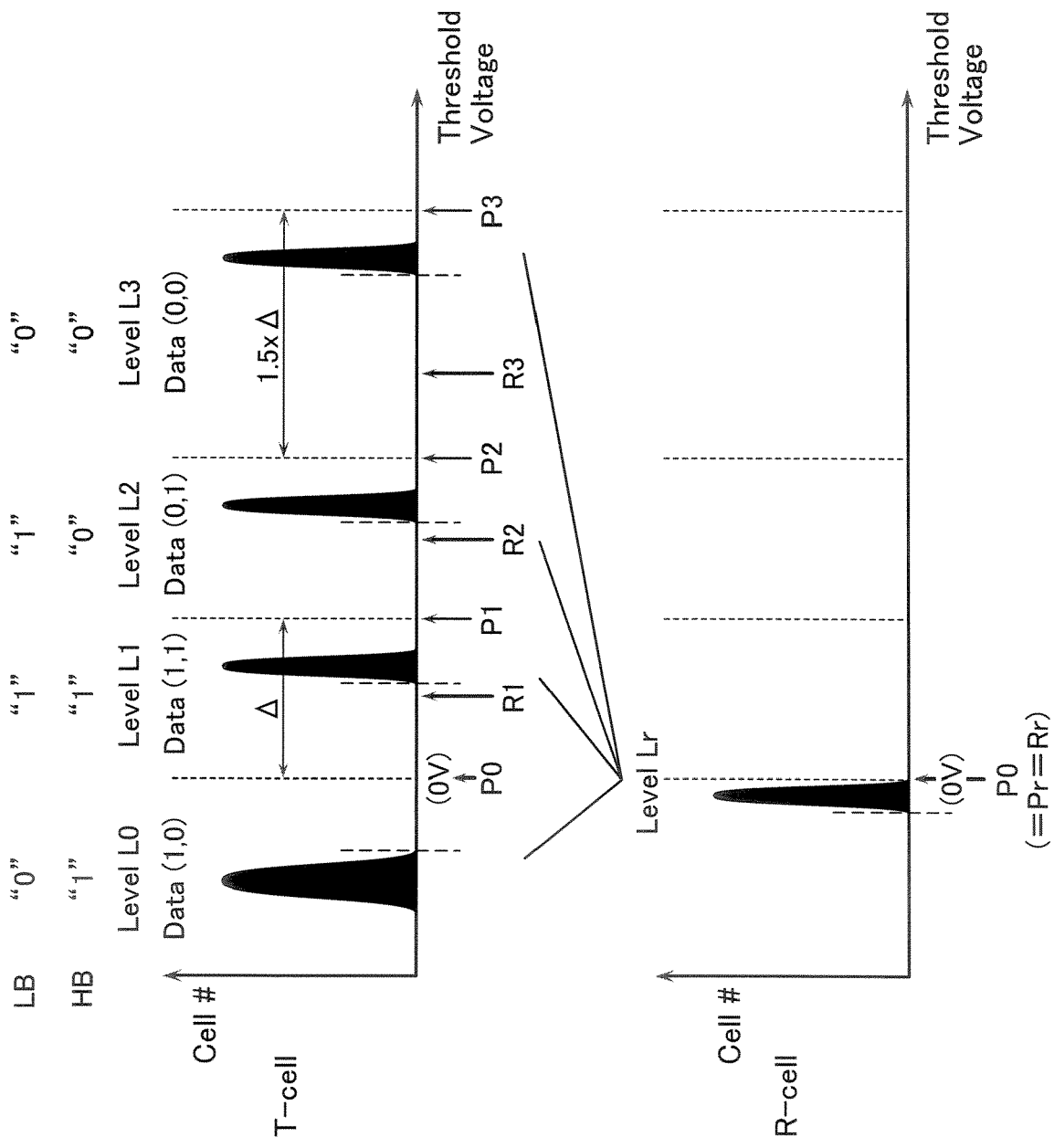
FIG. 8 shows relationships between four-level data and reference data level and a data bit assignment.

FIG. 8 show data levels, i.e., threshold distributions of the four-level data, and data bit assignments thereof in accordance with this embodiment.

While only data of the information cell T-cell is shown here, data of the information cell C-cell is the same as it except that the highest bit is reversed. The information cell T-cell is set at one of four data levels (i.e., threshold levels) L0, L1, L2 and L3 (where, L0<L1<L2<L3).

The lowest level L0 is a negative and erased threshold level defined by erase-verify voltage P0 (=0V). An erase level obtained by a block erase performed for a block in a lump may be basically used as this level L0. However, the erase level usually has a wide threshold distribution. Therefore, in this embodiment, to narrow the threshold distribution of the lowest level L0, a preliminary write step is used as explained later.

Data levels L1, L2 and L3 are positive and written threshold levels defined by verify voltages P1(=P0+Δ), P2(=P0+2Δ) and P3(=P0+3.5Δ), which are applied to a selected word line at write-verify times, respectively.

With the above-described verify voltages P1, P2 and P3, the write data levels L1, L2 and L3 are set to satisfy the relationship of: L1=L2−L1<L3−L2. In other words, the gap between the uppermost data level L3 and the following level L2 is set to be larger than others.

Reference level Lr, that is a data level of the reference cell R-cell, is set at about 0V lower than the secondary data level L1 of the information cell T-cell or C-cell as defined by write-verify voltage Pr(=P0).

As the reference level Lr, it is permissible in principle to use whichever voltage. However, in consideration of the reference word line level setting and write time of the reference cell, it is desirable to set the reference level Lr to be low. The reason is as follows: as the cell array becomes large in capacity and the time constant of the word line becomes large, it takes a long time for setting the word line to be high in its entirety. The reference level Lr being set to be near the lower one of data levels, it is able to make the write time of the reference cell short.

Considering the above-described situation, as shown in FIG. 8, the reference level Lr is set to satisfy the relationship of: L0<Lr<L1, and in detail, for example, set at about 0V or near it.

Supposing that the four-level data is defined as (HB,LB) (where, HB and LB are a higher (or upper) bit and a lower bit, respectively), as shown in FIG. 8, (1,0), (1,1), (0,1) and (0,0) are assigned to the data levels L0, L1, L2 and L3 of the information cell T-cell, respectively. In the C-cell array, the higher bit HB is reversed in logic to that in the T-cell array.

This four-level data may be judged in such a way as to detect cell current difference between an information cell T-cell (or C-cell) and a reference cell R-cell on a certain bias condition with a sense amplifier. That is, when the information cell T-cell is selected from the cell array it at a read time, the reference cell R-cell is selected from the cell array 1c at the same time, and these are coupled to the input nodes of the sense amplifier via a bit line pair to be subjected to current difference detecting. Similarly, when the information cell C-cell is selected from the cell array 1c, the reference cell R-cell is selected from the cell array 1t, and these are coupled to the input nodes of the sense amplifier.

In FIG. 8, voltages (read voltages) R1, R2, R3 and Rr applied to a selected word line TWL (or CWL) and a reference word line RWL are shown. The read operation with the read voltages will be explained in detail later.

As described above, levels L1, L2, L3 and Lr are defined by the verify voltages P1, P2, P3 and Pr, respectively, and threshold distributions thereof have the lowest values, as shown by dotted lines. The reason is, as described in detail later, as follows: a selected information cell's current, which flows when the verify voltage is applied, is compared with a reference cell current, and "write" completion is judged based on that the information cell's current has been detected to be smaller than the reference cell current.

By contrast, the lowest data level L0 has the upper limit value as shown by a dotted line. The reason is as follows: at an erase-verify time, with applying P0=0V to the entire word lines in a NAND cell unit, which has been erased in a lump, the cell unit's current is compared with a reference current, and "erase" completion is judged based on that the cell unit's current has been detected to be larger than the reference current.

[Write Preceding Process]

Figure 9:
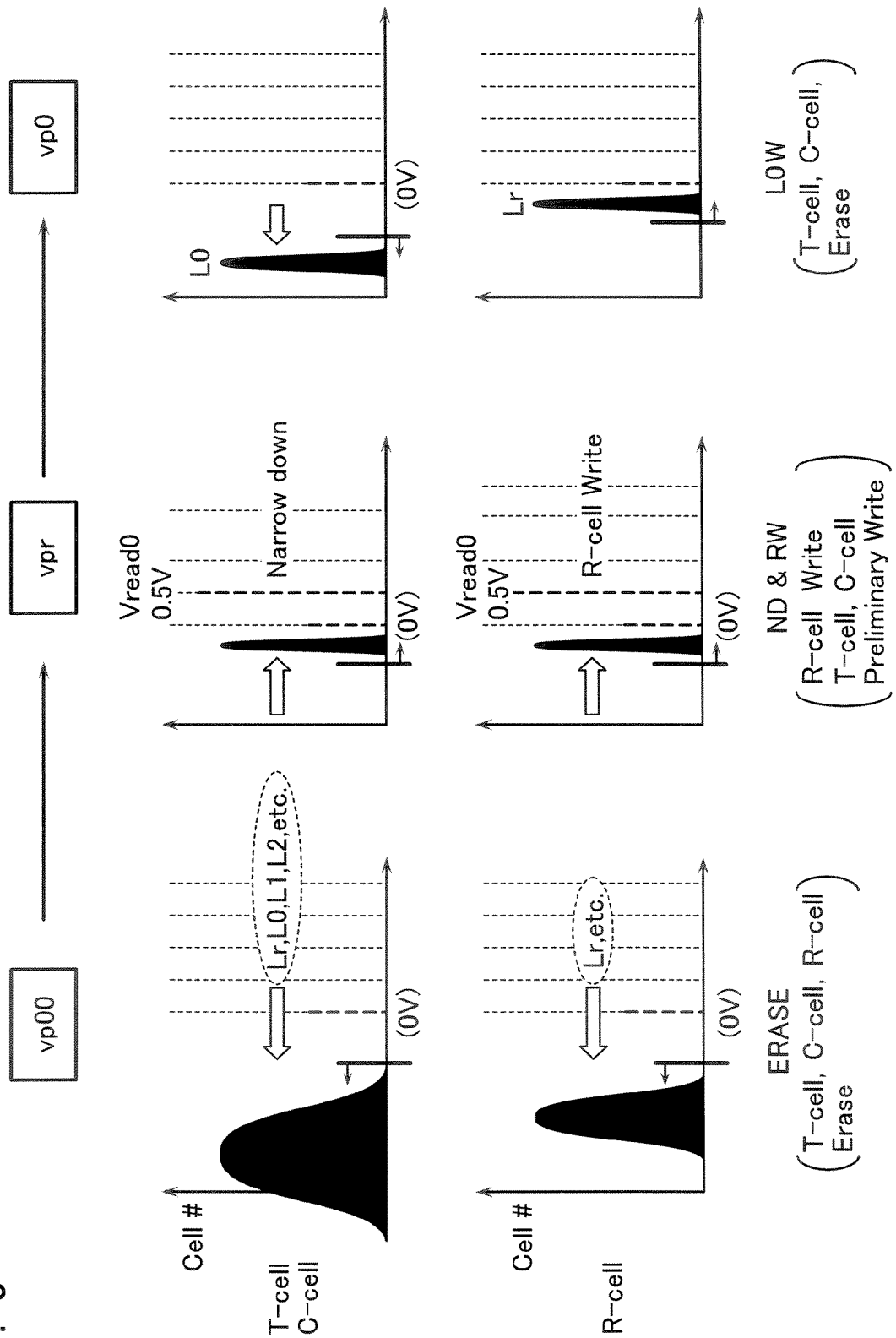
FIG. 9 shows the write preceding process.

FIG. 9 shows a write preceding process for four-level data write (or program), in which data erase is performed in a lump, and reference cells and information cells are written into the reference level Lr and the lowest level L0, respectively, from the erase state.

The initial step "vp00" in FIG. 9 is an erase step "ERASE". It is shown here such a state that erase-verify has been completed. Erase operation is usually performed by a block with respect to information cell blocks T-BLK and C-BLK with information cells T-cell and C-cell, and reference cell block R-BLK with reference cells R-cell. In detail, the erase operation is performed in such a way as to apply 0V to the entire word lines and erase voltage Vera to the p-type well, on which the cell array is formed, thereby discharging electrons in the floating gates. Note here that it is possible to erase multiple blocks at a time.

Figure 10:
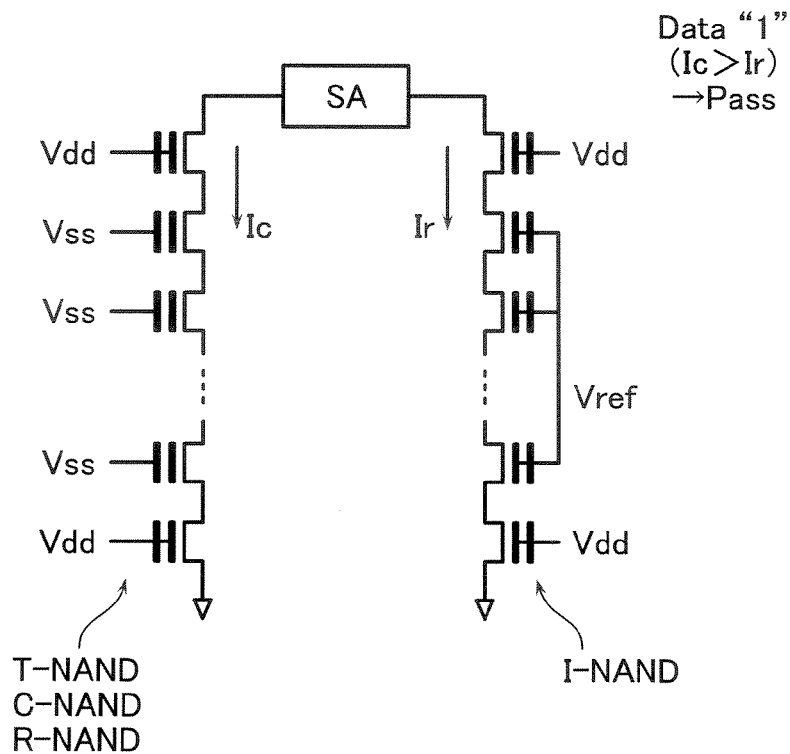
FIG. 10 shows the erase-verify operation principle at step vp00 in the write preceding process.

Erase-verify is, as shown in FIG. 10, performed with comparing the cell current Ic of information cell NAND string T-NAND (or C-NAND) or reference cell NAND string R-NAND, the entire word lines of which are applied with 0V, with the reference current Ir of the second reference cell NAND string I-NAND with a sense amplifier SA. Detecting data "1" (i.e., Ic>Ir), the erase-verify will be passed.

The information cell T-cell or C-cell is subjected to the ease-verify after having erased from various data threshold levels, so that the threshold distribution is wide. By contrast, the reference cell R-cell is lowered in threshold level from a constant level Lr, the threshold distribution is narrower than that of the information cell. However, even if a part of NAND strings have been erased, the erase operation is continued until the entire NAND strings have been erased. Therefore, the threshold distribution becomes wide.

Step "vpr" is a preliminary write step "ND&RW", in which data write of the reference level Lr of the reference cell R-cell and data write of the information cells T-cell and C-cell are performed. The data write of T-cell and C-cell is performed for the purpose of narrowing the threshold distribution (i.e., narrowing down, "ND") under the same condition as the reference cell write. In the drawing, the write completion states are shown.

The preliminary write operation is performed in such a manner that write voltage Vpgm is applied to a sequentially selected word line to cause electron injection into the floating gate like in the normal data write operation.

Figure 11:
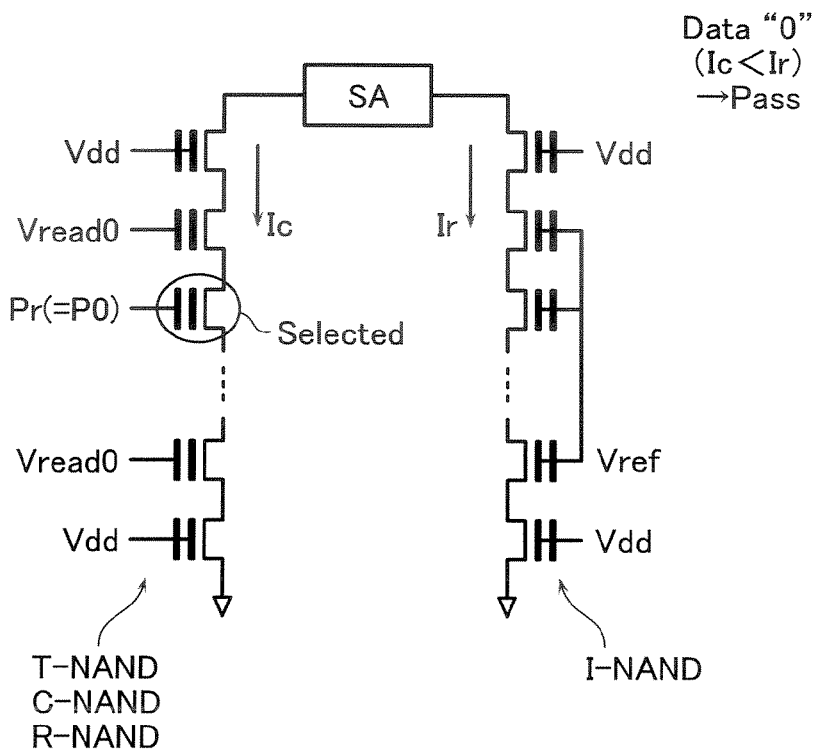
FIG. 11 shows the write-verify operation principle at step vpr in the write preceding process.

Write-verify is, as shown in FIG. 11, performed to compare the cell current Ic of information cell NAND string T-NAND (or C-NAND) or reference cell NAND string R-NAND, the selected word line and non-selected word lines of which are applied with verify voltage P0(=Pr, e.g., 0V) and pass voltage Vread0 (e.g., 0.5V), respectively, with the reference current Ir of the second reference cell NAND string I-NAND with a sense amplifier SA. Detecting data "0" (i.e., Ic<Ir), the write-verify will be passed. Therefore, the lowest value of the threshold distribution is defined.

As described above, all information cells and first reference cells are set at the reference level Lr. Since the verify-write is performed cell by cell in the NAND string, the threshold distribution becomes narrow after verify completion.

Step "vp0" is a data level L0 setting step "L0W" with respect to the information cells in within the information cells and reference cells, which have been set at the reference level Lr. In detail, except the reference cells R-cell, the information cells T-cell and C-cell are subjected to verify-erase again.

Figure 12:
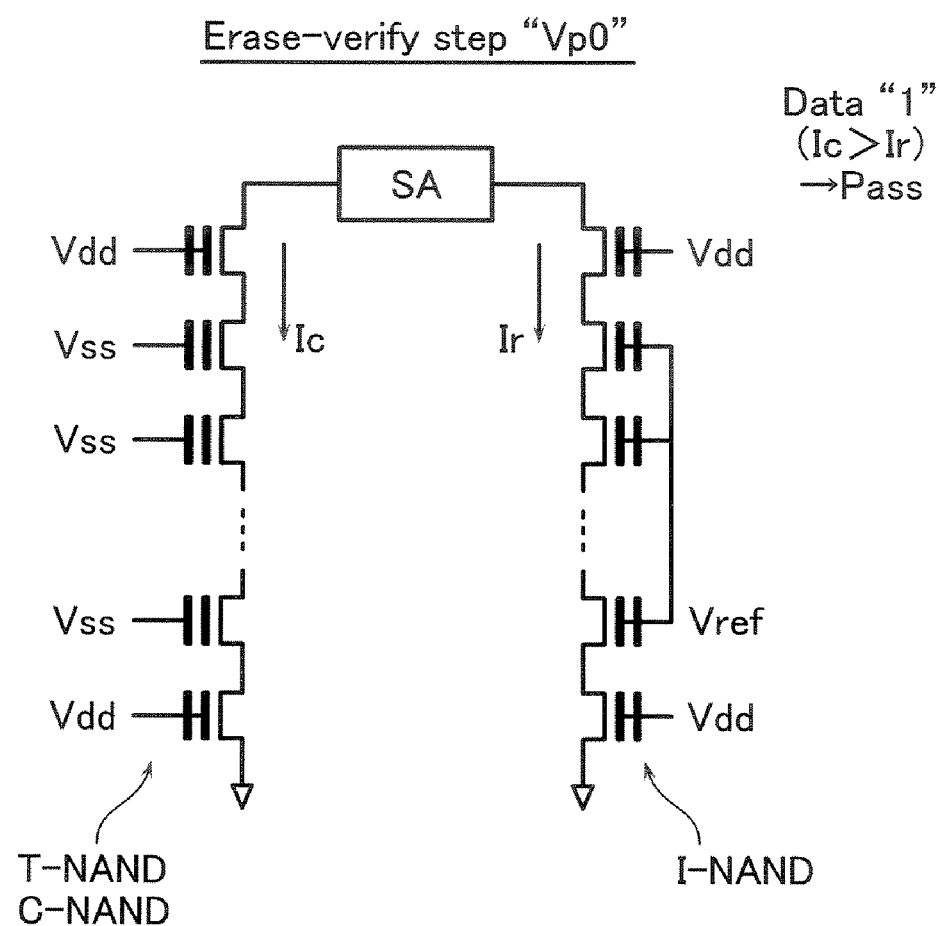
FIG. 12 shows the erase-verify operation principle at step vp0 in the write preceding process.

The erase-verify is the same as in the erase step "vp00". That is, as shown in FIG. 12, compare the cell current Ic of the information cell NAND string T-NAND (or C-NAND), the entire word lines of which are applied with 0V, with the reference current Ir of the second reference cell NAND with the sense amplifier. When data "1" (i.e., Ic>Ir) is detected, the erase-verify will be passed.

As a result, the lowest level L0 of the information cells T-cell and C-cell is decided. Although the threshold distribution is slightly widened at this step, the level L0 is defined to be narrower than that of the initial erase state because the distribution is narrowed via the preliminary write step "vpr".

Performing the above-described write preceding processes, "vp00", "vpr" and "vp0", the reference level Lr of the reference cell R-cell and the lowest level L0 of the information cells T-cell and C-cell are set.

[Data Write]

Figure 13:
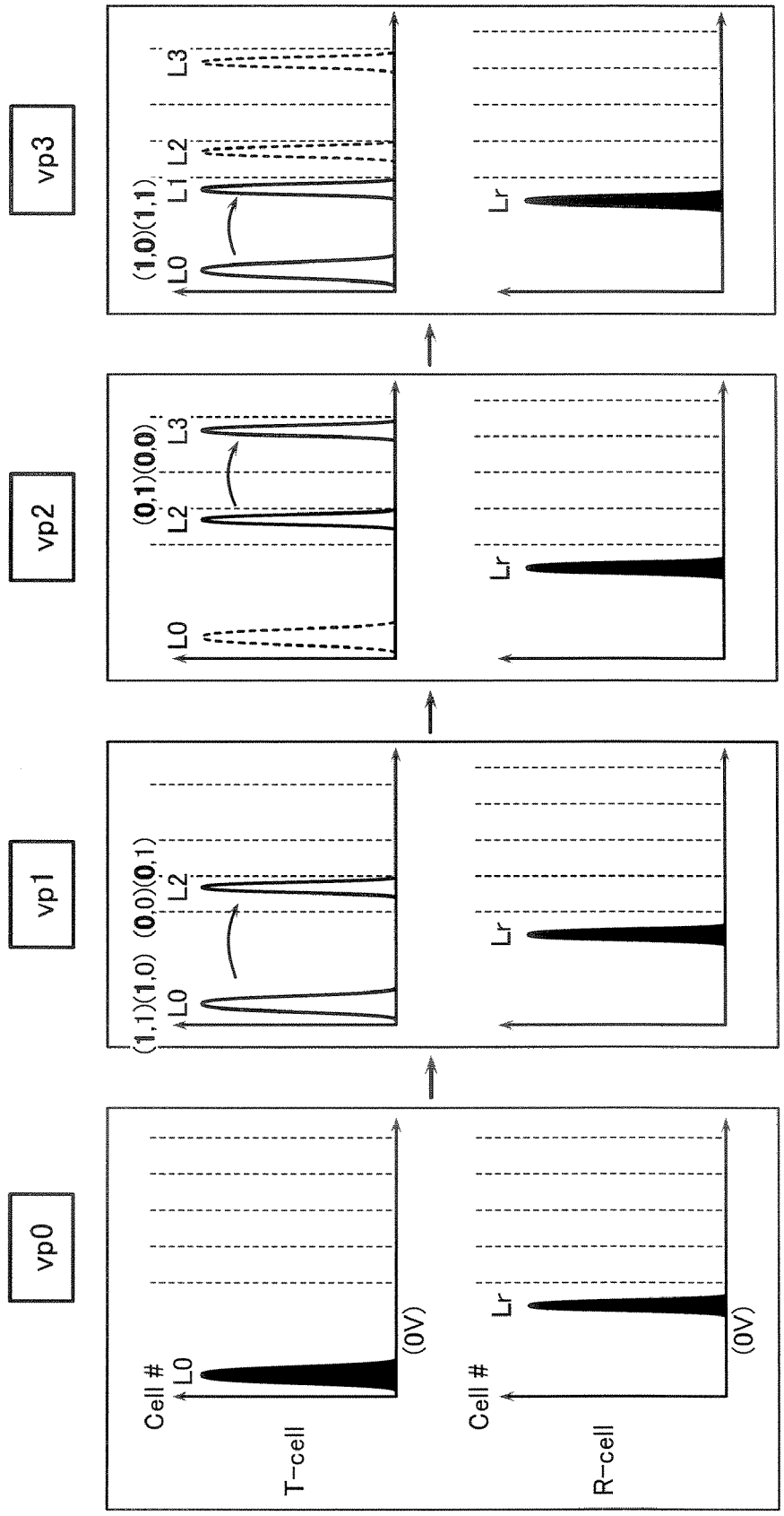
FIG. 13 is a diagram for explaining the write procedure of four-level data.

After having performed the above-described preceding processes, levels L1, L2 and L3 in four levels are written. The write procedure will be explained with reference to FIG. 13 below. In FIG. 13, the level changes of the information cell T-cell are shown in relation to the reference level Lr of the reference cell R-cell.

"vp0" in FIG. 13 is the final step in the preceding processes for data write as shown in FIG. 9. In the verify-write steps "vp1", in accordance with the higher bit HB supplied, the cell threshold voltage(s) of a part of the information cells in a state of level L0 (i.e., cells, to which HB="0" is applied) are increased to the third write level L2.

In the following verify-write step "vp2", in accordance with the higher bit HB, which has been written, and the lower bit LB supplied from the external, the cell threshold voltage(s) of a part of the information cells in a state of level L2, is increased to the highest write level L3.

Note here that it is able to interpose a read mode between the write steps "vp1" and "vp2". To restart the suspended write operation, it is necessary for reading out the written HB data in the cell array and externally loading the LB data into the data latch of the sense amplifier.

In the next verify-write step "vp3", in accordance with the higher bit HB, which has been written, and the lower bit LB supplied from the external, the cell threshold voltage(s) of a part of the information cells, which are in the erase level L0, is increased to the second write level L1.

It is also able to interpose a read mode between the write steps "vp2" and "vp3". To restart the suspended write operation, it is necessary for reading out the higher bit data HB of to-be-written cells and externally loading the lower bit data in the data latch of the sense amplifier.

With respect to the information cell C-cell, the upper bit HB is reversed to that of T-cell, but the write steps are the same as those of the T-cell.

Figure 14:
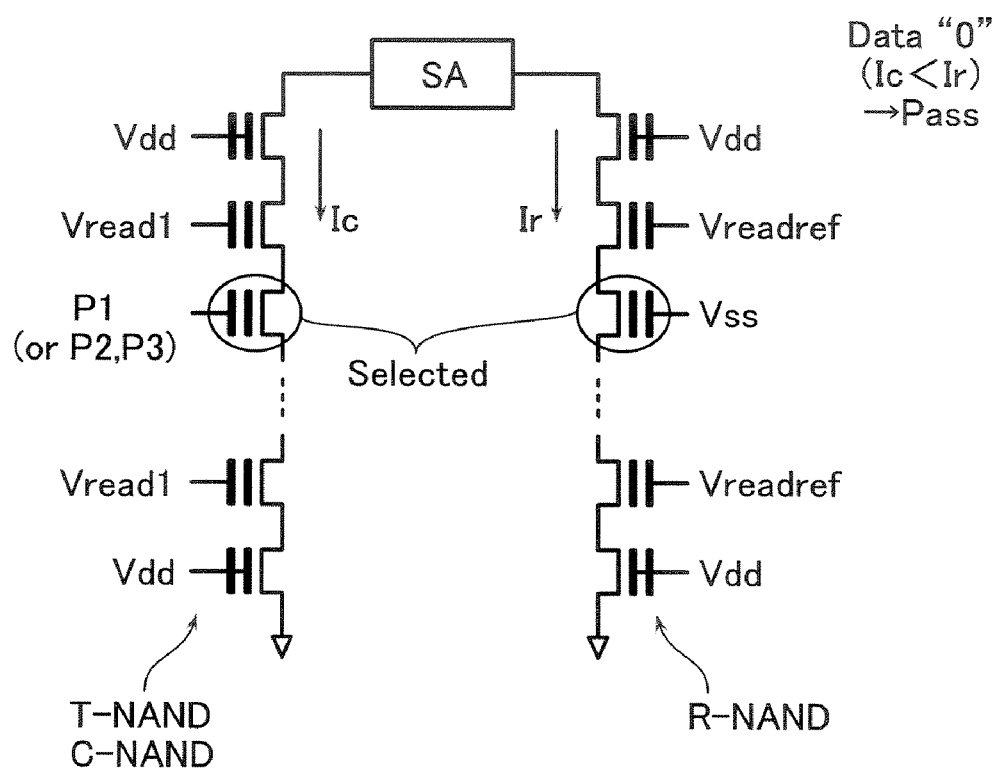
FIG. 14 shows the write-verify operation principle at each write step.

FIG. 14 shows the write-verify operation in the above-described write steps "vp1", "vp2" and "vp3". At the write-verify operation, the reference cell NAND string R-NAND, in which the reference level Lr has already been written, is used for cell current comparing.

That is, an information cell NAND string T-NAND (or C-NAND) with the information cells T-cell (or C-cell) selected from one cell array, and a reference cell NAND string R-NAND selected from the other cell array are coupled to the sense amplifier SA. The selected word line on the information cell side, which corresponds to a selected cell surrounded by a circle in FIG. 14, is applied with verify voltage P2 (e.g., 2V) at step "vp1"; and the remaining non-selected word lines with pass voltage Vread1 (e.g., 5V). On the reference cell side, the selected word line is applied with Vss=0V; and the remaining non-selected word lines with pass voltage Vreadref (e.g., 0.5V).

At the steps "vp2 and "vp3", the verify voltage applied to the selected word line is set at P3 (e.g., 3.5V) and P1 (e.g., 1V), respectively.

Under the above-described conditions, the sense amplifier SA compares the cell current Ic flowing in the information cell NAND string with the reference current Ir flowing in the reference cell NAND string. If data "0" (i.e., Ic<Ir) is detected, the data write will be completed. In practice, write and write-verify are repeated until the write completion is judged in the entire amplifiers arranged in a range where data write operations are performed at a time.

[Data Read]

Figure 15:
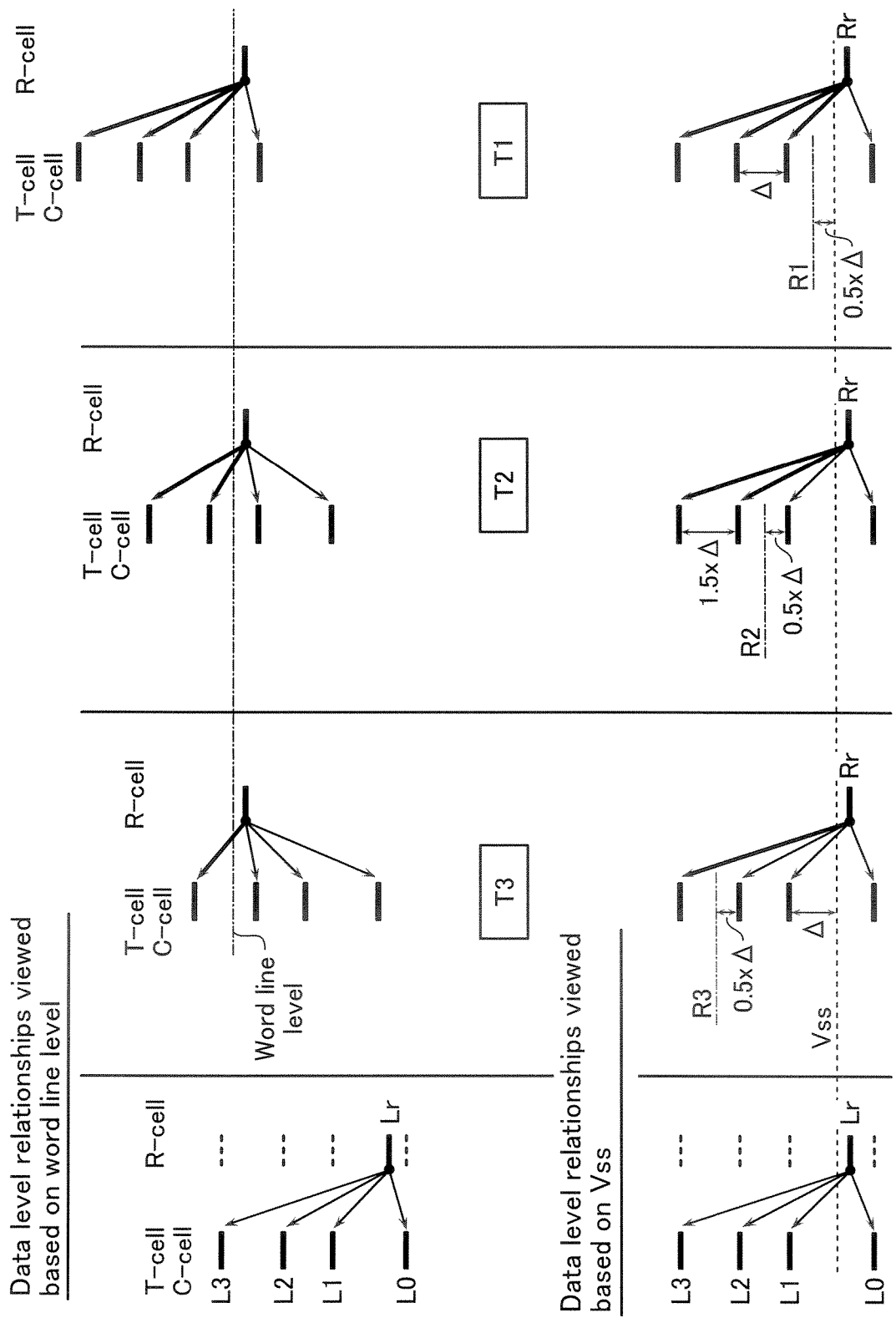
FIG. 15 is a diagram for explaining the principle of reading the four-level data.

FIG. 15 shows the level relationships between information cells T-cell, C-cell and reference cell R-cell for three read steps T3, T2 and T1 used in a data read cycle.

Reference data level Lr of the reference cell R-cell may be set to be an optional value with respect to four data levels. However, in consideration of level setting of the word line RWL of the reference cell R-cell and a program time length of the reference cell R-cell, it is preferable to set the reference level Lr to be as low as possible. Suppressing the level change of the reference word line with a large time constant, it becomes easy to control the reference cell, and the write time length of the reference cell will be made short. In FIG. 15, the reference level Lr is set to be higher than the lowest data level L0 and at about 0V.

The upper column in FIG. 15, shows that the four-value data may be judged with applying relative biases to levels of the information cell and reference cell on the assumption that read voltages (i.e., word line levels) applied to a selected word line TWL (or CWL) and a selected reference word line RWL is kept constant through the three read steps. Differences between data levels and the word line level correspond to cell currents. Therefore, level L3 is detected as data "0" at step T3; levels L2 and L3 as data "0" at step T2; and levels L1-L3 as data "0" at step T1.

The lower column in FIG. 15 shows the data level relationships for the respective read steps based on the ground level Vss. Data levels in the information cell are set to satisfy the following relations: difference between Vss and L1 is $\Delta$; difference between L1 and L2 is also about $\Delta$; and difference between levels L2 and l3 is 1.5$\Delta$.

At the step T3, it is necessary to read only the level L3 as data "0" (i.e., cell current is less than reference cell current). For the purpose of it, the word line level R3 of the information cell is set to be higher than the verify level P2 of data level L2 by 0.5$\Delta$, and between levels L2 and L3.

Word line level Rr of the reference cell R-cell is set at the same voltage as the verify voltage P0 at the write time of reference level Lr, for example Vss or near it. This read voltage Rr of the reference cell R-cell is kept constant through the whole read steps.

At step T2, to read data level L2 or more higher levels as data "0", the word line level R2 is set to be higher than the verify level P2 of data level L1 by 0.5$\Delta$, and between levels L1 and L2. At step T1, to read data level L1 or more higher levels as data "0", the word line level R1 is set to be higher than the verify level P0 of data level L0 (about Vss) by 0.5$\Delta$, and between Vss and level L1.

Figures 16, 17:
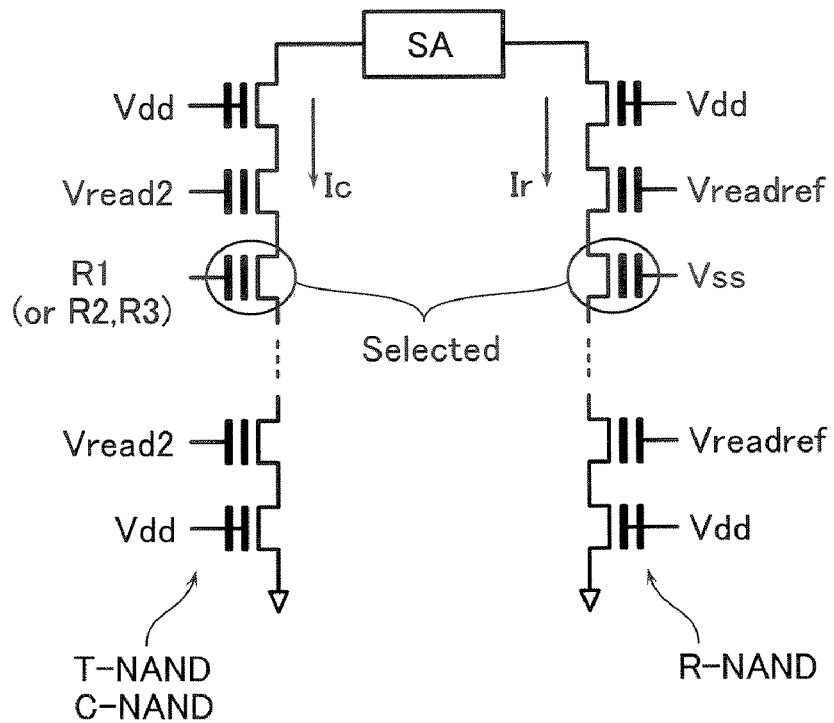
FIG. 16 shows the read data states of every read steps.
FIG. 17 shows the data read principle of every read steps.

As described above, data read is performed with three read steps T1, T2 and T3, in which word line level is set at R1, R2 and R3, respectively. FIG. 16 shows the sense results of the information cells T-cell with the respective data levels at the respective read steps.

The sense result at the step T2 is the higher bit HB as it is. By contrast, evenness/oddness of the number of "1" data obtained through the steps T1 and T3 corresponds to the lower bit LB. With respect to the information cell C-cell, the bit line connection for the sense amplifier is different from that of the information cell T-cell. Therefore, the sense data at each step will be reversed to those shown in FIG. 16. Although the higher bit assignment in the information cell C-cell is different from that in the information cell T-cell, the evenness/oddness of the number of "1" will not be changed in spite of that the sense results are reversed in logic.

Therefore, in case of the information cell C-cell, too, the sense data at step T2 becomes the higher bit HB; and evenness/oddness of the number of "1" data obtained through steps T1 and T3 corresponds to the lower bit LB.

FIG. 17 shows the detailed word line setting examples at the read steps. The lower bit (LB) read is performed with two cycles of T1 and T3. In the information cell NAND string T-NAND (or C-NAND), a selected word line is set at R1 (read voltage, e.g., 0.5V) at step T1, and at R3 (e.g., 2.5V) at step T3; and non-selected word lines at pass voltage Vread2 (e.g., 5.5V). In the reference cell NAND string R-cell NAND, a selected word line is set at Vss; and non-selected word lines at pass voltage Vreadref (e.g., 0.5V).

In the higher bit (HB) read cycle T2, in the information cell NAND string T-NAND (or C-NAND), a selected word line is set at R2 (e.g., 1.5V); and non-selected word lines at pass voltage Vread2 (e.g., 5.5V). In the reference cell NAND string R-cell NAND, a selected word line is set at Vss; and non-selected word lines at pass voltage Vreadref (e.g., 0.5V).

The memory cell tends to make its threshold voltage high in receipt of write disturbance. Considering this, the read voltages R1-R3 are set on the assumption that the cell threshold will be boosted by about 0.5V. As a result, erroneous read may be prevented in case the cell threshold voltage is boosted.

Although, as described above, the lower bit LB read is performed with two steps T1 and T3, word line level change at the driver side end is pretty different from that at another end because the word line has a large time constant. Therefore, if waiting until when the word line level change reaches another end, data sense timing is delayed, and it becomes impossible to access the memory at a high rate.

Figure 18:
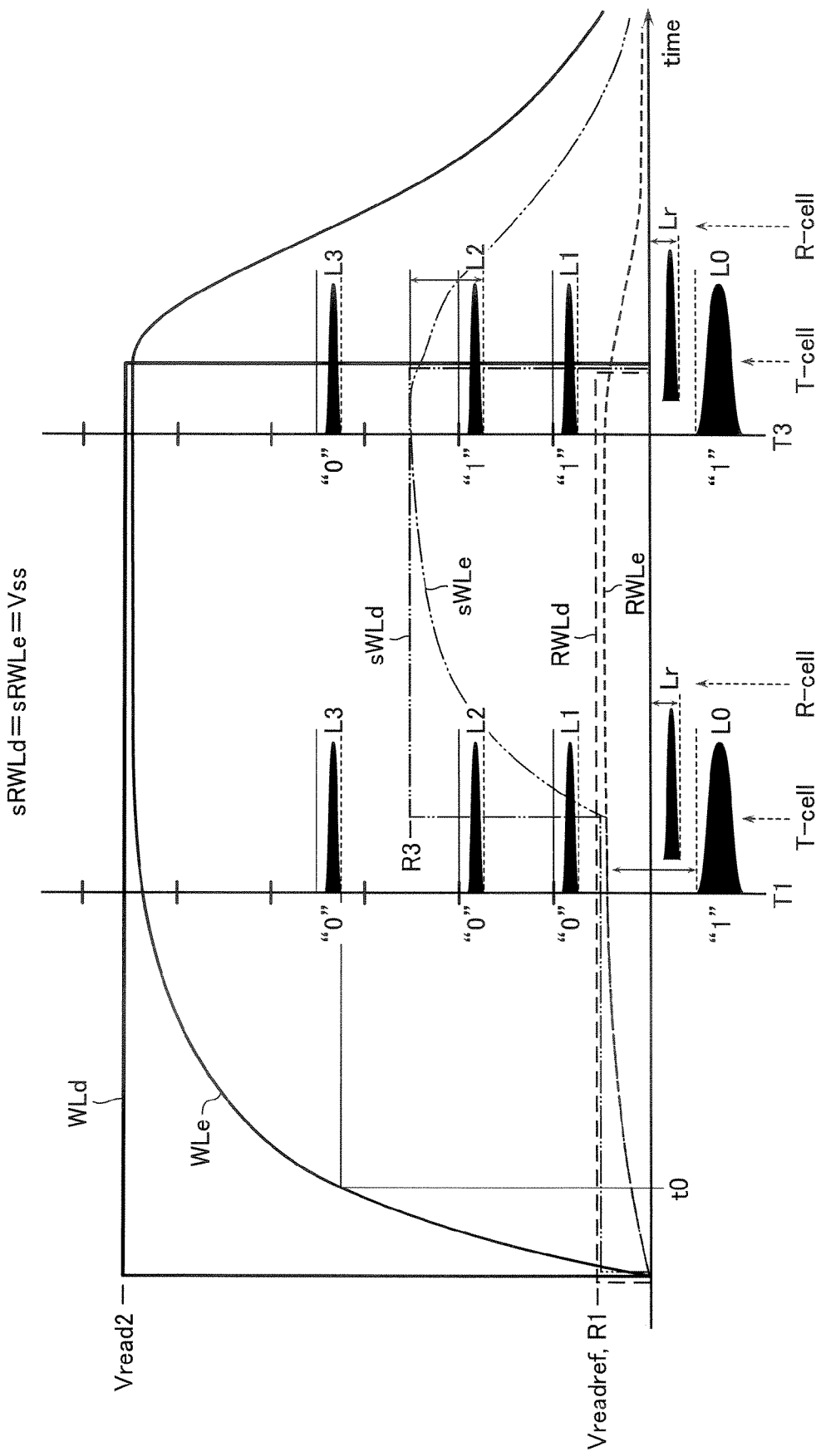
FIG. 18 shows word line drive waveforms at the lower bit read cycles.

With reference to FIG. 18, it will be explained a word line driving method for setting the word line at suitable levels through the two read steps in the read cycle of two steps.

The order of steps is selected in such a way that the word line levels in a selected NAND string are sequentially made high, i.e., step T1 is advanced; and step T3 followed.

In FIG. 18, with respect to word line TWL or CWL in an information cell block, "sWLd" and "sWLe" designates a selected word line; and "WLd" and "WLe" a non-selected word line. With respect to reference word line RWL in a reference cell block, "sRWLd" and "sRWLe" designate a selected reference word line; and "RWLd" and "RWLe" a non-selected reference word line. In these reference symbols, suffixes "d" and "e" show driver side end and another end of the word line, respectively.

The word line levels will be explained below.

Non-selected word line WL (WLd, WLe) in the selected information cell block:

Non-selected word line is set at high-level pass voltage Vread2 at step T1 in order to rapidly turn on cells with the highest data level L3 in the NAND string, and this level is kept as it is at step T3. The reason of this driving is as follows: driver side end WLd being set to be as high as possible, another end WLe is boosted to a high level at an early time, so that cells with data level L3 in the NAND string are turned on at an early timing, and the selected cell's current is not disturbed.

In FIG. 18, "t0" is designated as a timing when the end of the non-selected word line WLe becomes the data level L3. At step T3, Vread2 is kept without reducing the non-selected word line level. This is effective for reducing the influence of coupling current in accordance with the word line level change.

Selected word line sWL (sWLd, sWLe) in the selected information cell block:

To cancel the previous history, the selected word line sWL is initially reset to be Vss, and then access is started. Read voltage is set at R1 at the beginning of step T1, and raised up to R3 at step T3. After having finished the read steps, the read voltage is reset to be Vss, and then the word line is set to be floating.

Non-selected reference word line RWL (RWLd, RWLe) in the reference cell block:

Non-selected reference word line RWL is, as shown in FIG. 17, set to be equal to the non-selected word line voltage Vreadref used at the write-verify time of the information cell in order to make the reference current the same as that at writing time. In the example shown in FIG. 18, Vreadref is set to be equal to R1. After having finished the read steps, the reference voltage is reset to be Vss, and then the reference word line is set to be floating.

Selected reference word line sRWL (sRWLd, sRWLe) in the reference cell block:

Selected reference word line sRWL is, as shown in FIG. 17, set to be Vss for making the reference current as similar to the information cell write-verify time. Therefore, sRWLd=sRWLe=Vss is kept through the steps T1 and T3.

Figure 19:
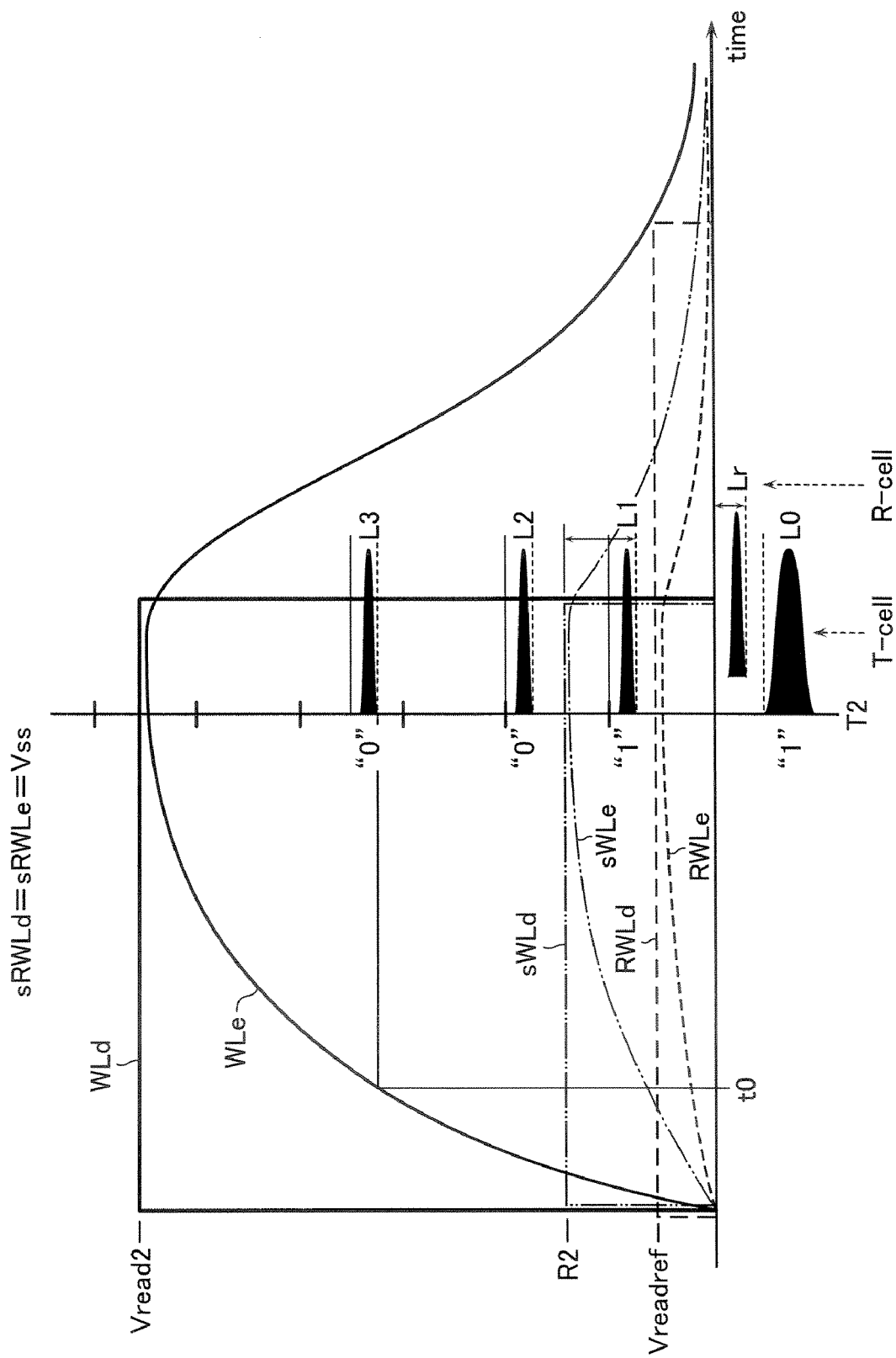
FIG. 19 shows word line drive waveforms at the upper bit read cycle.

FIG. 19 shows the word line level change at the higher bit (HB) read step T2. Level Vread2 of the non-selected word line WL in the selected information cell block and level Vreadref of the non-selected reference word line in the reference cell block are the same as those at the step S1.

However, the time length of step T2 is set to be longer than that of step T1. The reason is as follows: it is required of step T2 to judge data level L1 as data "1" as being different from step T1, read voltage R2 applied to the selected word line sWL is higher than that R1 at step T1, so that it takes a long time to obtain a desired value at the word line end sWLe. It is the same as the lower bit read that the selected reference word line sRWL is set as: sRWLd=sRWLe=Vss.

Note here, in FIGS. 18 and 19, that straight solid lines shown on the upper sides of data levels L1-L3 and reference level Lr designate word line levels (i.e., verify-voltages) at write-verify time; and dotted lines shown the lower sides thereof designate lower limit values of the threshold voltage distributions defined by write-verify. With respect to the lowest level L0, the dotted line shown on the upper side of it designates the higher limit of the threshold distribution because it is defined by erase-verify.

Further note that the widths of arrows shown between data levels L0, L1, L2 and the word line level of the selected word line sWL and that between the reference data level Lr and Vss correspond to to-be-detected cell currents and the reference current, respectively, and "0" data is sensed when the cell current is smaller than the reference current.

Figure 20:
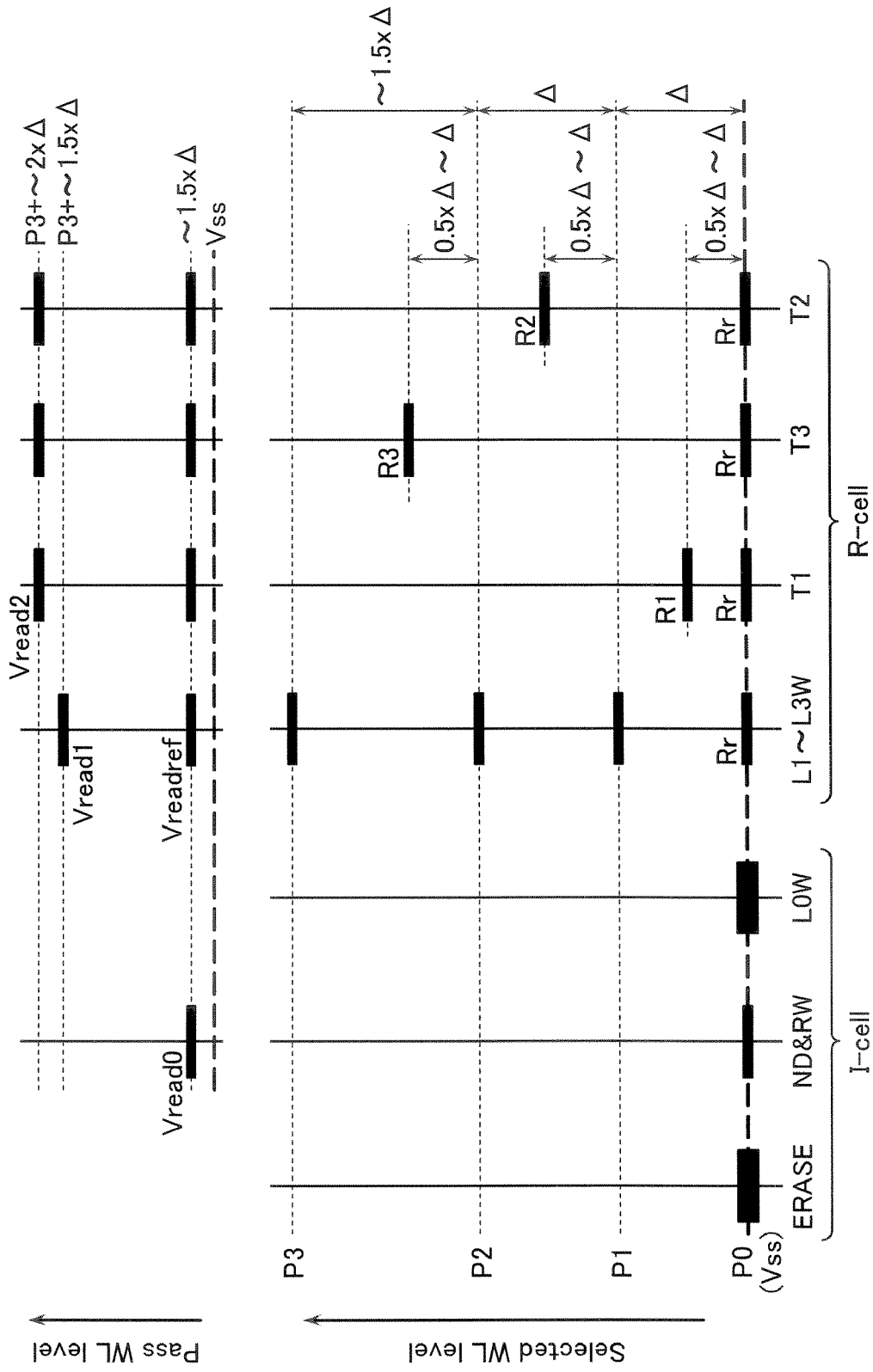
FIG. 20 shows summarized word line voltages at every operation.

FIG. 20 shows the word line levels in every operation modes.

As described above, verify voltages are set to satisfy the following relationships: level difference between P0(=Vss) and P1, and that between P1 and P2 are set to be $\Delta$; and level difference between P2 and P3 is $1.5 \times \Delta$. As a result, with respect to word line boosting, it is possible to get a large margin for variations based on the locations.

Word line levels are different in accordance with operation modes such as write-verify, erase-verify and normal read, further in accordance with which reference current is used between the first reference cell R-cell and second reference cell I-cell. In case the second reference cell I-cell is used at verify time, only the cell's word line level is necessary to be set.

Word line levels will be explained below for the respective modes.

First erase step, "ERASE"-vp00, in the write preceding process:

The entire word lines in the selected block are set at P0(=Vss). In the drawing, a bold line is used for designating that the entire word lines are selected.

Preliminary write step, "ND&RW"-vpr, in the write preceding process:

This is a preliminary write step for not only writing data level Lr into the reference cell R-cell, but also narrowing down the threshold voltages of the information cells T-cell and C-cell with the same condition. For this purpose, verify voltage P0 is applied to the selected word line; and pass voltage Vread0 (=$0.5 \times \Delta$) is to non-selected word lines. To judge "0" for every word lines (i.e., cells), it is required of the non-selected cells to be turned on. However, the pass voltage applied to the non-selected word lines are set to be as low as possible.

Second erase step, L0W-vp0, in the write preceding process:

This is the second time erase step for making the information cells, which have been written into reference data level Lr, have the lowest data level L0. Therefore, the word line level is the same as in the first erase step "ERASE".

In the above-described preceding processes, "ERASE", "ND&RW" and "L0W", the second reference cell I-cell is used as the reference current source.

Write steps, "L1-L3W"-vp1-vp3, for data levels L1-L3:

At the write-verify times for verifying data levels L1-L3, the first reference cell R-cell is used. In case the reference cell R-cell is used, it is in need of setting the word line level in the NAND string as different from the case where the second reference cell I-cell is used.

The selected word line in the information cell NAND string is set at the verify voltage P1, P2 or P3 in accordance with write steps, while the non-selected word lines thereof are applied with pass voltage Vread1 (=P3+1.5$\Delta$).

In the reference cell NAND string, the selected word line is set at verify voltage Pr (=Vss); and the non-selected word lines at pass voltage Vreadref (=0.5$\Delta$). Since the reference cell NAND string is set at the reference level Lr at ND&RW step, word line level is selected to reproduce the state.

Read steps T1, T3 and T2:

At read steps, the reference cell R-cell is used for detecting the cell current. Word lines of the reference cell NAND string are set as follows through all read steps: the selected word line is set at Rr (=Vss); and non-selected word lines are pass voltage Vreadref (=$0.5 \times \Delta$).

To read the lower bit (LB), T1 and T3 cycles are used. In these cycles, the selected word line in the information cell NAND string is applied with read voltages R1 (=$0.5 \times \Delta$) and R3 (=P2+$0.5 \times \Delta$), respectively; and non-selected word lines with pass voltage Vread2 (=P3+$2 \times \Delta$).

As described above, the read voltage Ri is set to be higher than the verify voltage Pi by $0.5 \times \Delta$, so that erroneous read may be avoided. Especially, the information cells are received with various disturbances, and tend to shift threshold voltage thereof to the high level side. Therefore, the read voltage may be selected as near Pi+$\Delta$ in accordance with situations.

To read the higher bit (HB), only cycle T2 is used. At this time, the selected word line in the information cell NAND string is applied with read voltage R2 (=P1+$0.5 \times \Delta$); and non-selected word lines with pass voltage Vread2 (=P3+$2 \times \Delta$).

Next, detailed circuits and operations thereof will be explained below.

[Sense Amplifier]

Figure 21:
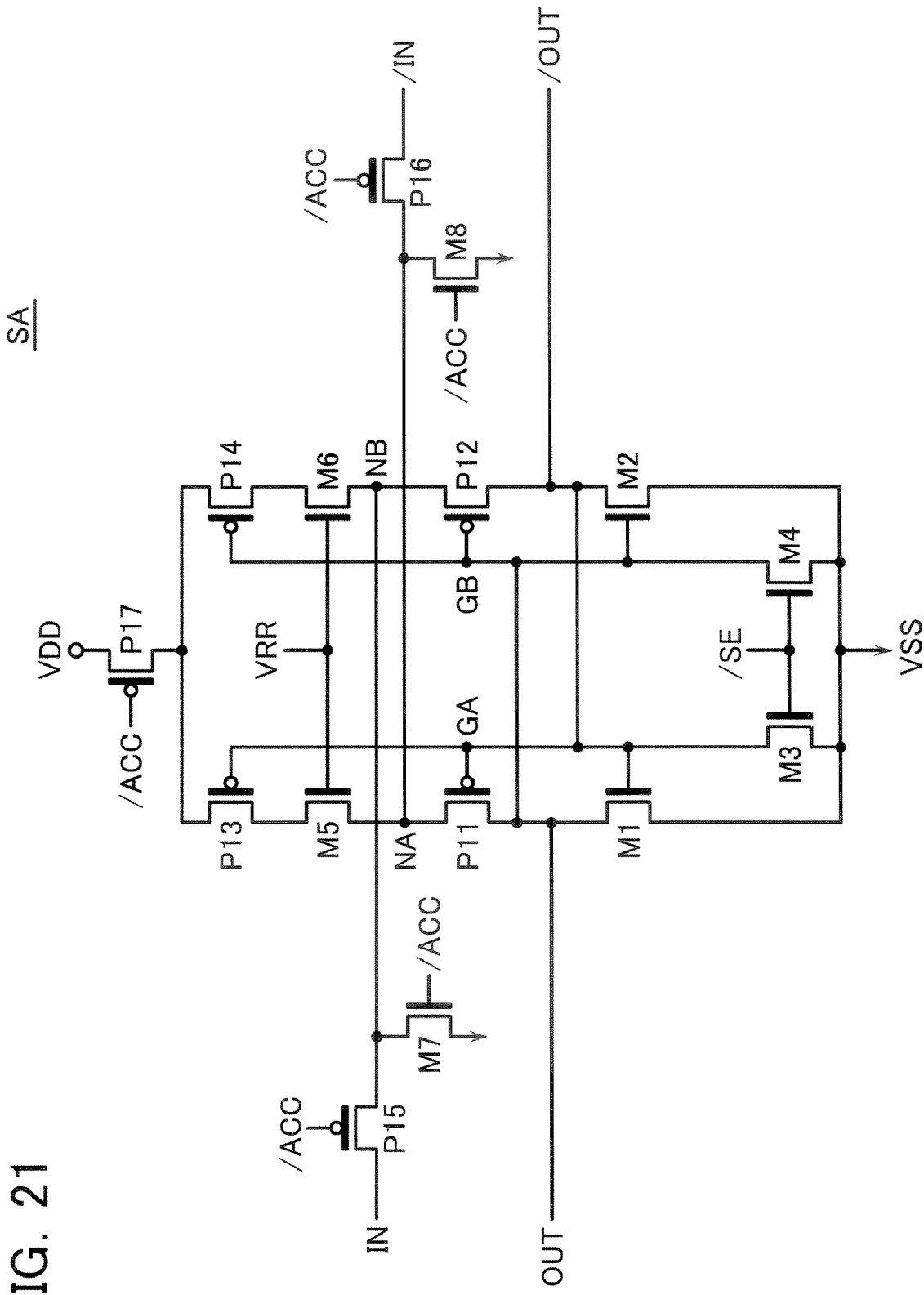
FIG. 21 shows the sense amplifier SA.

FIG. 21 shows the configuration of the sense amplifier SA. This sense amplifier SA is a current detecting type of a differential sense amp including a latch formed of PMOS transistors P11 and P12, and NMOS transistors M1 and M2.

The drain of PMOS transistor P11 and NMOS transistor M1, which are connected in series with a common gate GA, is coupled to one output node OUT. Similarly, the drain of PMOS transistor P12 and NMOS transistor M2, which are connected in series with a common gate GB, is coupled to the other output node /OUT. The common gates GA and GB are cross-coupled to the output nodes /OUT and OUT, respectively.

PMOS transistors P11 and P12 are coupled to power supply node Vdd via PMOS transistors P13 and P14, and via current limiting MMOS transistor M5 and M6, respectively, and via a current source PMOS transistor P17.

The gates of the PMOS transistors P13 and P14 are coupled to the common gates GA and GB, respectively. Gates of the current limiting NMOS transistors M5 and M6 are connected in common and controlled with a control signal VRR. The gate of the current source PMOS transistor P17 is controlled with an activation signal /ACC.

The sources of NMOS transistors M1 and M2 are coupled to ground potential node Vss. The common gates GA and GB are coupled to Vss via NMOS transistors M3 and M4, respectively, the gates of which are controlled with a sense signal /SE.

The source node NA of PMOS transistor P11 is coupled to one input node /IN via PMOS transistor P16 driven by the activation signal /ACC; and the source node NB of PMOS transistors P12 to the other input node IN via PMOS transistor P15 driven by the activation signal /ACC. These transistors P15 and P16 serve for separating the sense amplifier waiting state and bit line precharge state, and for making the sense amplifier operation time short, thereby making possible to do data sense with a small consumption current.

Further coupled to these nodes NA and NB are NMOS transistors M7 and M8, which are driven by the activation signal /ACC, and serve for setting the nodes NB and NA to be Vss when the sense amplifier is inactive (/ACC="H").

The operation of the sense amplifier SA will be explained below on the assumption that the current limiting transistors M5 and M6 are not disposed. The bit line precharge operation will be explained later. In a normal data read mode, cell current of the information cell T-cell (or C-cell) and reference current of the reference cell T-cell reflect the input nodes IN and /IN, the current difference is detected. In a non-activated state with /ACC="H" and /SE="H", NMOS transistors M3, M4, M7 and M8 being kept on, the output nodes OUT, /OUT and the common gate nodes GA and GB are kept at Vss.

When a pair of word line TWL or CWL and reference word line RWL is selected, and a pair of bit lines BL and /BL is coupled to the input nodes IN and /IN, the activation signal /ACC becomes "L", and then the sense signal /SE becomes "L" a little late, so that the sense amplifier SA is activated. Supposing that an information cell T-cell and a reference cell R-cell are selected on the bit lines BL and /BL sides, respectively, cell currents thereof are supplied to the nodes NB and NA.

Just after the sense amplifier activation, NMOS transistors M1 and M2 are off, but PMOS transistors P11, P12, P13 and P14 are on. Therefore, the output nodes OUT (=GB) and /OUT (=GA), which have been reset to be Vss, are charged-up with the power supply current from Vdd and the cell currents imposed thereon. When a voltage difference is generated between the output nodes OUT and /OUT (i.e., between the gate nodes GA and GB), it is performed such a positive feed back operation in the latch that the voltage difference between the output nodes OUT and /OUT is amplified, so that the voltage difference will be rapidly increased.

Supposing that, for example, OUT(GB) is lower than /OUT(GA), due to the positive feed back from /SE, NMOS transistor M1 is on; NMOS transistor M2 off; PMOS transistors P12 and P14 on; and PMOS transistors P11 and P13 off, so that the output nodes OUT and /OUT become Vss and Vdd, respectively.

In the sense amplifier SA in accordance with this embodiment, to certainly sense a small current such as, e.g., 0.1 µA or less, the current limiting NMOS transistors M5 and M6 are disposed for squeezing the cell current at the beginning of data sensing.

The operation of the current limiting transistors M5 and M6 will be explained in detail below. The sense amplifier SA is set in a waiting state and the power sully current is supplied when the activation signal /ACC become low. However, even if the sense amplifier SA is in an inactive state with /ACC="H", it is desired that it is possible to supply current to the bit lines. For the purpose, the PMOS transistors P15 and P16, which are controlled by /ACC, are disposed at the input nodes IN and /IN. When the sense amplifier is set in the waiting state, the input nodes IN and /IN are coupled to the bit lines, and the power supply current is supplied to the bit lines. However, the cell current difference is small at this time. If large current flows in the sense amplifier, to-be-detected cell current becomes relatively small, and this leads to reduction of sensitivity of the sense amplifier SA, thereby resulting that the sense state is defined by noises of the sense amplifier itself.

In consideration of such the situation, in the sense amplifier waiting period and at the beginning of sensing, the supply current of the sense amplifier is limited by the current limiting NMOS transistors M5 and M6. That is, the control signal VRR is set at a low level (e.g., power supply voltage Vdd), and transistors M5 and M6 are set to have a small channel conductivity.

After the bit line data is transferred to the sense amplifier SA, and it is activated with the sense signal /SE, after the drain voltages of transistors M3 and M4 start to drive the latch (M1, M2, P11 and P12) and the power supply pass of P13, P14 in accordance with sense data, the control signal VRR is set at a higher level (e.g., boosted read pass voltage Vread). As a result, the transistors M5 and M6 are set to have high channel conductivity, and become possible to latch data at a high rate.

Figure 22:
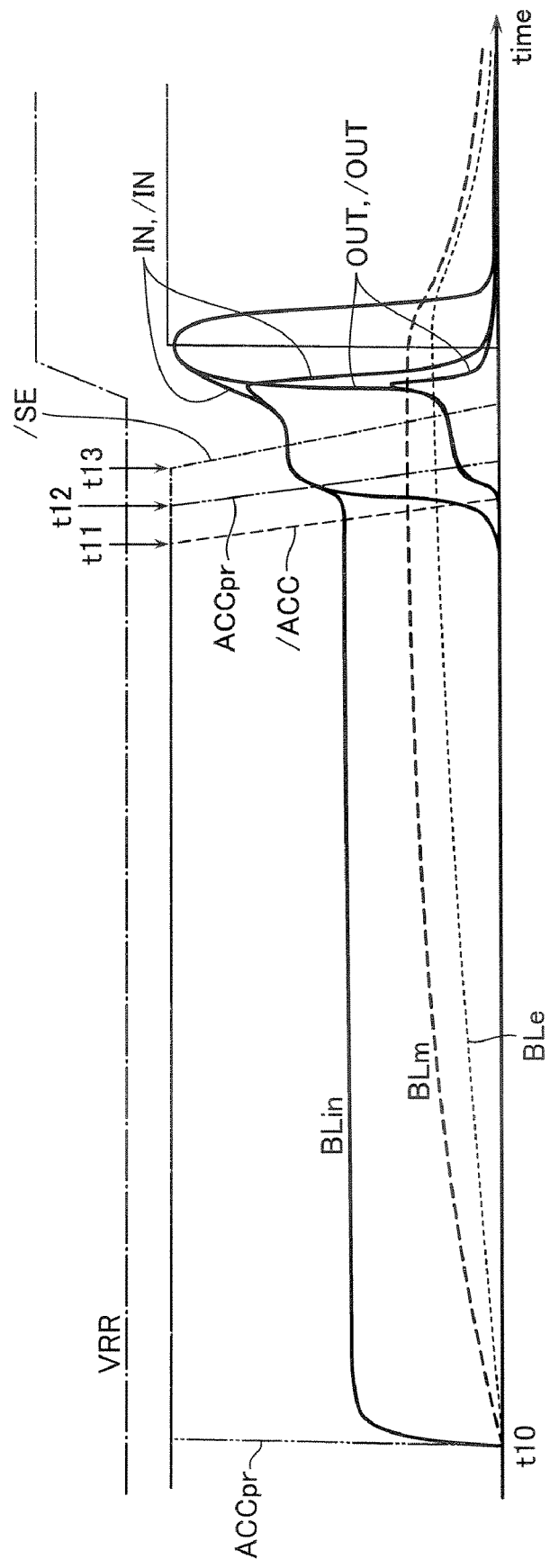
FIG. 22 shows voltage waveforms of the bit line precharge operation and the sense operation at the read time.

FIG. 22 shows the operation waveforms of the sense amplifier including the bit line precharge operation. In case of not only normal read but also verify-read, prior to the sense amplifier SA activation, bit lines BL and /BL are precharged with signal /ACCpr (refer to FIG. 24). As a result, the bit lines BL and /BL are smoothly coupled to the differential input nodes IN and /IN, and data sense is performed under the control of the sense amplifier current with the control signal VRR.

In FIG. 22, "BLin" designates a bit line position nearest the input node of the sense amplifier SA; "BLe" designates that farthest from the sense amplifier SA; and "BLm" designates that midway therebetween.

Since a bit line has a large time constant, while a certain time period has not lapsed from the beginning of bit line current supplying, the cell current state of a NAND string farthest from the sense amplifier SA will not be transferred to the sense amplifier SA. Therefore, it is desired to start the current supplying to the bit lines as early as possible after cell accessing. By contrast, if the current detecting type of sense amplifier SA is kept in an active state during the waiting time for sense starting, wasteful current flows in it.

Figure 24:
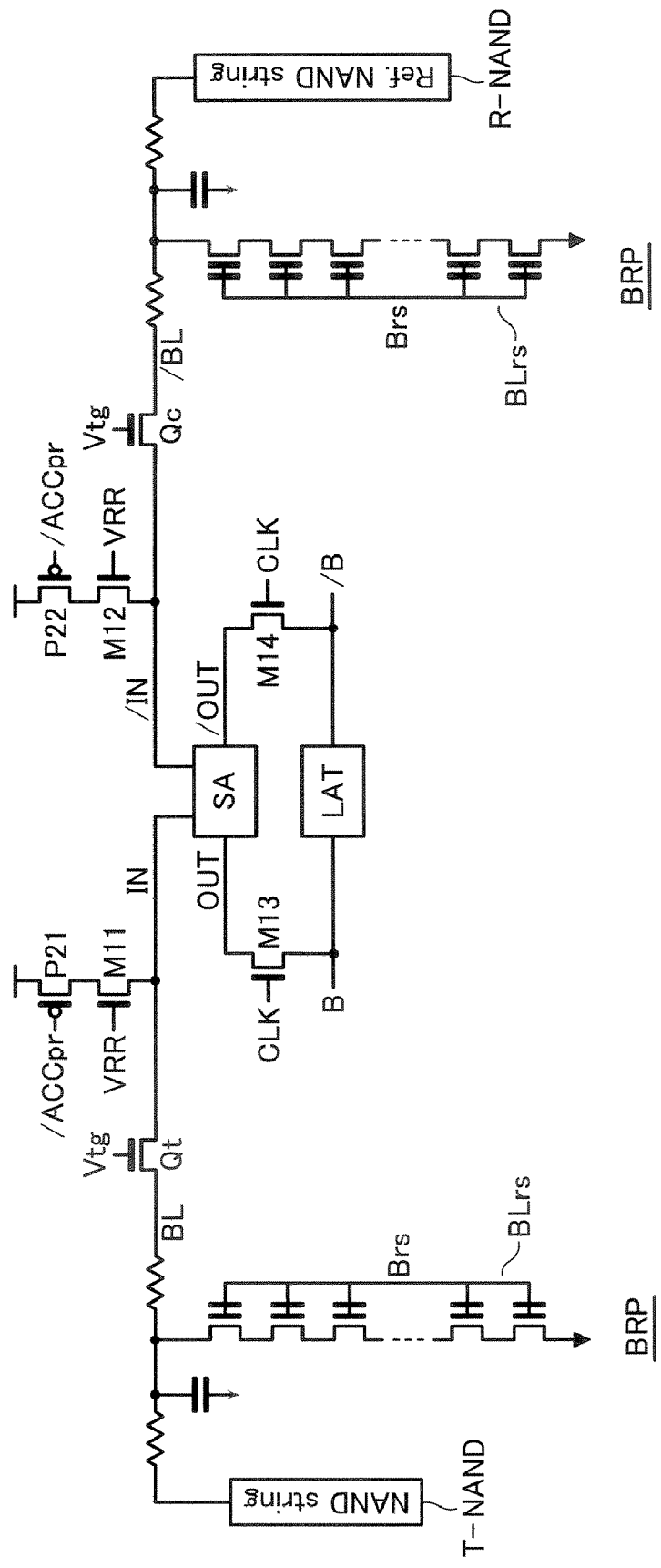
FIG. 24 shows the bit line sense system at the data read time.
Figure 25:
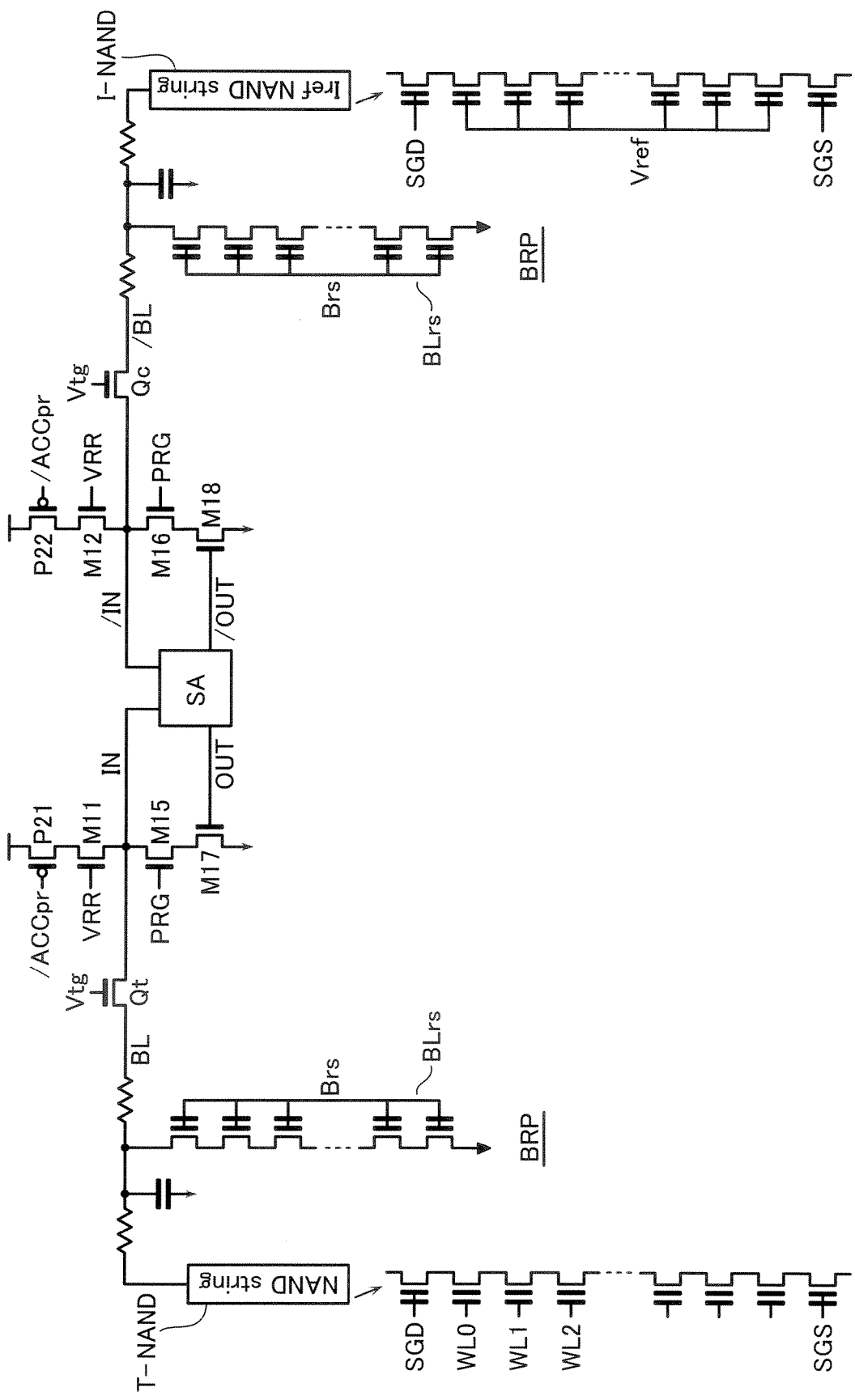
FIG. 25 shows the bit line sense system at the write preceding process time.
Figure 26:
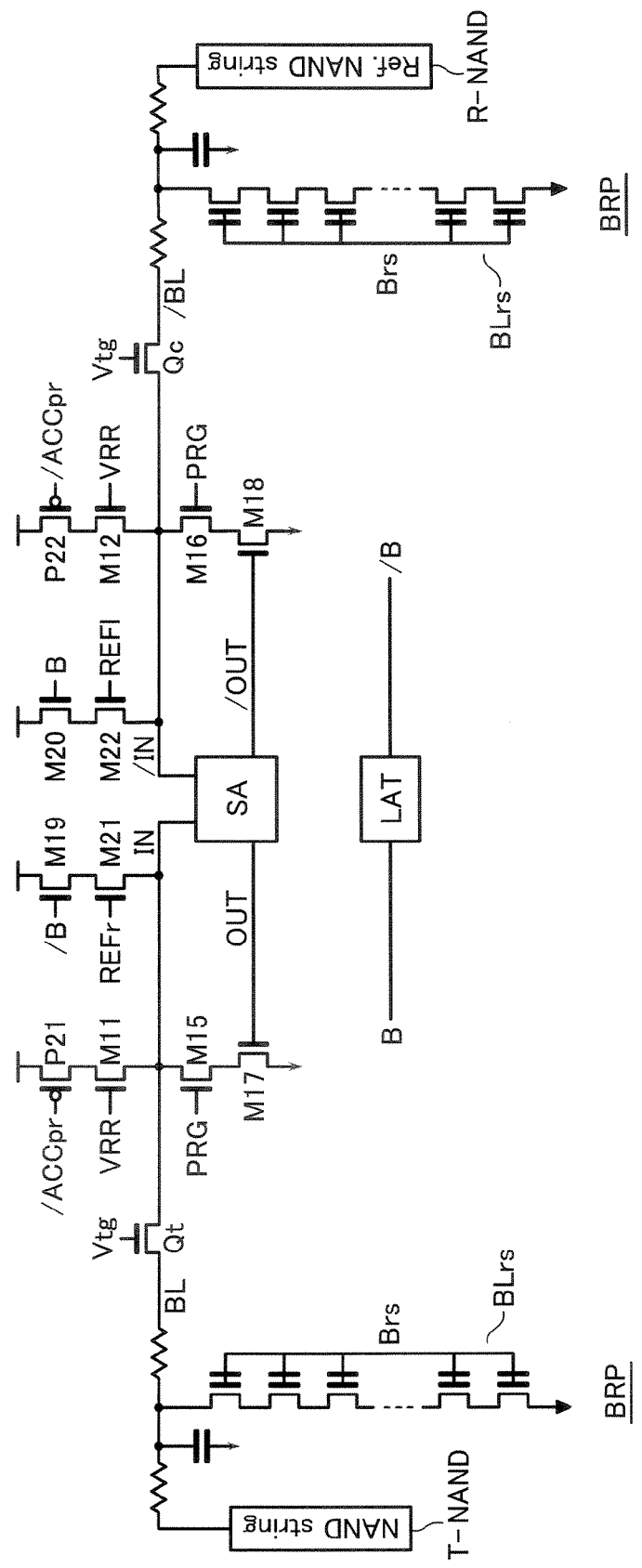
FIG. 26 shows the bit line sense system at the write time.

In consideration of it, there is prepared current sources for bit lines in addition to that of the sense amplifier SA. In FIGS. 24-26, current source PMOS transistors P21 and P22 controlled by the control signal /ACCpr serve as bit line current sources. As shown in FIGS. 24-26, the bit line current sources are disposed near the sense amplifier SA. Current limiting NMOS transistors M11 and M12 controlled by the control signal VRR are also connected in series to the current source PMOS transistors P21 and P22, respectively.

After starting the bit line current supply (timing t10), the sense amplifier SA is set in a waiting state when the cell current reflection on the sense amplifier SA starts (timing t11). Following it, stop the bit line current supply (timing t12), and then activate the sense amplifier SA (timing t13). As described above, the current supply of the sense amplifier and the bit line precharge are overlapped in part in time, cell currents are transferred to the input nodes IN and /IN of the sense amplifier SA without break.

The bit line current is suppressed in receipt of the control signal VRR until the sense amplifier activation. As a result, the sense amplifier current is kept small, so that a small current difference causes a large unbalance in the sense amplifier. Since the bit line precharge may be performed as being overlapped with the word line drive time, it is obtained such an effect that sense time is made short.

By use of the above-described bit line precharge scheme, even if the cell on the bit line end is disturbed with word line rising, the influence is removed before the bit line level is sufficiently boosted and cell current read starts, so that only the cell state is reflected on the sense amplifier at the sense time. To achieve such a high-speed access that sense starts at an early timing during the word line level is changing, it is important to use the above-described time constant. Some cells near the sense amplifier SA will be influenced by disturbance at the beginning of the bit line precharge. However, with respect to such the cell, the signal transmittance to the sense amplifier SA has a small time constant, so that the cell current will be reflected on the sense amplifier in such a state that the disturbance has been removed at the sense time.

Figure 23:
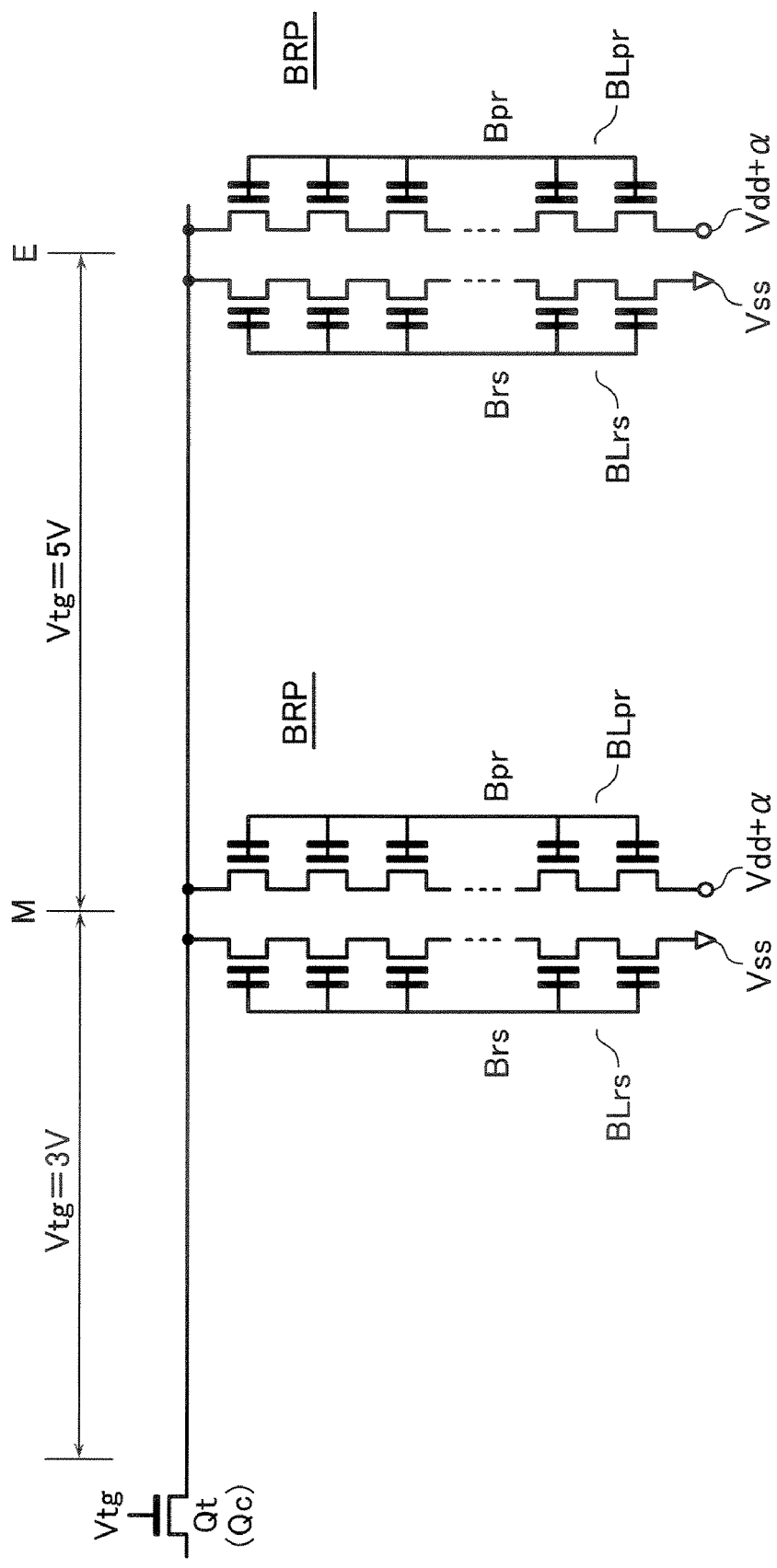
FIG. 23 is a diagram for explaining the bit line reset and precharge operations at the write time.

FIG. 23 shows a method for reducing the variation of sense margin dependent on the location on the bit line BL (or /BL), i.e., cell connecting position. To make the bit density high, it is in need of making the cell array as large as possible. However, the larger the cell array, the longer the bit line coupled to the sense amplifier; and the larger the time constant due to the resistance and capacitance. As a result, it becomes necessary to wait activation of the sense amplifier until cell information reaches the sense amplifier. During the waiting period, it is necessary to supply current to the bit lines, thereby making possible to transmit the cell current difference to the sense amplifier In this case, however, potential level difference on the bit line is large due to the bit line time constant. In consideration of this, the bit line is divided into two parts, and bit line current supply state is made exchangeable between a case where a cell disposed between the sense amplifier SA and the middle point M of the bit line is selected and another case where another cell disposed between the middle point M and the bit line end E is selected.

Explaining in detail, clamping transistor Qt (or Qc) disposed near the sense amplifier SA on the bit line is used. This transistor is high breakdown one, which serves for preventing the sense amplifier SA from being supplied with the high voltage applied to the cell array at an erase time.

In this embodiment, the conductance of the clamp transistor Qt (Qc) is exchanged with the gate voltage Vtg in accordance with the selected cellos position on the bit line, so that the bit line charge state is made constant without regard to the cell position. In detail, for example, to make the bit line potential at the middle point M and that at the end point E substantially equal to each other at the end timing of the bit line precharge period of 70 ns, Vtg=3V is used in a case where a cell disposed between the sense amplifier SA and the middle point M is selected while Vtg=5V is used in another case where another cell disposed between the middle point M and the bit line end E is selected.

By use of the above described method, the same bit line potential circumstances are obtained at both of the former portion and the latter portion of the bit line. As a result, in case of sensing a small cell current, the sense margin may be increased.

Next, with reference to FIG. 23, bit line reset and bit line precharge at a write time will be explained below. As explained with reference to FIGS. 3 and 4, to cancel the bit line history and to precharge non-selected bit lines to a certain high voltage at a write time, there are prepared bit line reset/precharge circuits BRP with the same cell configuration as others in the cell array, which are disposed, for example, at two points, the middle point M and the end point E (refer to FIGS. 3 and 4).

To activate the sense amplifier with a cycle period as short as possible, it is desired that the bit line history of the previous cycle is not remained. Accordingly, during a certain time just after the sense amplifier SA is activated and sensed data is latched, the reset circuits in these bit line reset/precharge circuits BRP are activated to reset the bit line to be Vss from the middle point M and the end point E.

Additionally, at a write time, word lines coupled to non-selected cells are boosted to a high voltage. Therefore, it is effective to make the non-selected bit lines have a high potential, thereby preventing cells from being in such a situation that a high electric field is applied between cell channels and floating gates thereof. For the purpose, the precharge circuits in the bit line reset/precharge circuits BRP are activated to apply Vdd+α to the non-selected bit lines.

Since these reset/precharge circuits are basically formed of the same NAND string structure as the remaining portions in the cell array, the layout area will be little increased.

Next, a normal read operation, erase-verify and write-verify read operations will be explained in detail with reference to the connection relationships between the sense amplifier SA and NAND strings in the cell array.

[Bit Line Sense System at a Normal Read Time]

FIG. 24 shows a bit line sense system at a normal read time. In this example, there is shown a case where an information cell NAND string T-NAND near the end of the bit line BL and a first reference cell NAND string R-NAND near the end of the bit line /BL are selected.

Bit line precharge sources are formed of PMOS transistors P21, P22 controlled with the control signal /ACCpr and current limiting NMOS transistors M11, M12 controlled with the control signal VRR. These are the same as the current passes in the sense amplifier SA.

In an ordinary state, the control signal VRR is set at the same constant level as in the sense amplifier at the initial sense time, for example, at the power supply voltage Vdd or slightly higher than it. When, after the word lines rising, cell current start to flow in the bit lines, the bit lines are coupled to the bit line precharge sources via clamping transistors Qt and Qc.

When the control signal /ACCpr is stepped down, bit line precharge starts. As described above, the level of the control voltage Vtg of the clamping transistors Qt, Qc is determined in accordance with which portions on the bit lines are accessed.

The sense amplifier SA is activated when the cell current of the information cell NAND string T-NAND and that of the reference cell NAND string R-NAND are reflected on the input nodes IN and /IN. Then, the control signal /ACCpr being set at "H", the sense amplifier SA stars to supply bit line current.

Disposed in parallel with the sense amplifier SA is a data latch circuit LAT. The detail of this data latch LAT will be explained later. Output nodes OUT and /OUT of the sense amplifier SA are coupled to nodes B and /B of the data latch LAT via NMOS transistors M13 and M14 controlled with clock CLK.

After finishing the initial sense operation, the control voltage VRR is boosted to a high voltage corresponding to, e.g., read pass voltage Vread. As a result, the sensed data is latched and the clock CLK is boosted simultaneously, so that the sensed data is transferred to the data latch LAT.

After having determined the sensed data, control signal Brs being raised, the reset circuits BLrs in the bit line precharge/reset circuits are activated. As a result, the bit lines BL and /BL are reset at Vss for the next cycle. [Bit Line Sense System at Verify Time of Write Preceding Process]

FIG. 25 shows the bit line sense system used at a verify time with the second reference cell I-cell. That is, this system is adapted to the first erase step, ERASE, in the write preceding process, preliminary write step, ND&RW, for writing the reference data level, and the second erase step, L0W, for writing data level L0.

While the verify-read is not different from the normal read with respect to bit line setting and sense amplifier activation, it is different from the normal read that the second reference cell is used. In FIG. 25, an information cell NAND string T-NAND is selected on the bit line BL side while a second reference cell NAND string I-NAND is selected on the bit line /BL side. When the reference level of first reference cells R-cell is set, a reference cell NAND string R-NAND is selected in place of the information cell NAND string T-NAND.

Since sensed data is not fed-back to the erase operation in both verifies at the erase step, ERASE, and L0 write step, L0W, sense amplifier SA is reset, and bit lines are reset with the signal Brs after verify. By contrast, at the verify time of the preliminary write step, ND&RW, it will be determined for each bit line dependent on the sensed data whether the program is to be continued or not. Therefore, the reset of the sense amplifier is performed after the program completion and before the next verify. After the sense amplifier reset, the signal Brs rises to reset the bit lines.

Prior to the write, the clamp transistors Qt, Qc are turned off once to separate the bit lines BL, /BL from the sense amplifier SA, and the bit lines BL,/BL are precharged to Vdd or a more higher level with the precharge circuit in the bit line reset/precharge circuit BRP. As a result, it will prevent the non-selected bit lines from being programmed.

Raise again the control signal Vtg of the clamp transistors Qt, Qc, and raise simultaneously the signal PRG to turn on the NMOS transistors M15, M16 connected to the input nodes IN, /IN. These transistors are coupled to Vss via MNOS transistors M17, M18, the gates of which are driven by the output nodes OUT, /OUT of the sense amplifier SA.

Therefore, the output state of the sense amplifier SA is fed-back to the input nodes IN and /IN, and selected bit lines are coupled to the sense amplifier SA. As a result, it will be obtained a bit line level, on which the sense amplifier state is reflected. Non-selected bit lines are kept at a floating level of Vdd+α, cells on which are not programmed.

As described above, the second reference cell I-cell is formed with the NAND string structure in the cell array, and the difference between it and the normal cell is set to be as small as possible, so that not only a different kind of structure is not introduced into the cell array but also the cell layout area increasing may be ignored. That is, as similar to the select gate transistors in the normal NAND string, the floating gates and control gates of all cells are coupled directly, and the gate level is set at the reference voltage Vref.

Figure 27:
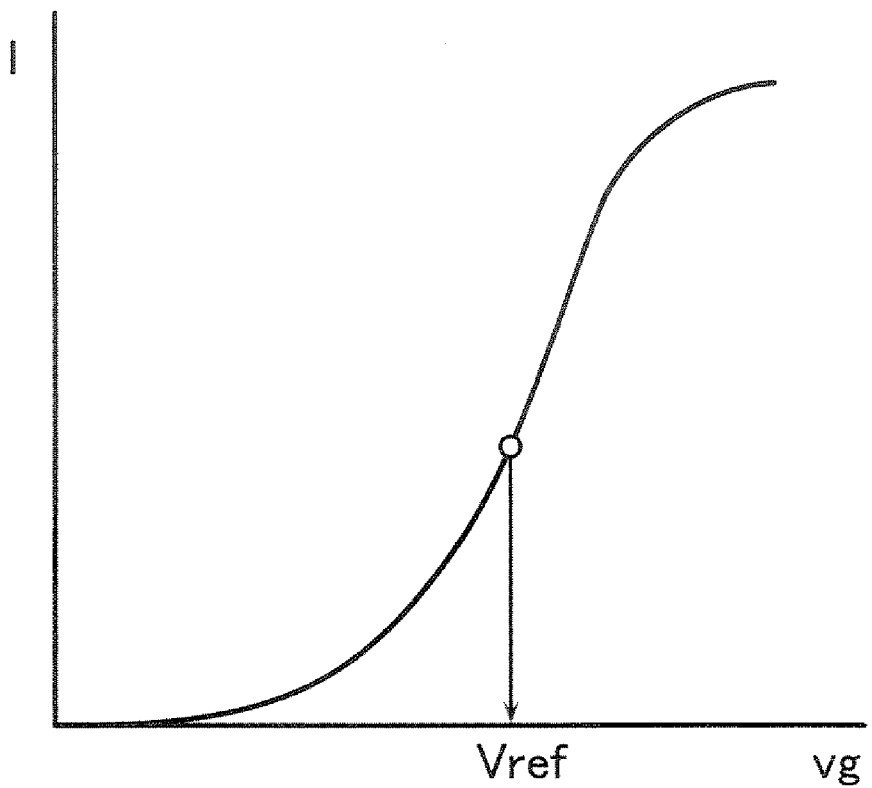
FIG. 27 is a diagram for explaining the reference current setting method of the second reference cell I-cell.

The method of level setting the reference voltage Vref is as follows: as shown in FIG. 27, supposing that the NAND string is one transistor, the level is set to make the change efficiency of the string current I, which is obtained when the gate voltage Vg (=Vref) is changed, maximum. In detail, this is about ⅔ of the level at which the current I is saturated, i.e., a midway level between the bit line level plus Vth and Vth level.

[Bit Line Sense System at L1-L3 Write-Verify Time]

FIG. 26 shows the bit line system at the write-verify time of data levels L1, L2 and L3 with the first reference cell R-cell. In FIG. 26, it is shown such a case where the information cell NAND string T-NAND is selected on the bit line BL side while the reference cell NAND string R-NAND is selected on the bit line /BL side.

The cell write state will be judged based on the levels of the nodes B and /B, which are determined in accordance with the write data held in the data latch, and based on the states of the bit lines BL and /BL, which are determined in accordance with the read data. To feed back the levels of the nodes B and /B to the sense amplifier SA, NMOS transistors M19 and M20, the gates of which are driven by nodes B and /B, and NMOS transistors M21 and M22, the gates of which are driven by signals REFr and REF1, respectively, are disposed between Vdd node and the input nodes IN and /IN of the sense amplifier SA.

REFr and REF1 are signals, which rise when the reference cells, R-cell, are selected on the bit line /BL and BL sides, respectively, in accordance with the selected address. The feed-back of the nodes B and /B is performed as follows.

In case the information cell T-cell is selected on the bit line BL side, the signal REFr rises. At this time, if the node /B is "H", transistors M19 and M21 are on, so that the bit line BL is supplied with Vdd current without regard to the cell data, and is set to be in a "0" state as a result of that the cell current is made small in appearance, whereby the output node OUT of the sense amplifier SA is set to be "L".

In case the node /B is "L", the data of the data latch LAT does not affect the sense amplifier SA, so that the sense amplifier SA compares the cell currents between the bit lines BL and /BL. If cell current of the bit line BL is larger than that of the bit line /BL (i.e., cell data is "1"), the node OUT becomes "L".

The sensed result is fed-back to the bit lines with the signal PRG="H"; the bit line BL is set at Vss; and write is performed with the write voltage Vpgm applied to the selected word line, the selected information cell's threshold voltage is increased. Thereafter, reset the sense amplifier SA, and verify the same cell data. If the cell current on the bit line BL becomes smaller than the reference current of the bit line /BL, it shows that "0" write of the selected cell is sufficient, and the write sequence of the information cell will be completed.

Note here that since one of the bit line pairs is coupled to the sense amplifier SA, it is necessary to prevent the cells on non-selected bit lines from being programmed. Therefore, the clamp transistors Qt, Qc are turned off after verify sensing to separate the bit lines from the sense amplifier SA, and the bit lines are precharged to Vdd+α with the precharge circuit in the bit line reset/precharge circuit BRP. Then, a selected bit line BL only is coupled again to the sense amplifier SA, and set at a bit line level with the signal PRG in accordance with the verify result, and program will be performed.

With respect to bit line BL, the floating state of Vdd+α is kept in every states of: the node /B of the data latch LAT is "H"; write completion; and non-selected state. In this case, write is not performed even if the write voltage Vpgm is applied to the word line.

[Sense Unit/Verify-Check Circuit]

Figure 28:
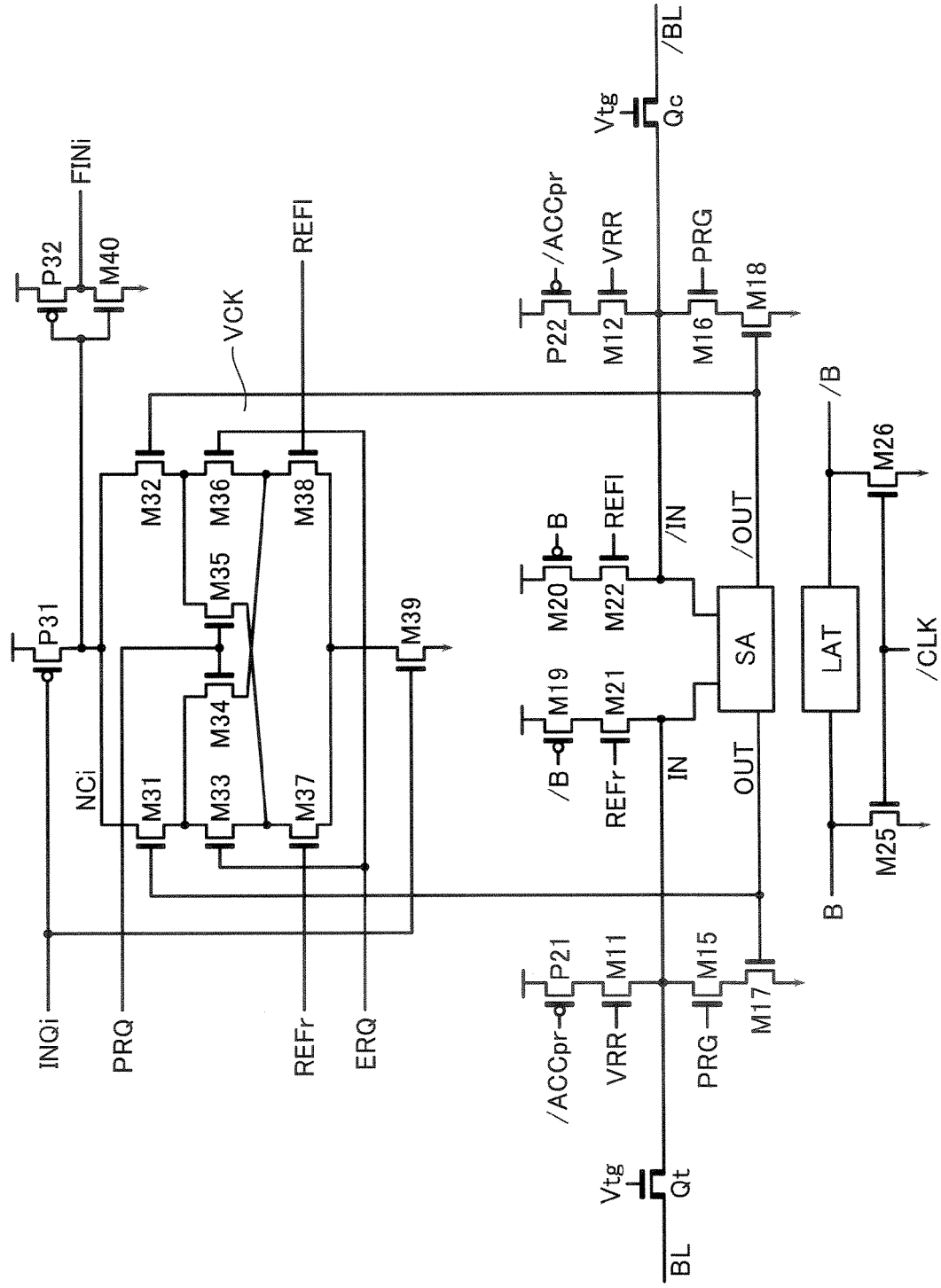
FIG. 28 shows the sense unit configuration including sense amplifier SA, data latch circuit LAT and verify-check circuit VCK.

FIG. 28 shows the sense unit 31 including the sense amplifier SA, data latch circuit LAT and verify-check circuit VCK.

Circuit portions for verifying, which relate to setting the bit line periphery, are shown at the lower half in FIG. 28. At a verify time when the first reference cell R-cell is used, the state of a pair of bit lines BL and /BL is set in accordance with the data of the nodes B and /B. At anther verify time when the second reference cell I-cell is used, data of the latch circuit LAT is not used. Therefore, the signal /CLK is set at "H", and the nodes B and /B are set at Vss via NMOS transistors M25 and M26, so that even if signals REFr or REF1 rises, it does not affect the bit line.

In addition, at a read time, in order that the state of nodes B and /B does not affect the bit line sensing, the signal /CLK, which is reversed to signal CLK used for coupling the output nodes OUT and /OUT to the nodes B and /B, respectively, is raised to set the nodes B and /B at Vss. After sense decision, the signal CLK is raised, and the levels of the nodes B and /B are shifted to reinforce the bit line potential.

At a write time, signal PRG is set at "H", so that one of the bit lines is set at Vss in accordance with sense amplifier outputs OUT and /OUT, whereby it is fed-back whether the selected cell's write is to be continued or not.

Verify-check circuit VCK shown at the upper half portion in FIG. 28 is a judge circuit used for verify-erase and verify-write. Since expectance data states at the erase-verify time and the write-verify time are different from each other, the same system is not used for them. That is, the erase-verify is for verifying that the cell's threshold voltage has been sufficiently lowered while the write-verify is for verifying that the cell's threshold voltage has been boosted to a certain level.

In detail, at the verify-erase time, the erase completion is detected when the sense output node OUT is set at "H" based on the cell on the bit line BL side (i.e., REFr="H"), or the sense output node /OUT is set at "H" based on the cell on the bit line /BL (i.e., REF1="H"). At the verify-write time, the detected when /OUT becomes "H" based on the cell on the bit line BL side (i.e., REFr="H"), or OUT becomes "H" based on the cell on the bit line /BL side (i.e., REF1="H").

To do the above-described verify-judgment, four current passages are formed between PMOS transistor P31 and NMOS transistor M39, which are controlled with a check signal INQi, to constitute comparison circuits as follows.

A first current passage including NMOS transistors M31 and M37 for taking AND logic between OUT and REFr; a second current passage including NMOS transistors M31 and M38 for taking AND logic between OUT and REF1; a third current passage including NMOS transistors M32 and M38 for taking AND logic between /OUT and REF1; and a fourth current passage including NMOS transistors M32 and M37 for taking AND logic between /OUT and REFr.

To exchange these current passages, NMOS transistors M33 and M36 are inserted in the first and third current passages, respectively, and NMOS transistors M34 and M35 are inserted in the second and fourth current passages, respectively. The transistors M33 and M36 are driven by check signal ERQ, which becomes "H" at the verify-erase judgment time while transistors M34 and M35 are driven by check signal PRQ, which becomes "H" at the verify-write judgment time. That is, the first and third current passages (i.e., comparison circuits) are activated at verify-erase judgment time while the second and fourth current passages (i.e., comparison circuits) are activated at verify-write judgment time.

Drain node NCi of PMOS transistor P31, the source of which is coupled to Vdd, is charged-up to an "H" level (=Vdd) during INQi="L". When INQi="H" is input, and verify-read data is identical with the expectance value, the node NCi is discharged to be an "L" level. In response to this "L" level transition of the node NCi, inverter 321 outputs FINi="H".

Figure 29:
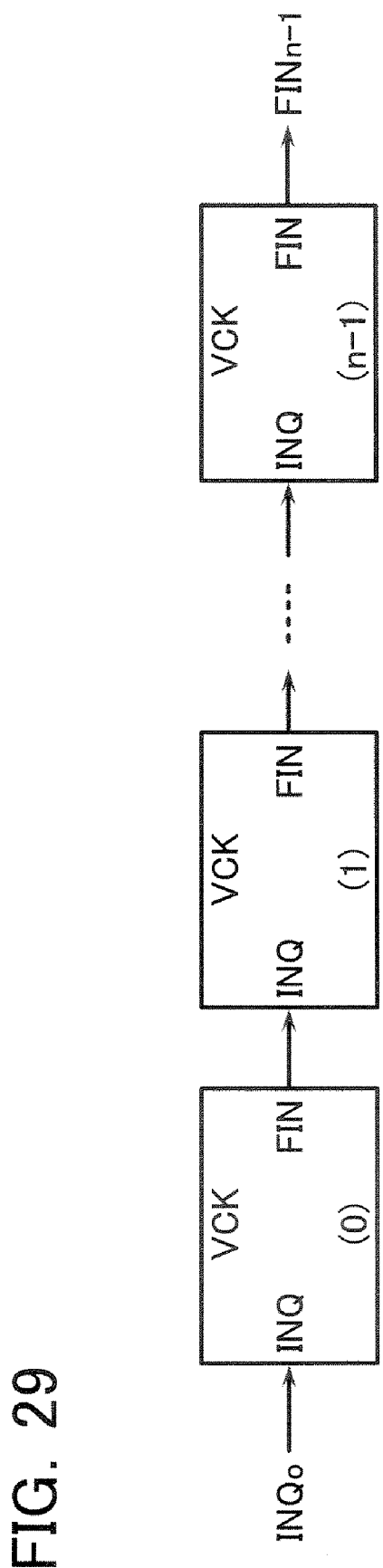
FIG. 29 shows the connection state of the verify-check circuit.

As shown in FIG. 29, the verify-check circuits VCKi in the entire sense units, which serve for simultaneously reading one page data, are sequentially coupled in such a manner of "domino theory" that a check output FINi of a stage becomes a check input INQi+1 of the following stage. At a verify-check time, check input INQ0="H" is input to the first stage verify-check circuit VCK0. When FINn−1="H" is generated, it is detected that all write or erase cells have been set to be expectance data.

[Configuration and Operation of Data Latch Circuit LAT]

Figure 30:
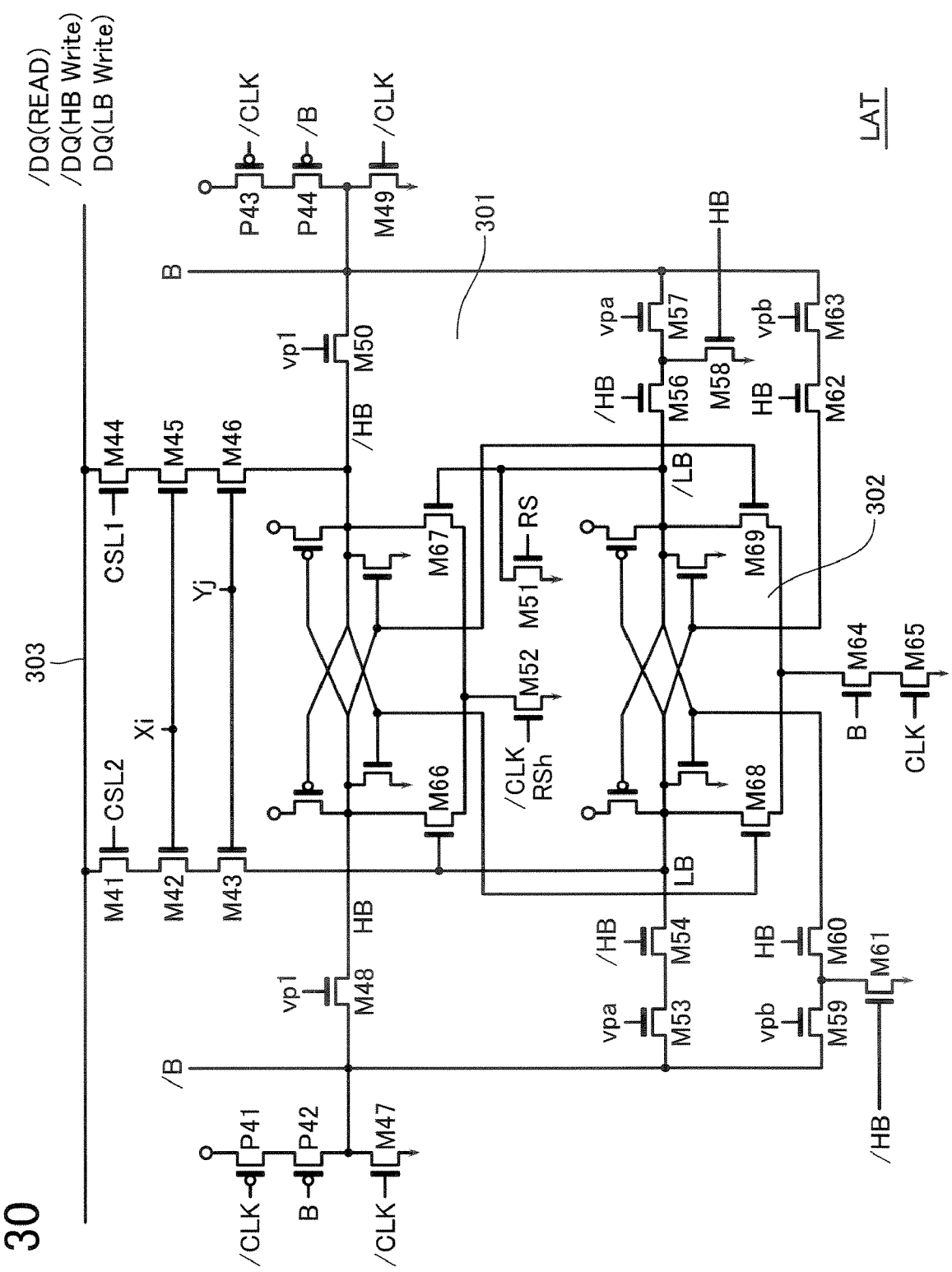
FIG. 30 shows the data latch circuit LAT.

FIG. 30 shows the detailed configuration of the data latch circuit LAT, which is used for loading write data and transferring read data bits to the data line. The circuit LAT has two latches 301 and 302, which are used in common for data write and read.

At a write time, the upper latch 301 stores the upper bit (HB) while the lower latch 302 stores the lower bit (LB). To judge even/odd at a read time as described above, latches 301 and 302 serve as a shift register controlled by clocks CLK and /CLK.

The final read data is stored in the upper latch 301. In case data read is inserted to interrupt the write sequence, if the higher bit write has been finished in the suspended write sequence, it is possible to read out the higher bit from the cell array and store it in the upper latch 301.

To decrease the number of wirings, data line 303 disposed between the data latch LAT and the I/O buffer is formed as a single wiring. Data latch LAT is set in an initial state, and when data transferred from the data line 303 is different from the initialized state of the latch LAT, the latched data will be inverted. In detail, the data line 303 serves as data line /DQ for the upper latch 301 storing the upper bit, and serves as complementary data line /DQ for the lower latch 302 storing the lower bit. Therefore, the externally supplied data will be reversed in logic in accordance with the higher or lower bit.

Multiple data latches share the data line 303. In accordance with select signals CSL1, CSL2, Xi and Yj based on address data, it is selected which data latch 301 or 302 is coupled to data line 303.

The detailed configuration and operation of the data latch circuit LAT will be explained below with relation to some operation modes.

(Data Latch LAT in the Read Mode)

Figure 31:
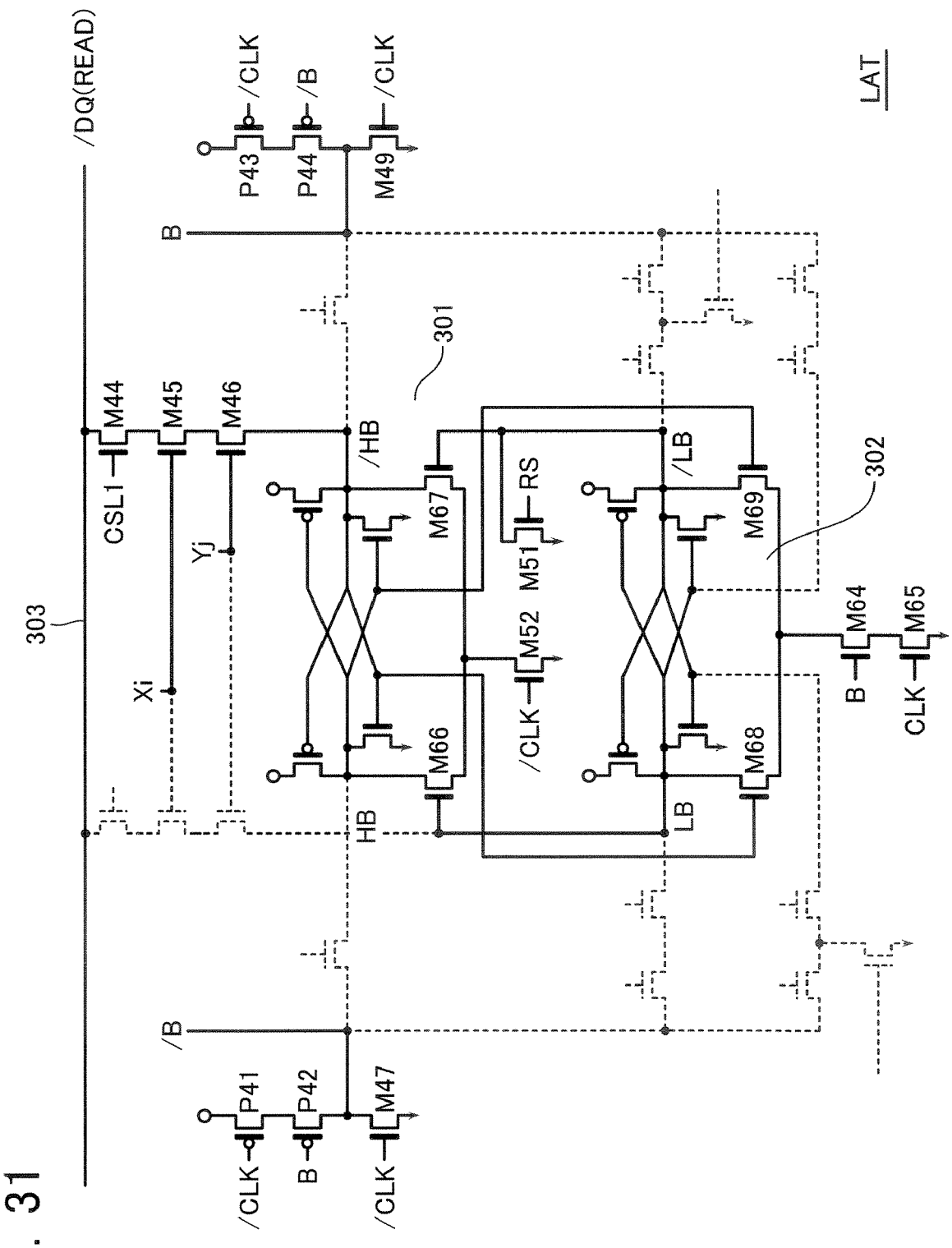
FIG. 31 shows the connection state of the data latch circuit at the read time.

FIG. 31 shows the data latch circuit LAT in the read mode, in which the connection states are shown with solid lines. The sources of NMOS transistors M66 and M67, which are coupled to the nodes HB and /HB of the upper side latch 301, respectively, are coupled in common to the drain of NMOS transistor M52, the gate of which is driven by clock /CLK, and gates thereof are coupled to the node LB and /LB of the lower side latch 302, respectively.

The sources of NMOS transistors M68 and M69, which are coupled to the nodes LB and /LB of the lower side latch 302, respectively, are coupled in common to serially connected NMOS transistors M64 and M65, the gates of which are driven by node B and clock CLK, respectively, and gates thereof are coupled to the node /HB and HB of the higher side latch 301, respectively. Therefore, at a cell data read time, latches 301 and 302 constitute a 2-bit shift register, which is driven by clock CLK and node B.

Data read is, as described above, performed in such a way that HB data is read with one cycle of T2; and LB data with two cycles of T1 and T3. In these data read cycles, clocks CLK and /CLK are generated as shown in FIG. 32.

In every cases, bit information will be obtained based on the evenness/oddness of the number of "1" data at the node B, which is transferred from the sense amplifier SA. That is, at a data sense time, data of the node B is input to the gate of NMOS transistor M64 in the lower side latch 302.

Explained in detail, in a waiting period of data transfer from the sense amplifier SA, clock signals are as follows: CLK="L"; and /CLK="H". Therefore, the nodes B and /B are set at Vss via NMOS transistors M47 and M48. Data latch LAT is initialized with the reset signal RS="H" in such a state that "1" is set in the lower side latch 302 (i.e., LB= "H", /LB="L"), and in response to this, "0" is set in the higher side latch 301 (i.e., HB="L", /HB="H").

When the clock becomes "H", sensed data of the sense amplifier SA are input to the nodes B and /B (refer to FIG. 24). Connected to the nodes LB and /LB of the lower side latch 302 are serially connected NMOS transistors M64 and M65, which take AND logic between data node B and clock CLK. In case of CLK="H" and B="H", data in the lower side latch 302 is inverted to "0", and it will be reversed and transferred to the higher side latch 301 when clock CLK returns to "L", so that "1" is set in the higher side latch 301.

In accordance with the above-described operation, if the number of data "1" at the node B transferred from sense amplifier SA is odd, the higher side latch 301 stores "1" while if the number of data "1" is even, the higher side latch 301 stores "0". The final data in the higher side latch 301 is dealt with read data of the one cycle HB sense and the LB sense with two cycles. Data in the higher side latch 301 is transferred to the data line 303 (/DQ) with selection signals CSL1, Xi and Yj, whereby cells bit data will be output.

(Data Latch LAT in the Write Mode)

Figure 33:
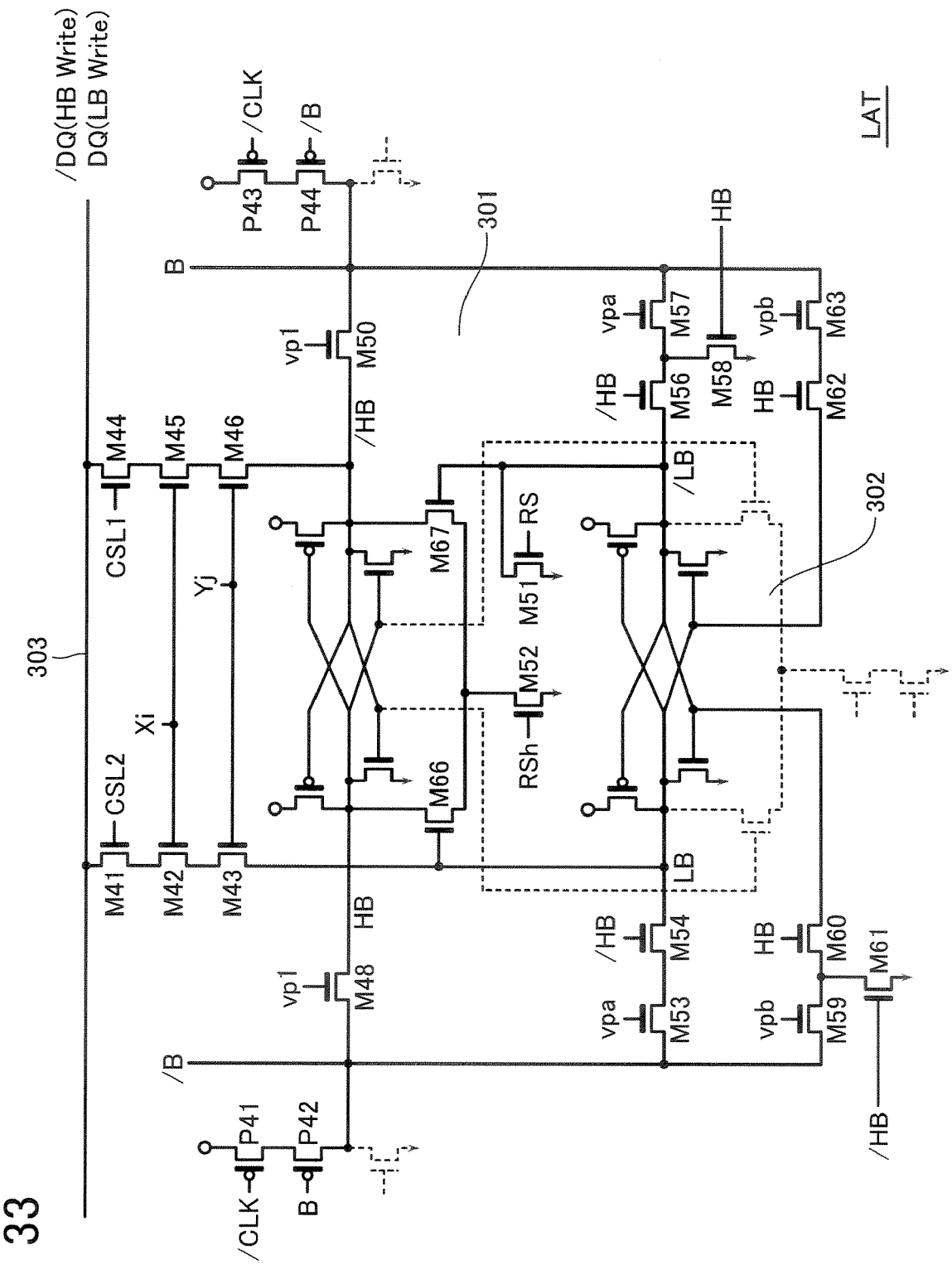
FIG. 33 shows the connection state of the data latch circuit at the write time.

FIG. 33 shows the data latch circuit LAT in the write mode, in which the connection states are shown with solid lines.

At the write-verify time, the upper bit and lower bit data are to be set in the latches 301 and 302, respectively. The initial state of these latches prior to data loading is set by use of NMOS transistor M51 as similar to that in the read mode. With respect to the upper side latch 301, reset signal RSh is input to NMOS transistor M52. That is, signals RS and RSh are set at "H" at a time, the lower side latch 302 is set to be "1"; and the higher side latch 301 "0".

To read data written in the cell array and store it in the latch 301 as write data, only latch 302 is reset, into which the lower bit data will be set externally. To reset only the lower side latch 302, only the signal RS is set to be "H". Another reset signal RSh being kept at "L", the reset operation of the lower side latch 302 does not affect the data state of the upper side latch 301.

External write data loading is, with respect to the upper bit data, performed via NMOS transistors M44, M45 and M46 disposed between the data line 303 and the node /HB, which are driven with CSL1, Xi and Yj, respectively. In case of /DQ="L", the node /HB of the latch 301 is discharged, and the upper bit write data will be loaded.

The lower bit data loading is performed via NMOS transistors M41, M42 and M43 disposed between the data line 303 and the node LB of the lower side latch 302, which are driven with CSL2, Xi and Yj, respectively. In case of DQ="L", the node LB of the latch 302 is discharged, and the lower bit write data will be loaded.

In accordance with write data stored in the latch LAT, "H" and "L" at nodes B and /B are set at every write steps vp1, vp2 and vp3. For the purpose, transfer NMOS transistors M48 and M50 are disposed between the nodes HB, /HB of latch 301 and nodes /B and B, respectively, which are driven by signal "vp1" corresponding to the step vp1.

Similarly, transfer NMOS transistors M53 and M54 are disposed between the node LB of latch 302 and node /B; transfer NMOS transistors M56 and M57 between the node /LB of latch 302 and node B; transfer NMOS transistors M62 and M63 between the node LB and node B; and transfer NMOS transistors M59 and M60 between the node /LB and node /B.

These transfer transistors are driven with signals "vpa" and "vpb" corresponding to the steps vp1 and vp3, and data stored in latch 301. Further disposed at the nodes B and /B are PMOS transistors (P41, P42) and (P43, P44), which serve for pulling-up the nodes B and /B with AND logic between clock /CLK and node B and /B.

Next, the data latch operation at a write time will be explained in detail with respect to a state where T-cell array on the bit line BL side is selected.

Step vp1:

This step is for writing the upper bit data level L2, i.e., "0" write in the T-cell array; and "1" write in C-cell array. In accordance with signal vp1="H", data at nodes HB and /HB of the latch 301 are transferred to nodes /B and B, respectively.

Step vp2:

This step is for writing the lower bit data from data level L2 to data level L3, i.e., for deciding data level L2=(0,1) and L3=(0,0) on the T-cell array.

At this time, if signal vpa="H", and data in latch 301 is "0" (i.e., /HB="H"), data of the latch 301 are transferred to nodes B and /B via transfer transistors M53, M54, M56 and M57. By contrast, in case data latch 301 is "1" (HB="H"), NMOS transistor M58 is turned on, so that node B is set at "L"; and node /B at "H". Data "1" of latch 301 (i.e., HB="H") means "write inhibit". At this time, the bit line BL is forcedly supplied with current, and it will be dealt with write completion.

Step vp3:

This step is for writing the lower bit data from data level L0 to data level L1 with signal vpb="H", i.e., for deciding data (HB, LB)=(1,0) and (1,1) on the T-cell array.

If data in latch 301 is "1", data of the latch 302 are transferred to nodes B and /B via transfer transistors M59, M60, M62 and M63. By contrast, in case data latch 301 is "0" (HB="L"), NMOS transistor M61 is turned on, so that node /B is set at "L"; and node B at "H". Since data of HB="0" has already been written, sensing cell current with node /B="L", write completion is detected, and write will not be progressed more.

With respect to another cell array, C-cell array, on the bit line /BL side, the upper bit HB is reversed. Therefore, signal vpb is set "H" at step vp2; and signal vpa is set at "H" at step vp3.

FIG. 34 shows the write states of the upper bit data HB and lower bit data LB written through the above-described write steps. In FIG. 34, determined bit data are shown with bold strokes. In T-cell array write (T), signals vpa and vpb are set at "H" at steps vp2 and vp3, respectively; and in C-cell array write (C), signals vpb and vpa are set at "H" at steps vp2 and vp3, respectively.

[High-Speed NAND Flash Memory]

Next, an example of a high-speed and multi-level NAND flash memory will be explained in detail below.

(Memory Cell Array & Sense Amplifier Circuit)

Figure 35:
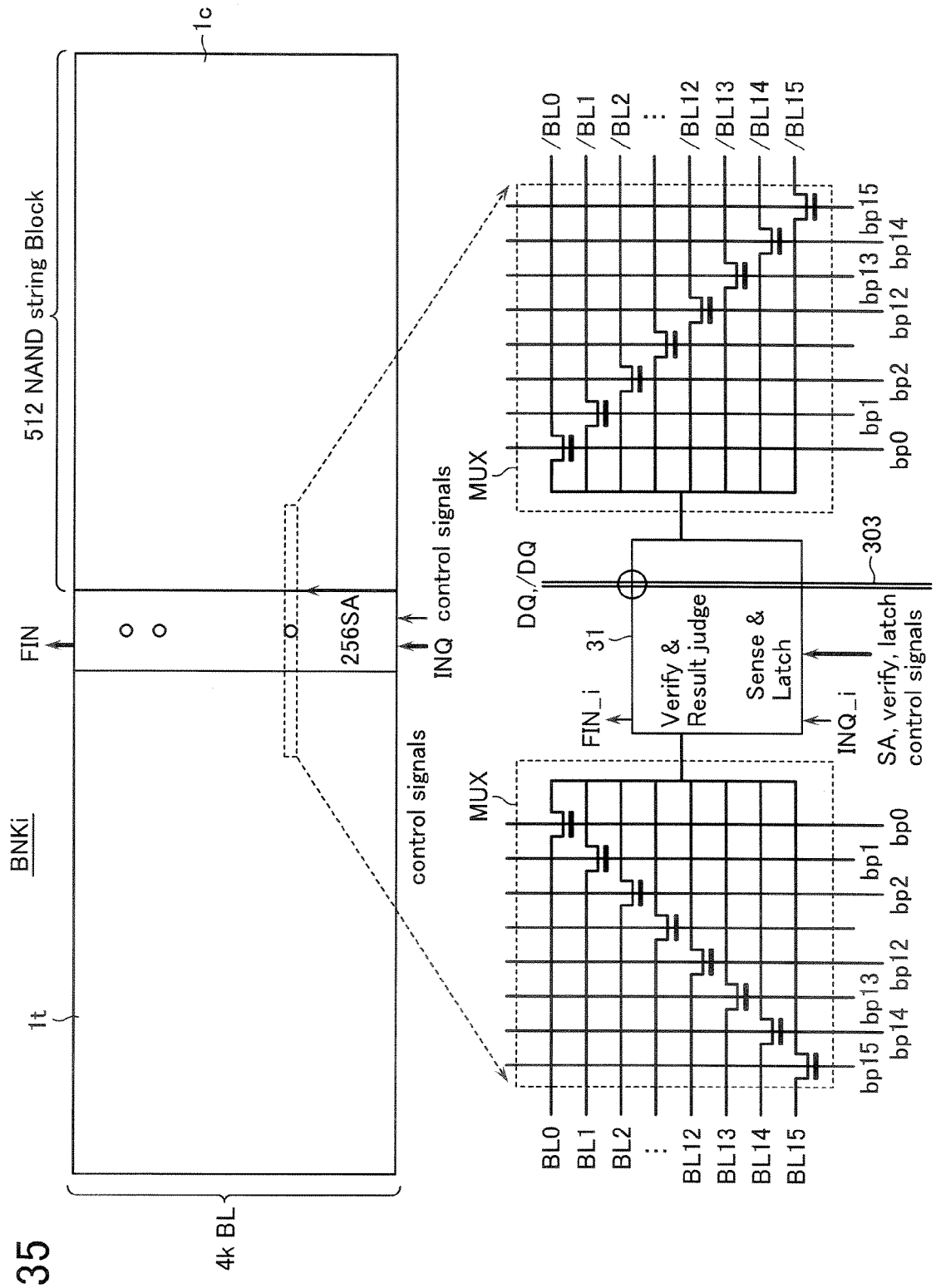
FIG. 35 shows the memory cell array and sense amplifier configuration in a page bank.

FIG. 35 shows the memory cell array and sense amplifier circuit of the high-speed NAND flash memory. It is the same as described above that T-cell array 1t and C-cell array 1c are disposed to sandwich the sense amplifier circuit. In detail, for example, each of T-cell array 1t and C-cell array 1c has 4k-bit lines, to each of which 512-information NAND cell strings (T-cell NAND and C-cell NAND) are coupled, one NAND string including 32-cells.

Supposing that sense unit 31 is disposed for 16-bit line pairs (i.e., 16-bit line pairs share a sense unit 31), 256-sense units 31 are prepared for these cell arrays 1t and 1c. An area of cell arrays 1t and 1c, in which 256-sense units 31 are activated at a time, is defined as a page bank BNKi.

Page bank BNKi has 16-data lines 303, each of which serves as data lines DQ and /DQ. Via these data lines 303, data will be transferred between data latch circuit in the sense unit 31 and the external.

If necessary, there are prepared multiple page banks. As a result, it becomes possible to interleave between banks, thereby continuously accessing page banks.

The relationship between one sense unit 31 and bit lines in a bank BNKi is shown in an enlarged portion shown at the bottom portion in FIG. 35. BLx and /BLx (x=0~15) are bit line pairs, and these 16-bit line pairs share a sense unit 31. As described above, a plurality of NAND strings are coupled to each bit line. It may be optionally selected and fixed that which is selected as the first reference cell NAND string, R-NAND, within multiple NAND strings coupled to each bit line. The second reference cell NAND string, I-NAND, is formed at a predetermined position in a cell array.

Which is selected in the 16-bit line pairs to be coupled to the sense unit 31 is defined by a bit line select circuit (multiplexer) MUX. In accordance with select signals bp0-bp15, one bit line pair will be selected. The select signals bp0-bp15 are part of address signal and serves as a part of page select address in a main page address (principal page address).

The sense unit 31 includes, as explained in FIG. 28, sense amplifier SA, verify-check circuit VCK and data latch circuit LAT. Various control signals are input to the sense unit 31. To judge the verify result, signal INQi is input to the sense unit 31, and signal FINi is output from it. As described above, the output signal FINi serves as input signal INQi+1 of the following sense unit 31. When write or erase has been completed as a whole in the write mode or erase mode, the final judgment signal FIN="H" will be output from the page bank.

Selectively coupled to the data latch circuit LAT in the sense unit 31 is the global data line 303, which has a function of data lines DQ and /DQ. Between 16-data lines 303 and 16-sense units 31, data are transferred in parallel at a time.

(Address Structure)

Figure 36:
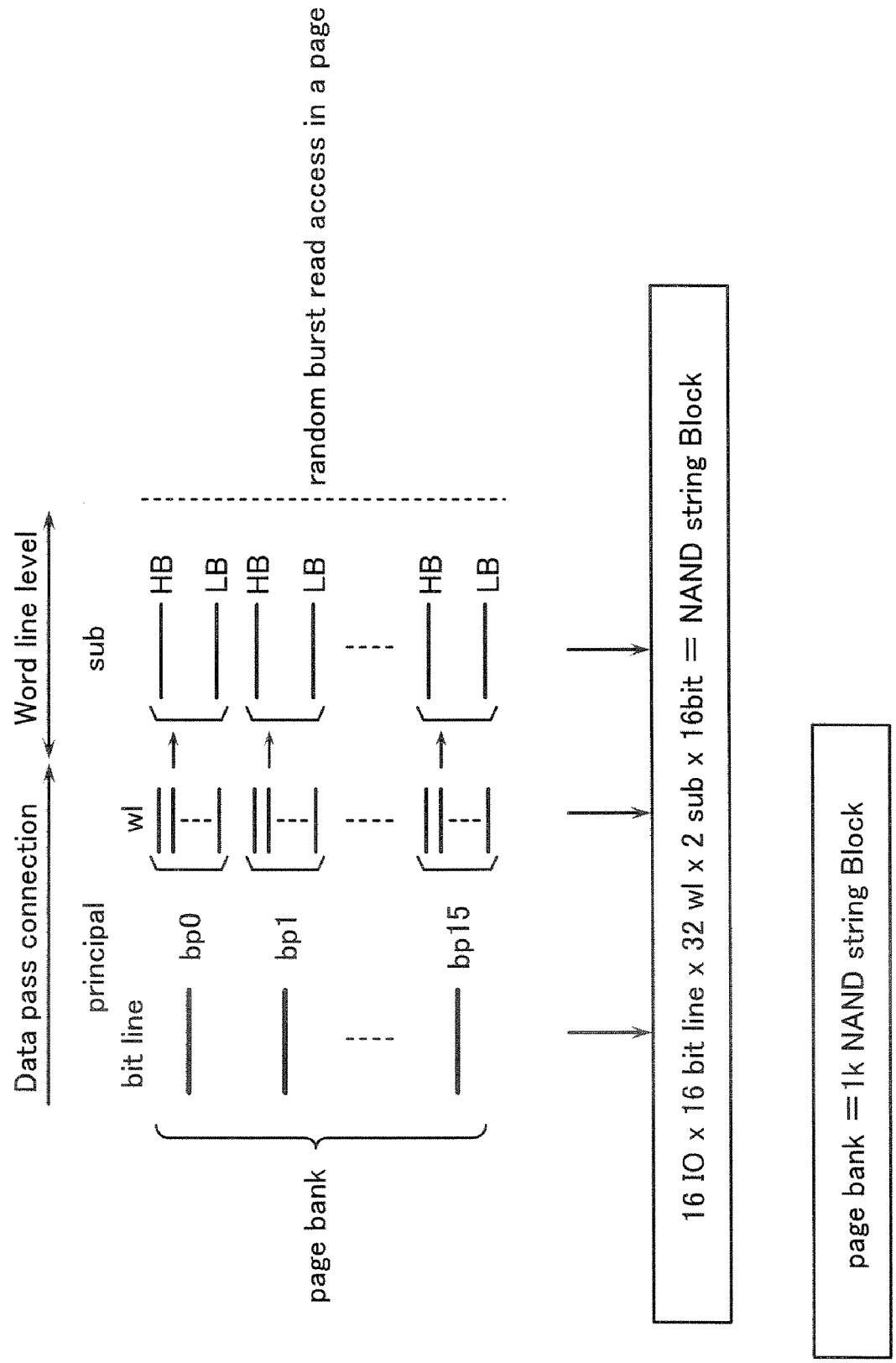
FIG. 36 shows the page address structure of a page bank.

A "page" constituting the page bank BNKi will be explained below. In the page bank BNKi, as shown in FIG. 3, data erase is performed by a NAND string block, and write and read each is performed by a page. The page designation address structure is as shown in FIG. 36.

A page includes a data pass connecting portion for defining what information cell is to be connected to a sense unit and a word line level portion for defining how to set the level of a selected word line.

The data pass connecting portion is a main page address portion (i.e., principal page address portion) including a bit line select address portion, which determines which one in 16-bit line pairs in a bank is to be connected to the sense amplifier, and a word line select address portion, which designates a word line for selecting NAND strings and cells therein.

The word line level portion is a sub-page address portion, which designates the word line TWL of T-cell side or CWL of C-cell side, thereby designating two bits, i.e., the upper bit HB and lower bit LB in the four-level data.

At a data read time, cell data of 256-bit lines are accessed simultaneously and read out to the sense amplifiers. These sense amplifier data will be output as burst signals through random accessing for every 16-bits. In this case, it is possible to do such a bank-interleave operation that a page data is output during another page data is read out. As a result, it becomes possible to perform burst data transferring without breaking.

In FIG. 36, an example of the bank configuration is shown as a numerical value one. A NAND string block is formed of 4k-NAND strings each having 32-cells. The range of data read, in which read data are transferred and output at a time, is defined by 16-IOs, each of which is formed of main page address and sub-page address. 16 (bit lines)×32 (word lines)×2 (sub)=1k-pages, and 1-page=16-bits. In the page bank, there are 1k-information cell NAND strings on the both sides of the sense amplifier.

(1 G-Bit NAND Flash Memory and Access Mode Thereof)

The configuration and access method of 1 G-bit NAND flash memory with four 256M-bit page banks will be explained below with reference to FIGS. 37 to 39.

Figure 37:
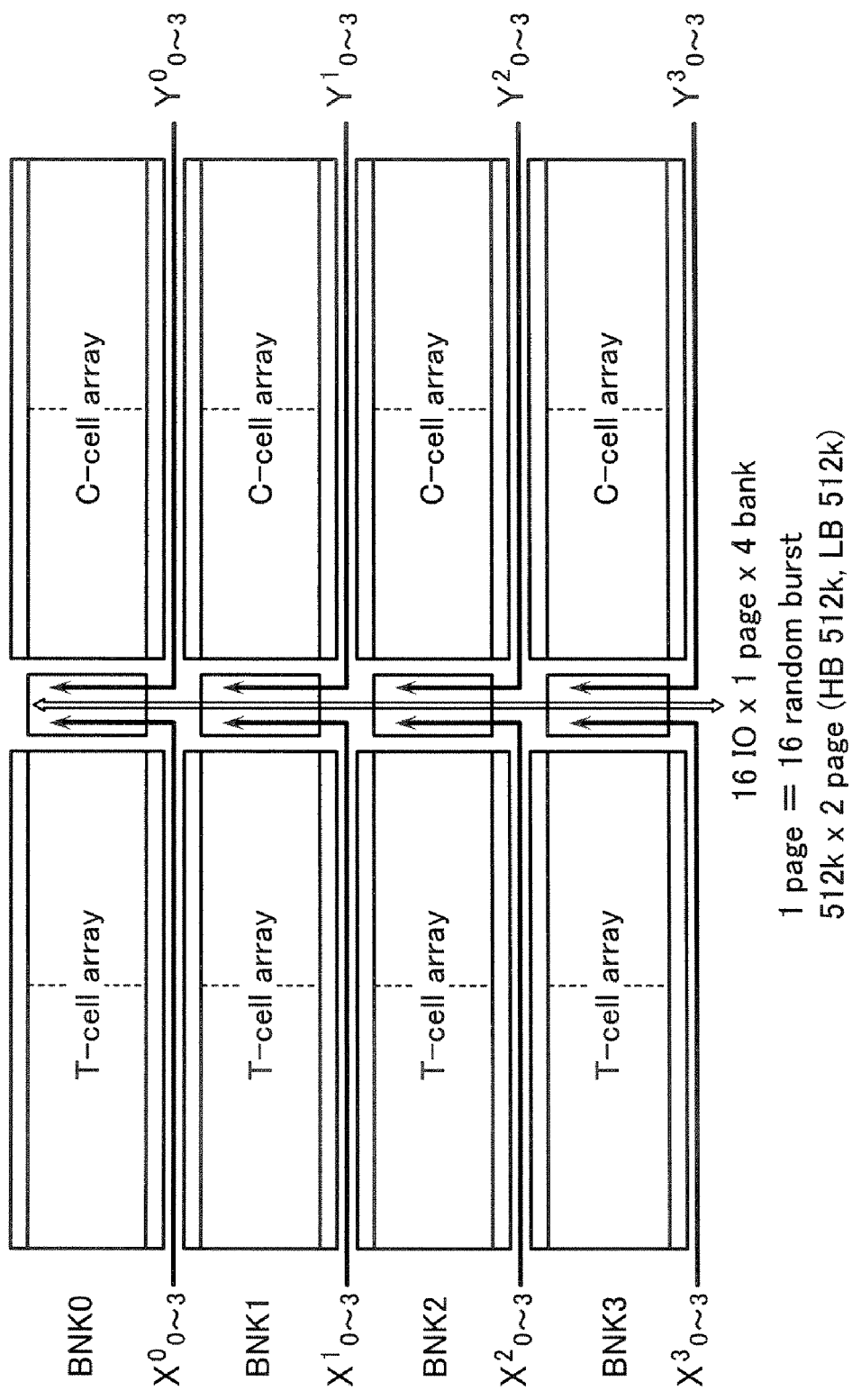
FIG. 37 shows memory cell array arrangement in 1 G-bit memory.

FIG. 37 shows four banks BNK0-BNK3, each of which has two cell arrays, T-cell array and C-cell array, with a sense amplifier circuit sandwiched therebetween. While page addresses of the banks are set independently of each other, address will be generated in common to all banks in this embodiment, and it is assigned to the respective page banks through designating which page address is to be adapted to which page bank. That is, interleaving between page banks, the page address is used in common.

To select each bit in a page length (=16 bits) shared by 16IO of each page bank, the combination of signals $X^i_m$ and $Y^i_n$ is used. Each of these signals $X^i_m$ and $Y^i_n$ are four signals corresponding to the respective page banks, which are predecoded ones of address 2-bits. Based on the combination of these signals $X^i_m$ and $Y^i_n$, one in 16-bits is selected for each page bank and transferred to the data line (IO). i=0~3 correspond to page banks BNK0~3, respectively, and each of m(=0~3) and n(=0~3) designate four signals.

While the signals $X^i_m$ and $Y^i_n$ are, in FIG. 37, input sense amplifier from the left side cell array (T-cell array) and the right side cell array (C-cell array), respectively, this is a result of considering that the signal lines are equalized in layout, and there are not other specific reasons.

The page length is such a data length that may be read out with one time address setting and sensing, and it is the longest data length for a page bank. In the 1 G-bit memory with four page banks, one page is constituted by random 16 bits. The number of pages is half and half in the upper bit HB and lower bit LB, and it becomes 512 k-pages for a page bank.

Supposing that the random burst cycle is 30 ns, the whole 1 G-bit memory may be read out by use of bank-interleave at a transmission rate of 66 MB/s. In this case, page address may be changed for each 16-bit burst. In a complete random access scheme, in which page is changed for each cycle in a page bank, the upper bit read is performed at 13 MB/s; and the lower bit read at 7 MB/s, because the sense amplifier activation cycle is about 150 ns.

Figure 38:
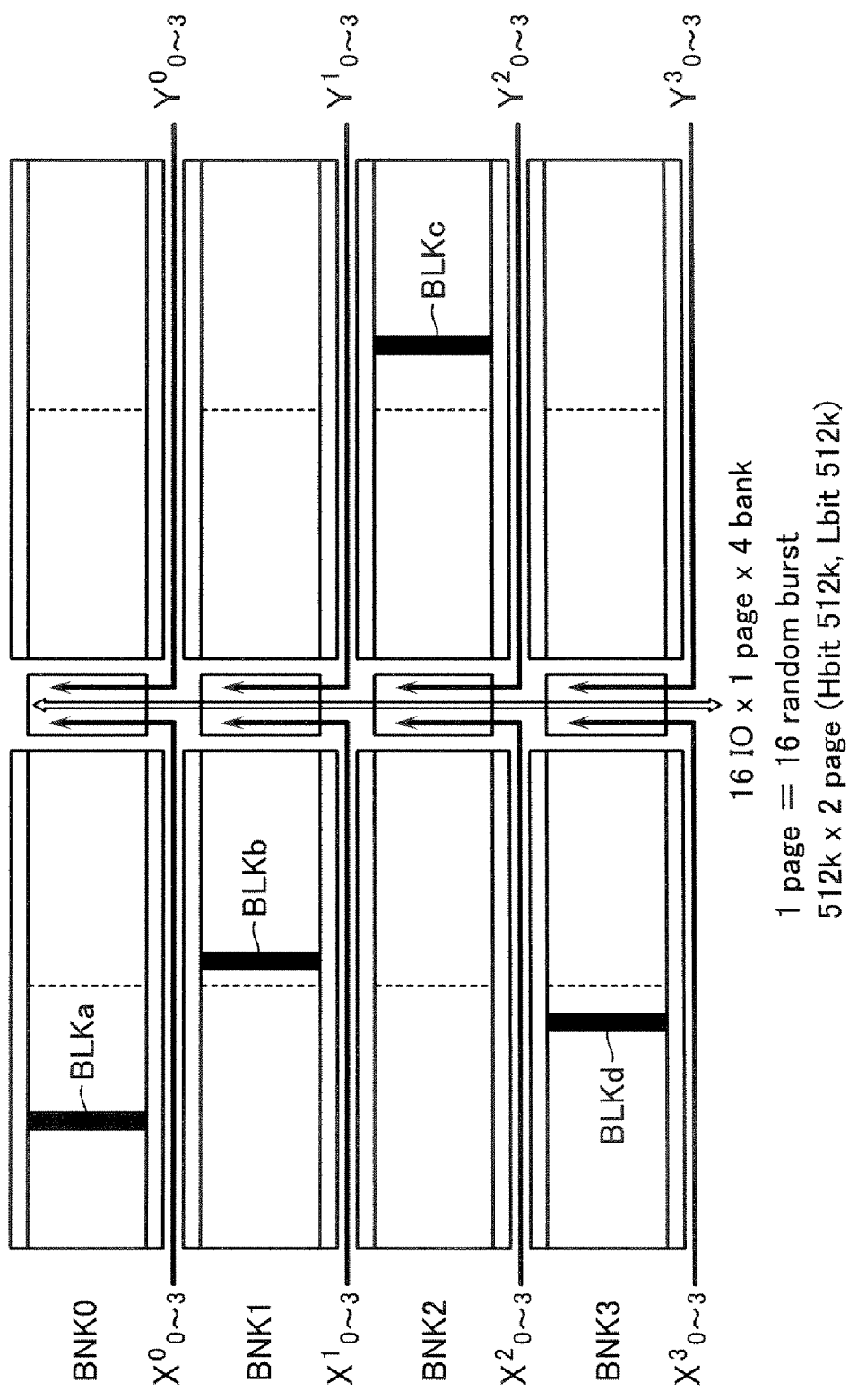
FIG. 38 is a diagram for explaining the bank-interleave access method of the memory.

FIG. 38 shows the read access state based on the bank interleave. For example, while bank BNK0 is selected to be subjected to random burst read, page address is changed and the sense amplifier is activated in bank BNK1. While bank BNK1 is subjected to random burst read, page address is changed and the sense amplifier is activated in bank BNK2. As a result of the above-described access repeat, it becomes possible to achieve such a data read method with a high freedom of access that blocks BLKa~BLKd in the page banks BNK0-BNK3 may be optionally selected and read out without any gap.

In case of data write or erase, it is necessary that that the collective operation is completed in each bank. Therefore, in case a range overlapped to multiple pages is processed, the number of operations will be increased, but the freedom of access will also be increased.

Figure 39:
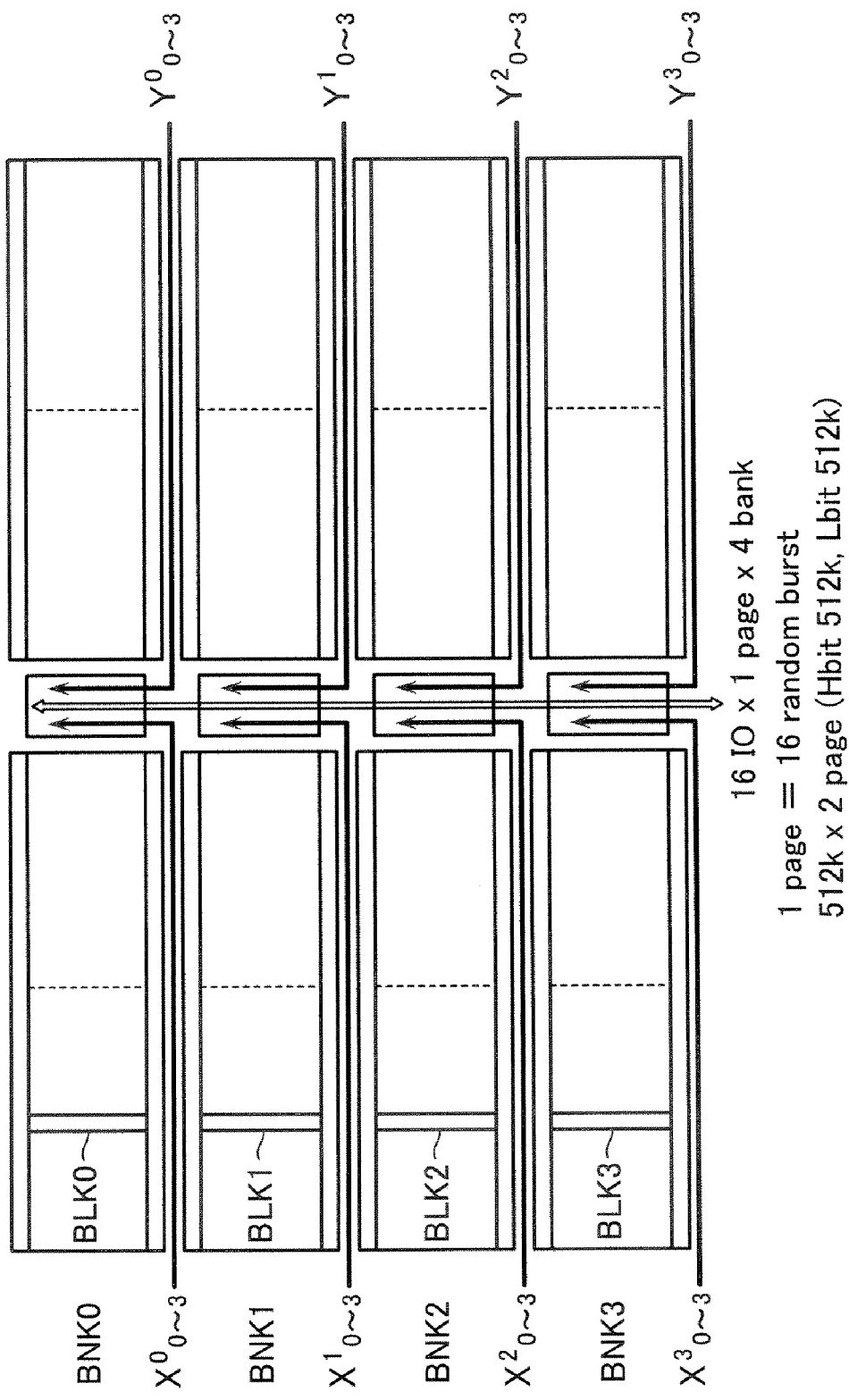
FIG. 39 is a diagram for explaining the collective bank access method of the memory.

FIG. 39 shows a page select method in a collective bank access scheme, in which all data may be accessed within the shortest time with respect to erase, write and read.

If page address is set in common to all page banks and it is accessed, four banks BNK0-BNK3 may be selected at a time without interleave. For example, as shown in FIG. 39, the entire banks BNK0-BNK3 are activated, and NAND string blocks BLK0-3 belonging to the identical word line address are selected at a time.

At this time, simultaneously activating all 64-sense amplifiers in 16×4-banks for an IO, erase or write may be performed for this unit. Since erase or write and verify thereof are processed at a time for all activated sense amplifiers, as the number of the simultaneously activated sense amplifiers is increased, the verify time for the same number of memory cells will becomes shorter.

While this access method sacrifices the access freedom with page bank interleave, it serves for reducing the time length necessary for erase or write.

In a read mode, if a timing difference of sense amplifier activation is not set between banks on the assumption that the page length becomes 16×4=64 bits, about 150 ns gap will be generated between page accesses. However, it is no need of collectively activating banks in the read mode. Therefore, activating the sense amplifiers with a certain timing difference, it is possible to access without gap between banks.

Next, the procedure of each operation mode and operation flow will be explained.

(Write Preceding Process Sequence)

Figure 40:
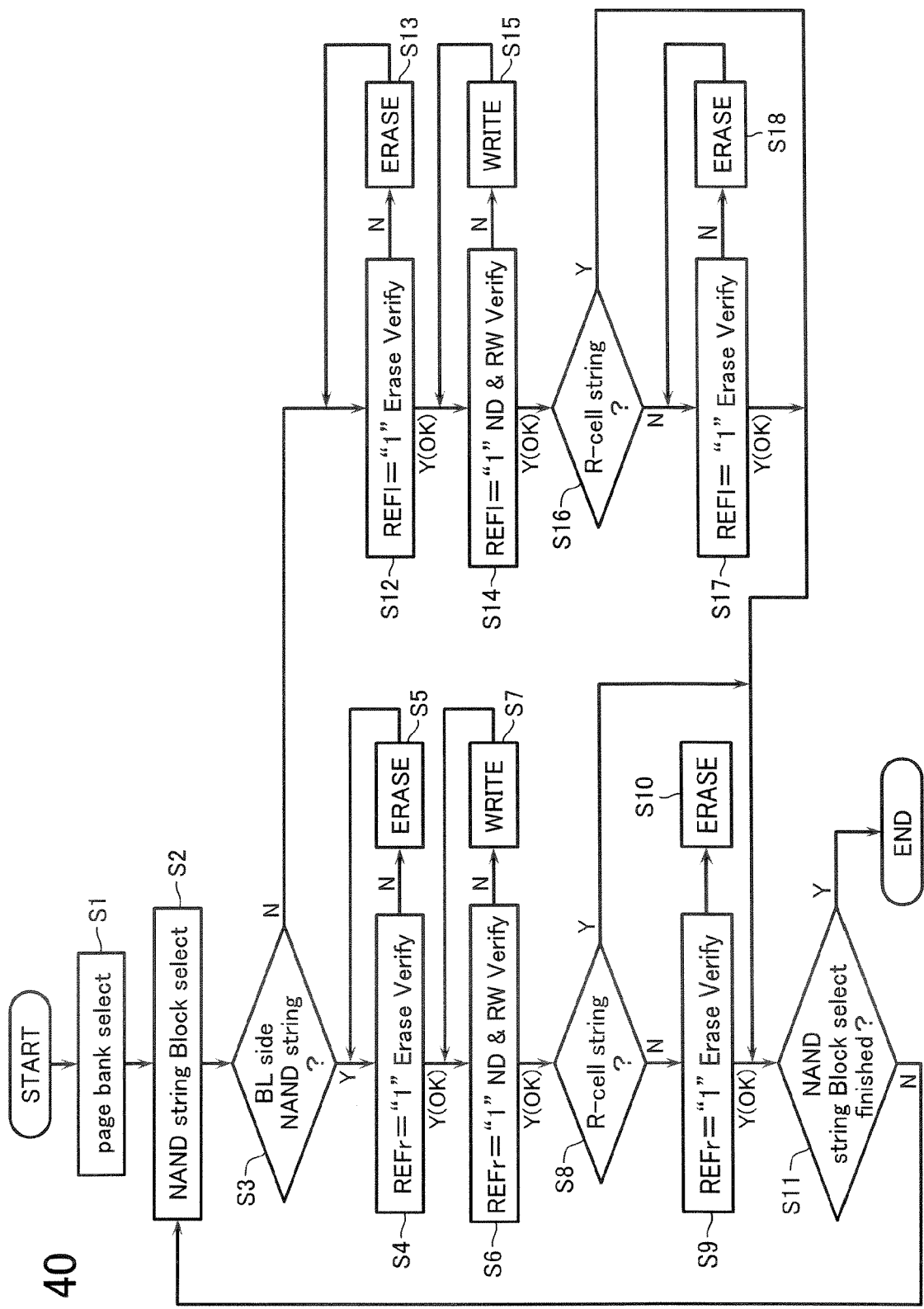
FIG. 40 shows the flow of the write preceding process.

FIG. 40 shows the write preceding process sequence, in which erase procedure "vp00" shown in FIG. 9, preliminary write procedure (ND&RW) "vpr" for writing reference data level and reducing the threshold voltage of the information cell, and erase procedure "vp0" for writing the lowest data level in the four levels are shown.

Data erase is performed to select a NAND string block in the page bank and erase it in a lump. The erase sequence starts in response to a certain command input. Address being input, a page bank to be erased is selected (step S1), and a block in the page bank is selected (step S2).

In accordance with input address, either one of REFr and REF1 becomes "1", so that it is defined which side cell array of the sense amplifier is selected to be erased. That is, erase-verify step S4 or step S5 is performed. If verify is "NO", erase is performed (step S5 or S13).

Data erase is performed for all NAND strings sharing word lines in a block, and erase-verify also is performed for all NAND strings. That is, all selected NAND strings are subjected to erase, and the block erase will be completed when verify is "OK" (i.e., Pass).

After completion of the block erase, the preliminary write (i.e., reference level (Lr) write for the reference cell R-cell (RW) and reference level write for the information cell for narrowing down the threshold distribution thereof (ND)) is performed. In detail, this procedure has a verify step (step S6 or S14) and a write step (step S7 or S15) for increasing the threshold voltage of cells in a selected block to data level Lr from the erased threshold state. The write-verify will be performed for each cell.

Then, judge whether the selected block is R-cell block or not (step S8 or S16). If it is judged that the selected block is an R-cell block, go to step S11 because the verify completion at step S6 or S14 means that data level Lr has been set.

In case the selected block is not an R-cell block, verify step S9 or S17 and erase step S10 or S18 are performed as a block erase procedure for writing data level L0 into all information cells in the block from data level Lr.

Next, it is judged that whether all NAND strings in the block have been resulted in verify "OK" (step S11), and if "NO", go back to step S2 and repeat the same verify-erase operation. If verify is passed for all NAND strings, the erase sequence will be completed.

As a result of the erase sequence completion, the information cells T-cell and C-cell are set at data level L0; and the reference cells R-cell are at the reference data level Lr.

Every steps described above will be further explained in detail below.

Figure 41:
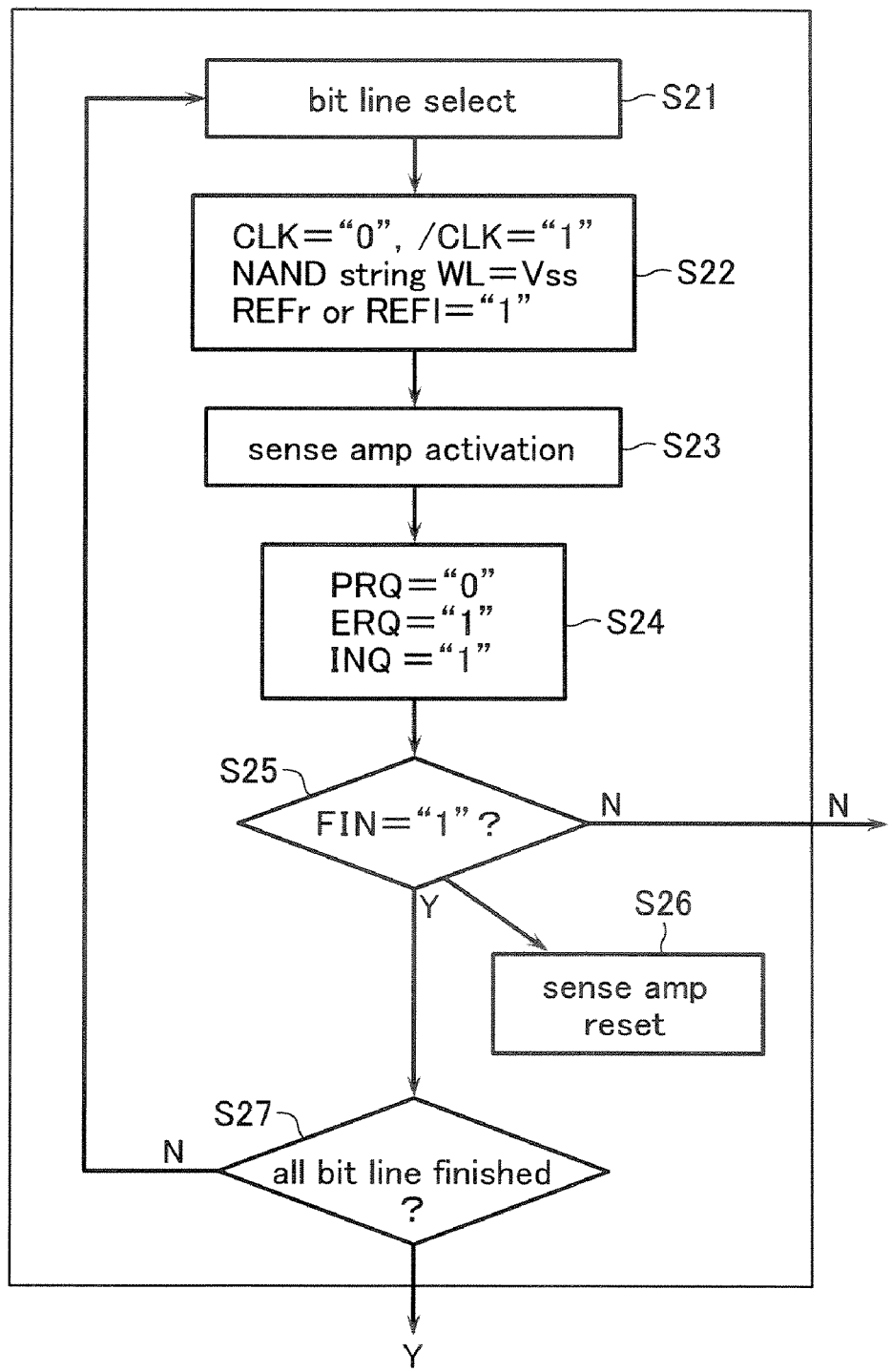
FIG. 41 shows the detailed flow of the erase-verify step in FIG. 40.

Erase-verify step (S4, S12):

FIG. 41 shows a detailed flow of the erase-verify step. Bit line selection is performed (step S21). Since it is not used data transfer between data latch and bit line, set CLK="L", /CLK="H", and set one of REFr and REF1 to be "1" to select T-cell array or C-cell array. The entire word lines in the selected block is set at Vss; and the reference voltage Vref is applied to the second reference cell block, I-cell block, in another cell array (step S22).

Then activate the sense amplifier (step S23), and apply PRQ="0", ERQ="1" and INQ="1" for confirming the sense result (step S24). It is judged whether FIN="1" or not (step S25). If "YES", the following bit line is subjected to verifying; and if "NO", go to the erase step. After the step S25, the sense amplifier is reset (step S26). Judge whether all bit lines have reached verify "PASS" or not (step S27), and if "YES", the erase will be completed.

Erase step (S5, S10, S13, S18):

Erase is performed to release electrons in the floating gates of cells under the condition that all word lines in the selected block are set as Vss; and a high erase voltage Vera is applied to the cell well.

Figure 42:
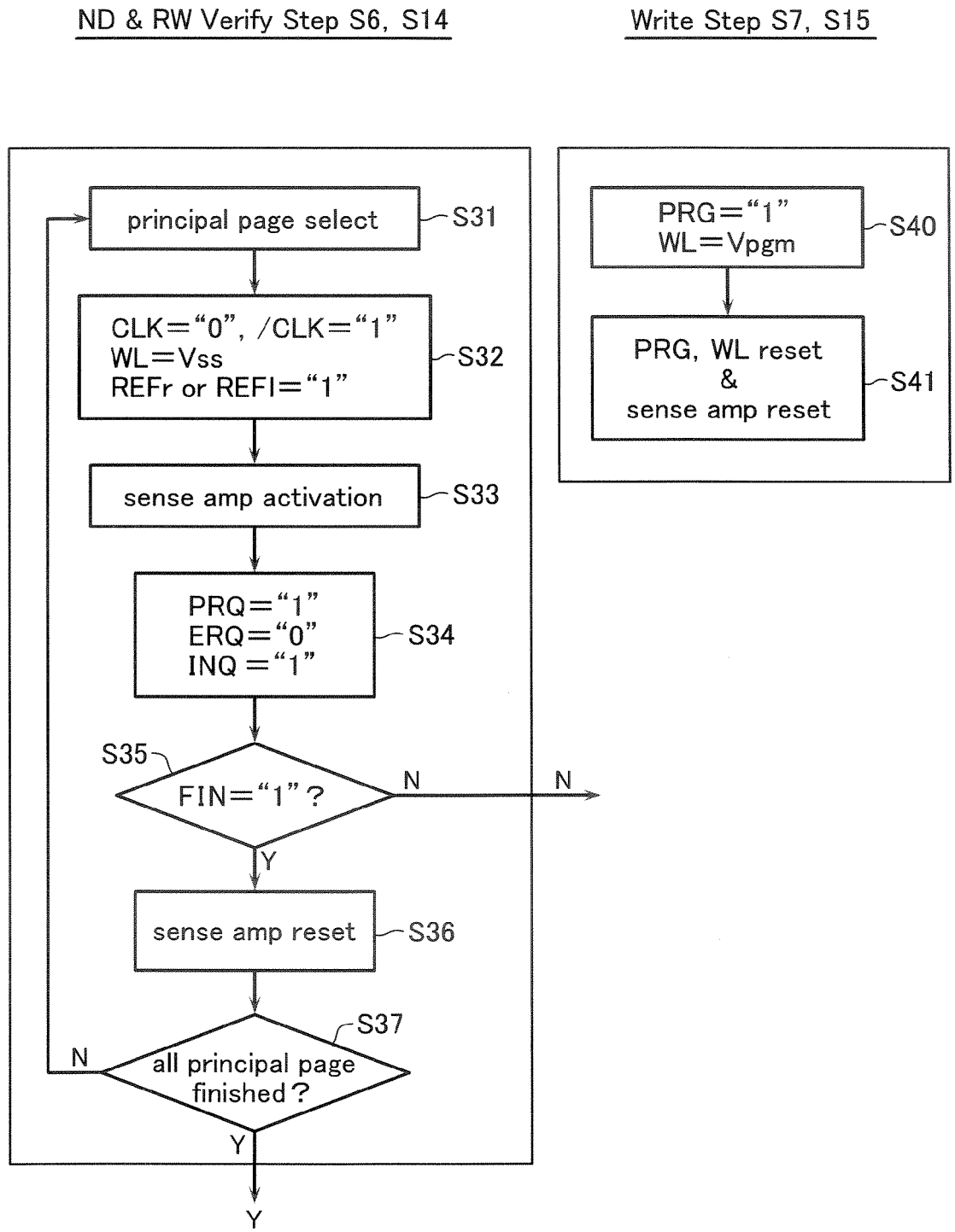
FIG. 42 shows the detailed flow of the ND&RW verify step and write step in FIG. 40.

ND&RW verify-write step (S6, S14, S7, S15):

FIG. 42 shows the details of the verify steps S6 and S14, and write steps S7 and S15. In the verify step, firstly, the main page selection (i.e., principal page selection) including bit line selection and word line selection is performed (step S31). Since there are no data to be transferred to or used in the data latch, clocks CLK and /CLK are set to be "0" and "1", respectively; a selected word line in the selected NAND string block is set at Vss; one of REFr and REF1 is set to be "1" in accordance with whether the selected block is T-cell array or C-cell array; and the second reference cell, I-cell, block I-BLK is selected (step S32).

Then activate the sense amplifier (step S33), and apply PRQ="1" and INQ="1" for judging the sense result (step S34). It is judged whether FIN="1" or not (step S35). If "YES", the sense amplifier is reset (step S36); and if "NO", go to the write step. After the sense amplifier resetting, judge whether the verify is passed for all pages or not (step S37), and if "YES", the ND&RW step will be completed.

At the write steps S7 and S15, the sense amplifier state at verify time is kept; and signal PRG is set to be "1", so that the sense result is fed-back to the bit lines. In this state, write voltage Vpgm is applied to a selected word line in the selected NAND string block (step S40). With respect to a cell, into which "0" data is written, the corresponding bit line is set at Vss, and in response to it, the NAND cell channel is set at Vss. Therefore, electrons are injected into the cell's floating gate. After a certain write time, reset PRG, Vpgm and reset the sense amplifier (step S41).

(Write Sequence)

Figure 43:
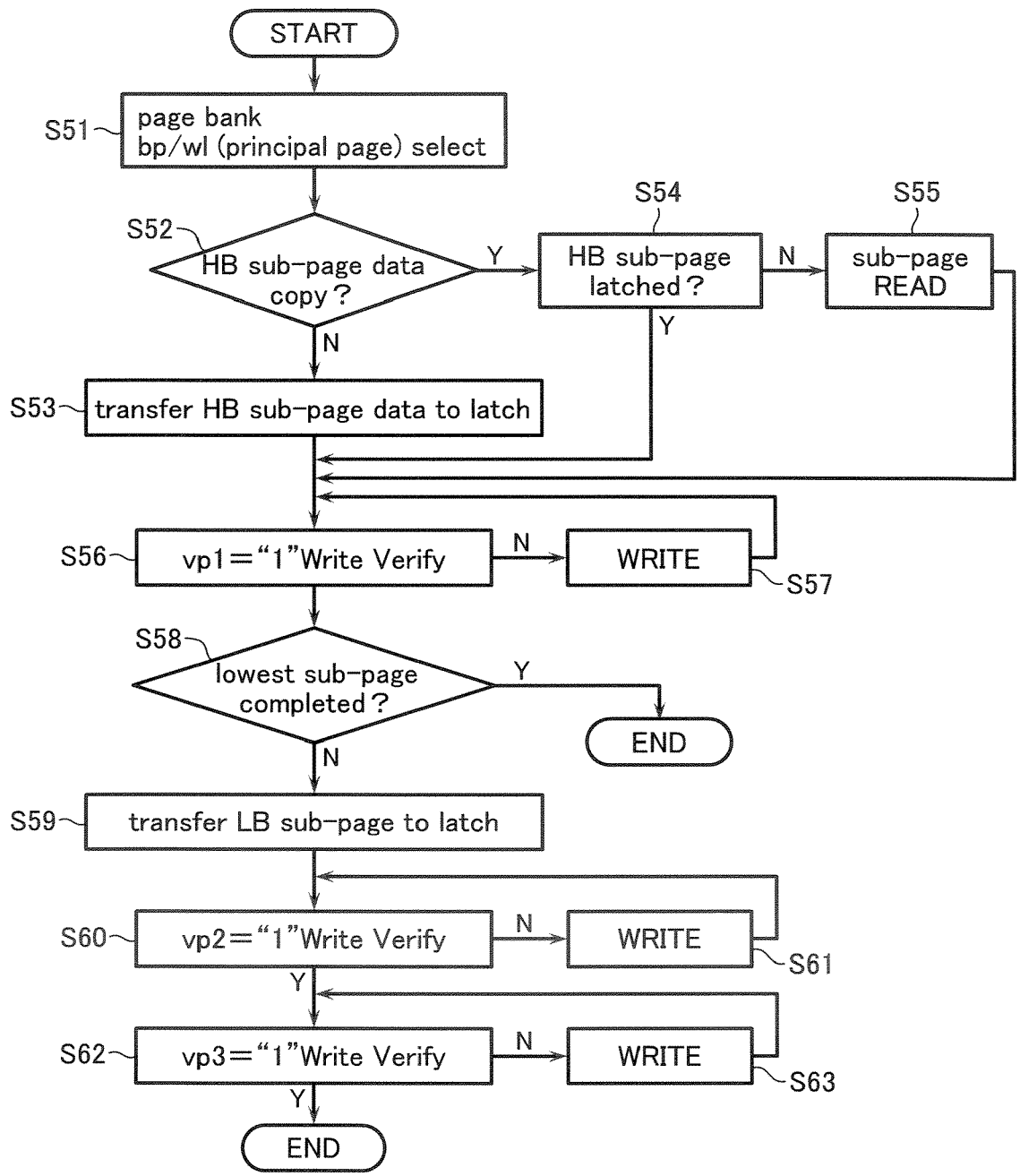
FIG. 43 shows the data write flow.

FIG. 43 shows the write sequence for writing data levels L1, L2 and L3. A certain command being input, the write sequence starts. Address being input, a page bank and a main page are selected (step S51).

Then, it is judged whether the written data is to be copied or not (step S52). In accordance with whether the written data is copied or the external data is written, the following procedure will be determined.

In case new data is programmed without copying, HB sub-page data is transferred to the data latch circuit (latch 301) from the external (step S53). In case of data copying, judge whether data held in the data latch is used or not (step S54). If HB sub-page data is not held in the data latch, it will be read out the memory cell array (step S55).

With respect to the sub-page data read out at the step S55, there are two cases as follows: the sub-page data is the upper page bit HB to be currently written into the main page; and it is another HB bit written into another main page. The former corresponds to such a case that the suspended write sequence restarts; and the latter to a case of copying another page.

HB sub-page data being latched, data level L2 is written with vp1="1" write-verify step S56 and write step S57. In case the HB sub-page has already been written, the verify step S56 will be passed soon.

In case the lower bit (LB) sub-page is further written, the LB sub-page data is loaded in the data latch circuit (latch 302) from the external (step S59). In accordance with the loaded LB sub-page data, data level L3 will be written with vp2="1" verify step S60 and write step S61. Following it, data level L1 will be written with vp3="1" verify step S62 and write step S63. These verify steps S60 and S62 being passed, write will be completed.

FIG. 44 shows the details of the write-verify steps (S56, S60 and S62), and write steps (S57, S61 and S63). In the write-verify steps, since the sensed data is never transferred to the data latch, clock CLK is set to be "1", while since the data in the data latch is used, clock /CLK is set to be "0", so that the feed back in the data latch is made effective.

To verify cells one by one in the NAND string, the selected word line voltage (i.e., verify voltage) is set at Px in accordance with steps vpx (x=1, 2 and 3). In accordance with whether the selected cell is in T-cell array or C-cell array, one of REFr and REF1 is set to be "1", and the reference cell R-cell is used as the reference current source.

Further, the relationship between the cell's data level and the upper bit data HB is reversed in accordance with whether the selected block is in T-cell array or C-cell array. Therefore, the data latch LAT shown in FIG. 30 will be operated in such a way that if REFr="1", vpa and vpb are selected as vpx at the vp2 step and vp3 step, respectively; and if REF1="1", vpb and vpa are selected as vpx at the vp2 step and vp3 step, respectively.

So far, the control signal setting step S71 has been explained.

Then activate the sense amplifier (step S72), and apply PRQ="1", ERQ="0" and INQ="1" for judging the sense result (step S73). To judge the write completion, it is judged whether FIN="1" or not (step S74). When data write has not been completed, go to write step again. If write completion, the sense amplifier is reset (step S75), and the sequence will be ended.

At the write step, the sense amplifier state at verify time is kept; and signal PRG is set to be "1", so that the sense result is fed-back to the bit lines. In this state, write voltage Vpgm is applied to a selected word line in the selected NAND string block. With respect to a cell, into which "0" data is written, the NAND cell channel is set at Vss via the corresponding bit line. Therefore, electrons are injected into the cell's floating gate. After a certain write time, reset PRG, Vpgm and reset the sense amplifier.

(Read Procedure)

Figure 45:
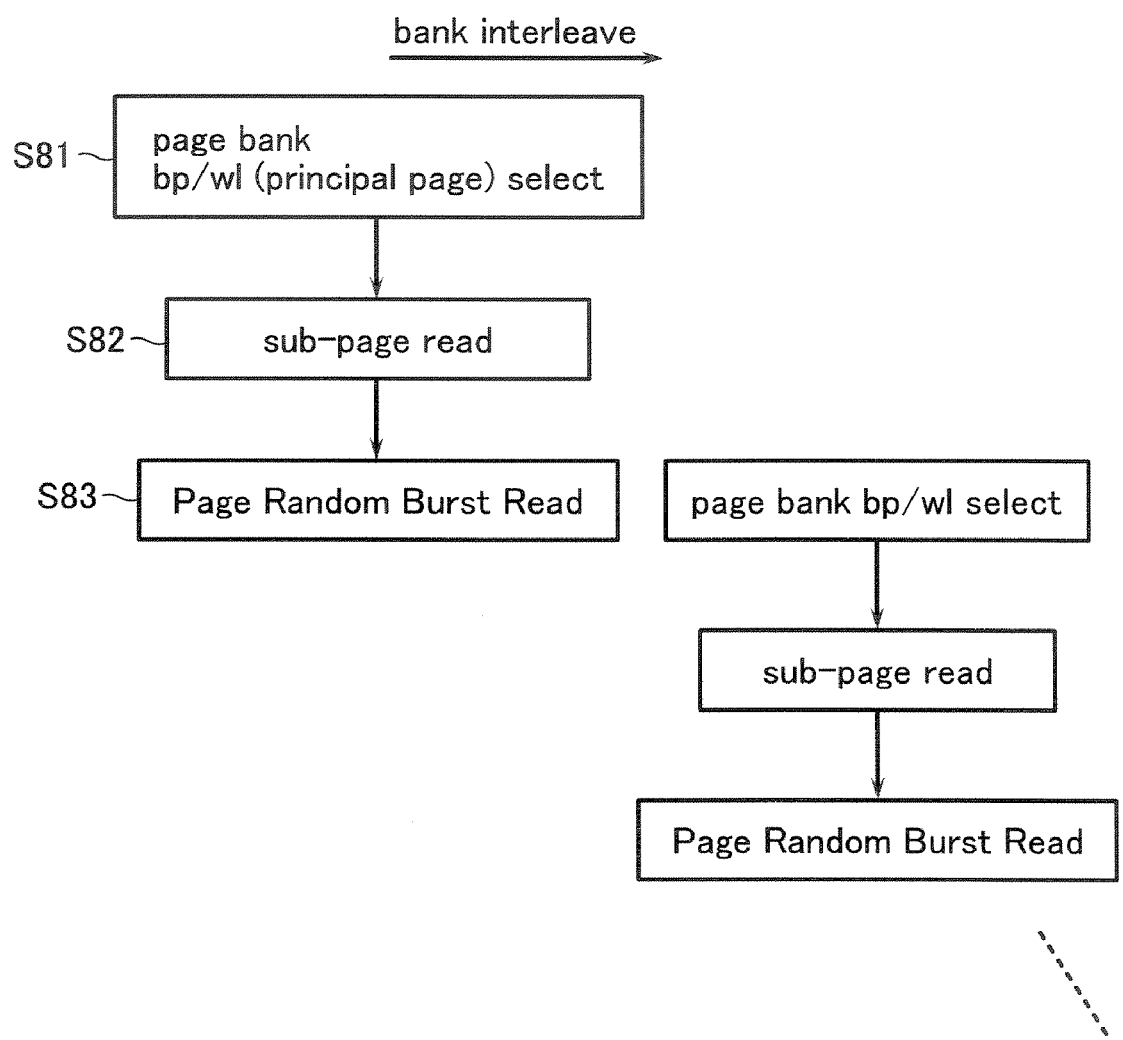
FIG. 45 shows the data read flow with bank-interleave.

FIG. 45 shows the read procedure. Firstly, a page bank and a principal page, which include a sub-page to be read out, are selected (step S81). Then, in accordance with the sub-page read procedure shown in FIG. 46, data read is performed (step S82). As a result, 16-page data are read in the sense unit, and transferred to the data latch circuit LAT. This read data may be output as burst data based on random access (step S83).

It is possible to start another sub-page data read of another bank at the read data output step S83. As a result, it becomes possible to do a bank interleave operation for random burst read data.

Figure 46:
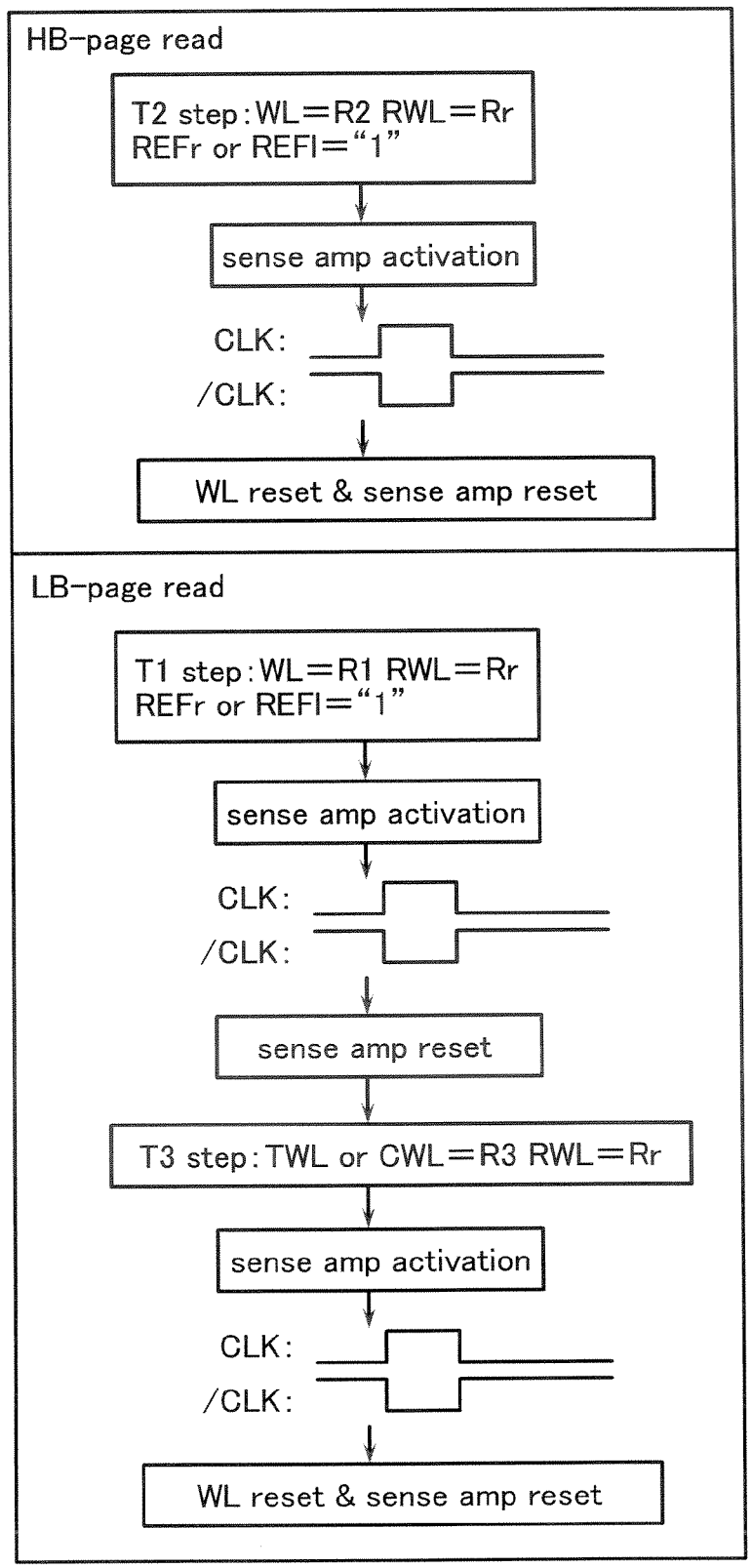
FIG. 46 shows the sub-page read operation.

The sub-page read is, as shown in FIG. 46, performed with two procedures, HB-page read step (the upper bit read) and LB-page read step (the lower bit read), which are independent of each other.

The HB read corresponds to the step T2 shown in FIG. 46. Either one of T-cell array and C-cell array is selected in response to signal REFr or REF1, a selected word line is applied with read voltage R2; and a reference word line with voltage Rr.

After the sense amplifier activation, the sensed data will be transferred to the data latch with complementary clocks CLK and /CLK. After data transferring, the sense amplifier and word lines are reset to finish the HB-page read step.

The LB-page read has two steps T1 and T3 as shown in FIG. 15. A selected word line level (i.e., read voltage) is set at R1 and R2 at the respective steps T1 and T3, respectively; and a reference word line level is Rr. The sense amplifier is rest between steps T1 and T3, but word lines are not reset as explained with reference to FIG. 18. The sense data at the steps T1 and T3 are transferred to the data latch in response to clocks CLK and /CLK, and subjected to evenness/oddness judgment of the number of data "1" as described above.

While the memory cell in the above-described embodiment has such a stacked gate structure that a floating gate and a control gate are stacked, other non-volatile memory cell structures may be used such as SONOS (Silicon Oxide Nitride Oxide Silicon) structure, MONOS (Metal Oxide Nitride Oxide Silicon) structure and the like.

Further, the present invention may be adapted to other non-volatile memories, each of which stores a kind of physical quantity level not limited to a threshold level, such as a phase-change memory PRAM (Phase-change PAM), a resistance memory RRAM (Resistance RAM), an ovonic memory OUM (Ovonic Unified Memory), a magnetoresistive memory MRAM (Magnetoresistive RAM), a ferroelectric memory (Ferroelectric RAM), and the like.

[Application Devices]

As an embodiment, an electric card using the non-volatile semiconductor memory device according to the above-described embodiment of the present invention and an electric device using the card will be described bellow.

Figure 47:
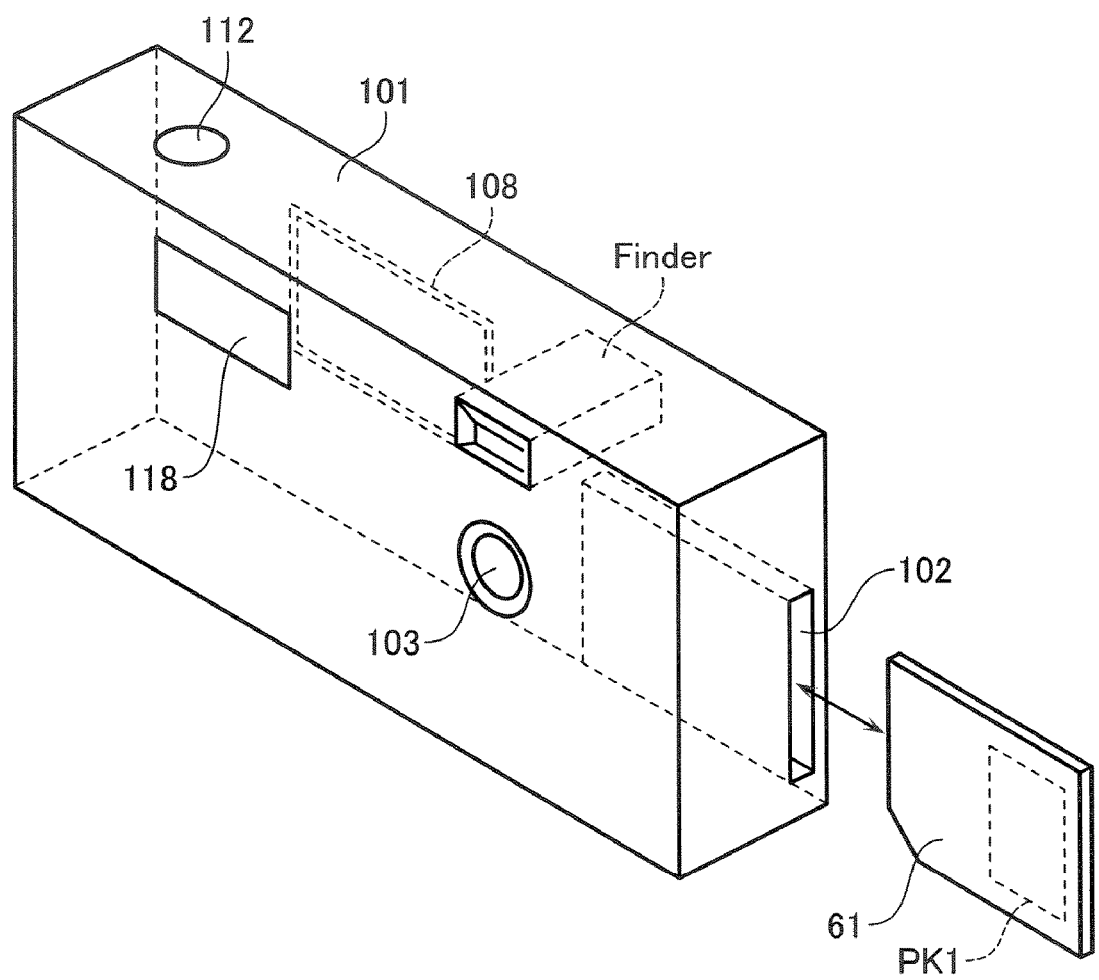
FIG. 47 shows another embodiment applied to a digital still camera.

FIG. 47 shows an electric card according to this embodiment an arrangement of an electric device using this card.

This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 48:
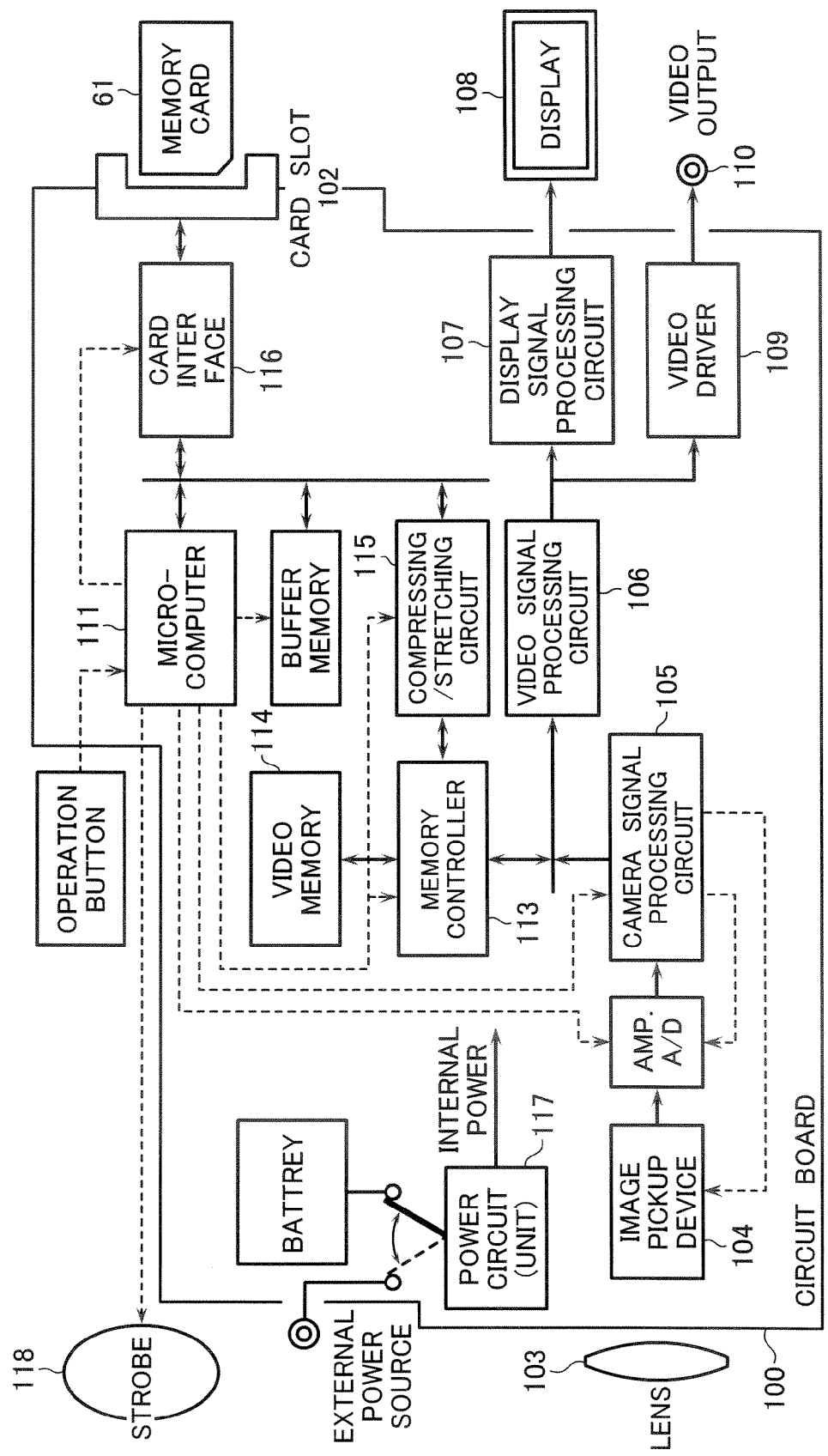
FIG. 48 shows the internal configuration of the digital still camera.
Figure 49A:
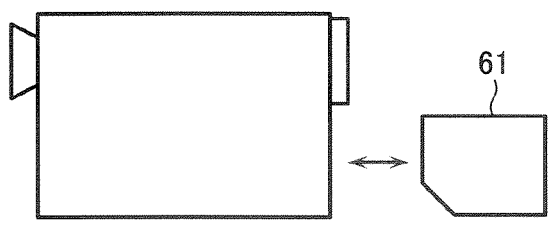
FIGS. 49A to 49J show other electric devices to which the embodiment is applied.
Figure 49F:
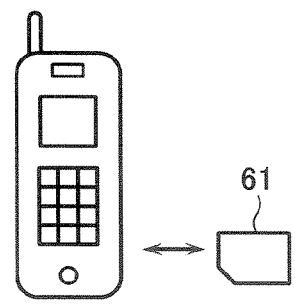
Figure 49B:
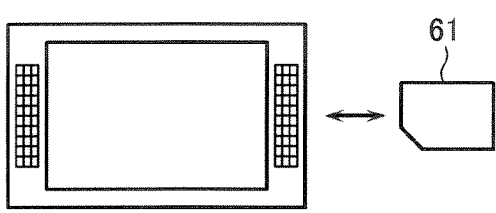
Figure 49G:
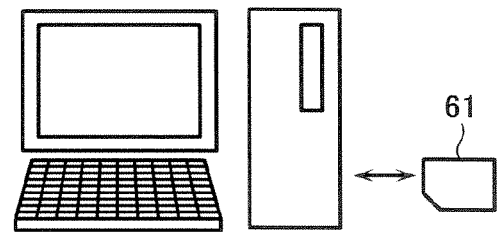
Figure 49C:
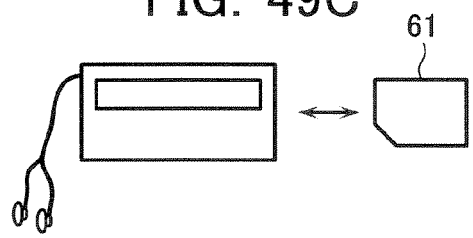
Figure 49H:
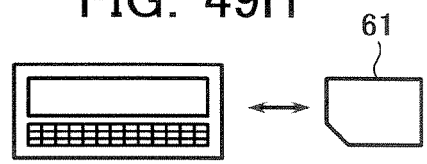
Figure 49D:
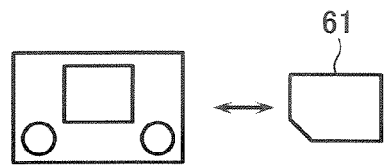
Figure 49I:
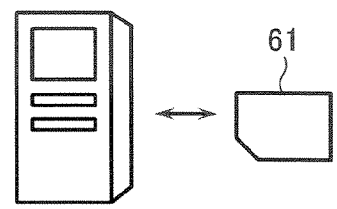
Figure 49E:
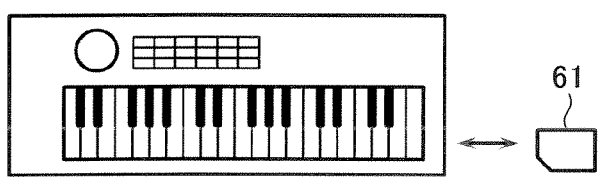
Figure 49J:
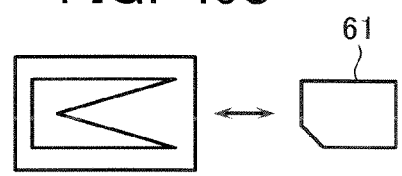

FIG. 48 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 49A to 49J, as well as in portable electric devices. That is, the electric card can also be used in a video camera shown in FIG. 49A, a television set shown in FIG. 49B, an audio apparatus shown in FIG. 49C, a game apparatus shown in FIG. 49D, an electric musical instrument shown in FIG. 49E, a cell phone shown in FIG. 49F, a personal computer shown in FIG. 49G, a personal digital assistant (PDA) shown in FIG. 49H, a voice recorder shown in FIG. 49I, and a PC card shown in FIG. 49J.

What is claimed is:

1. A semiconductor memory device comprising a memory cell array with electrically rewritable and non-volatile memory cells arranged therein, and a sense amplifier configured to sense data in the memory cell array, wherein the memory cell array comprises:

a plurality of information cells, in each of which either one of multi-level data is written;

at least one first reference cell with the same structure and the same connection state as the information cell, in which a reference data level is written for generating a first reference current used for reading data of the information cells; and at least one second reference cell, which serves for generating a second reference current used for setting the lowest data level of the multi-level data and for setting the reference data level of the first reference cell.

2. The semiconductor memory device according to claim 1, wherein the memory cell array comprises:

first and second cell arrays disposed to sandwich a sense amplifier circuit with a plurality of the sense amplifiers, in each of which a plurality of information cell NAND strings are arranged, the information cell NAND string including a plurality of information cells connected in series, each information cell having a floating gate and a control gate stacked thereabove;

at least one first reference cell NAND string disposed in each of the first and second cell arrays, the first reference cell NAND string including a plurality of the first reference cells connected in series; and at least one second reference cell NAND string disposed in each of the first and second cell arrays, the second reference cell NAND string including a plurality of the second reference cells corrected in series, the floating gate and control gate being short-circuited with each other in each second reference cell, and wherein while one information cell NAND string is selected from one of the first and second cell arrays at a read time, a first reference cell NAND string is selected from the other, the selected information NAND string and first reference cell NAND string being coupled to differential input nodes of the sense amplifier circuit, and while one information cell NAND string or one first reference cell NAND string is selected from one of the first and second cell arrays at a time of setting the lowest level in multi level data of the information cell NAND string or setting the reference data level of the first reference cell NAND string, a second reference cell NAND string is selected from the other, the information cell NAND string or first reference cell NAND string and the second reference cell NAND string being coupled to differential input nodes of the sense amplifier circuit.

3. The semiconductor memory device according to claim 2, wherein the memory cell array further comprises:

first bit lines disposed in the first cell array, to each of which the information cell NAND strings, the first reference cell NAND string and the second reference cell NAND string are coupled;

second bit lines disposed in the second cell array to constitute pairs with the first bit lines, respectively, to each of which the information cell NAND strings, the first reference cell NAND string and the second reference cell NAND string are coupled;

a plurality of information cell-use word lines disposed in the first and second cell arrays for driving the information cells independently of each other in the information cell NAND strings;

a plurality of first reference cell-use word lines disposed in the first and second cell arrays for driving the first reference cells independently of each other in the first reference cell NAND strings; and common gate wirings disposed in the first and second cell arrays to be coupled to a plurality of the second reference cells for driving them as a whole in the second reference cell NAND string.

4. The semiconductor memory device according to claim 2, wherein the memory cell array further comprises:

at least one bit line reset circuit disposed in each of the first and second cell arrays; and at least one bit line precharge circuit disposed in each of the first and second cell arrays.

5. The semiconductor memory device according to claim 1, wherein one of data levels L0, L1, L2 and L3 (L0<L1<L2<L3) is written into the information cell as four-level data defined as (HB, LB), where HB is the upper bit data; and LB the lower bit data, and reference data level Lr (L0<Lr<L1) is written into the first reference cell.

6. The semiconductor memory device according to claim 5, wherein the data levels and the reference data level are defined by the cell's threshold voltage, and the four-level data is read out with the following procedures:

a first read procedure for reading out the upper bit under the condition that a first read voltage set between the data levels L2 and L1 is applied to a selected information cell, while a reference read voltage substantially equal to the reference data level is applied to a selected first reference cell;

a second read procedure for reading out the lower bit when the upper bit is in a first logic state under the condition that a second read voltage set between the data levels L2 and L3 is applied to the selected information cell, while the reference read voltage is applied to the selected first reference cell; and a third read procedure for reading out the lower bit when the upper bit is in a second logic state under the condition that a third read voltage set between the data levels L0 and L1 is applied to the selected information cell, while the reference read voltage is applied to the selected first reference cell.

7. The semiconductor memory device according to claim 6, wherein

The lower bit is read out by judging whether the number of data "1" obtained through the second and third procedures is even or odd.

8. The semiconductor memory device according to claim 5, wherein the data levels and the reference data level are defined by the cell's threshold voltage, and write preceding process is performed prior to data write with the following procedures:

a first erase procedure for erasing a plurality of the information cells and the first reference cell into a negative threshold voltage state;

a write procedure for writing the reference data level Lr into the erased information cells and the first reference cell; and a second erase procedure for erasing again the information cells and the first reference cell written into the reference data level Lr into the data level L0.

9. The semiconductor memory device according to claim 8, wherein data write for the memory cell array, which has been subjected to the write preceding process, is performed with the following procedures:

a first write procedure for selectively increasing the threshold voltage of the information cells with data level L0 to the data level L2 in accordance with the upper bit data;

a second write procedure for selectively increasing the threshold voltage of the information cells with data level L2 to the data level L3 in accordance with the upper bit data and the lower bit data; and a third write procedure for selectively increasing the threshold voltage of the information cells with data level L0 to the data level L1 in accordance with the upper bit data and the lower bit data.

10. The semiconductor memory device according to claim 3, wherein the sense amplifier circuit comprises a plurality of sense units activated simultaneously, each sense unit being shared by a plurality of bit line pairs, one pair in which is selectively coupled to the sense unit.

11. The semiconductor memory device according to claim 10, wherein the sense unit includes:

a plurality of the sense amplifiers of a current-detecting type;

a data latch circuit configured to store read data and write data; and a verify-check circuit configured to detecting whether data erase or write has been completed or not in the entire sense units.

12. The semiconductor memory device according to claim 11, wherein the data latch circuit includes two data latches disposed to be data-transferable between those and the differential amplifier, in which the upper bit data and the lower bit data in four-level data are loaded at a data write time, respectively.

13. The semiconductor memory device according to claim 12, wherein to read out the lower bit data in four-level data, it is judged whether the number of "1" read data is even or odd based on the data-transferring operation of a shift-register constituted by the two data latches.

14. The semiconductor memory device according to claim 4, wherein the bit line reset circuit has a plurality of memory cells connected in series between a bit line and a reset-use voltage node, the floating gates and control gates of which are short-circuited in common to a first control node, and the bit line precharge circuit has a plurality of memory cells connected in series between a bit line and a precharge-use voltage node, the floating gates and control gates of which are short-circuited in common to a second control node.

* * * * *